US012682842B2

(12) United States Patent
Yoshimoto et al.

(10) Patent No.: US 12,682,842 B2
(45) Date of Patent: Jul. 14, 2026

(54) SEMICONDUCTOR APPARATUS, DISPLAY DEVICE, AND ELECTRONIC DEVICE

(71) Applicant: SEMICONDUCTOR ENERGY LABORATORY CO., LTD., Atsugi (JP)

(72) Inventors: Satoshi Yoshimoto, Isehara (JP); Koji Kusunoki, Isehara (JP); Kazunori Watanabe, Machida (JP); Susumu Kawashima, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 230 days.

(21) Appl. No.: 18/033,710

(22) PCT Filed: Oct. 18, 2021

(86) PCT No.: PCT/IB2021/059548
§ 371 (c)(1),
(2) Date: Apr. 25, 2023

(87) PCT Pub. No.: WO2022/090858
PCT Pub. Date: May 5, 2022

(65) Prior Publication Data
US 2023/0395022 A1 Dec. 7, 2023

(30) Foreign Application Priority Data
Oct. 30, 2020 (JP) .................................. 2020-182536

(51) Int. Cl.
*G09G 3/3233* (2016.01)
*H10K 39/32* (2023.01)

(52) U.S. Cl.
CPC ........... *G09G 3/3233* (2013.01); *H10K 39/32* (2023.02); *G09G 2300/0857* (2013.01); *G09G 2330/021* (2013.01); *G09G 2360/14* (2013.01)

(58) Field of Classification Search
CPC ......... G09G 3/3233; G09G 2300/0857; G09G 2330/021; G09G 2360/14;
(Continued)

(56) References Cited

U.S. PATENT DOCUMENTS

| | | | |
|---|---|---|---|
| 8,310,430 B2 | 11/2012 | Hiratsuka | |
| 8,736,587 B2 | 5/2014 | Yamazaki | |

(Continued)

FOREIGN PATENT DOCUMENTS

| | | |
|---|---|---|
| CN | 101447157 A | 6/2009 |
| CN | 105843439 A | 8/2016 |

(Continued)

OTHER PUBLICATIONS

International Search Report (Application No. PCT/IB2021/059548) Dated Dec. 21, 2021.

(Continued)

*Primary Examiner* — Roberto W Flores
(74) *Attorney, Agent, or Firm* — NIXON PEABODY LLP; Jeffrey L. Costellia

(57) ABSTRACT

One embodiment of the present invention relates to a common semiconductor apparatus for driving two different circuits. The semiconductor apparatus is capable of switching a plurality of signal potentials and sequentially outputting the plurality of signal potentials to the outside. The semiconductor apparatus can make one of two different circuits arranged in a matrix operate in all the rows and can make the other circuit operate in all the rows or only in a specific row. For example, in the case where the semiconductor apparatus is applied to a row driver that drives pixels (Continued)

of a display device in which sensor elements are incorporated, the operation of display elements in pixels in all the rows and the operation of sensor elements in pixels in all the rows or in the specific row can be switched.

13 Claims, 38 Drawing Sheets

(58) Field of Classification Search
CPC ... G09G 2300/0426; G09G 2300/0819; G09G 2300/0842; G09G 2300/0852; G09G 2300/0861; G09G 2310/0267; G09G 2310/0286; G09G 3/3266; G09G 3/3275; H10K 39/32; H10K 59/12; H10D 86/423; H10D 30/6755; H10D 86/451; H10D 86/60; G06F 3/041; G09F 9/30; G09F 9/33; G11C 19/28
See application file for complete search history.

(56) References Cited

U.S. PATENT DOCUMENTS

| | | | |
|---|---|---|---|
| 9,041,453 B2 | 5/2015 | Miyake et al. | |
| 9,508,754 B2 | 11/2016 | Katsuta et al. | |
| 9,715,308 B2 | 7/2017 | Katsuta et al. | |
| 9,851,776 B2 | 12/2017 | Toyotaka et al. | |
| 9,916,036 B2 | 3/2018 | Katsuta et al. | |
| 9,927,894 B2 | 3/2018 | Abe et al. | |
| 10,289,228 B2 | 5/2019 | Abe et al. | |
| 11,004,374 B2 | 5/2021 | Kurokawa et al. | |
| 11,869,428 B2 | 1/2024 | Kawashima et al. | |
| 12,288,779 B2 | 4/2025 | Takahashi et al. | |
| 2002/0074551 A1* | 6/2002 | Kimura | G06F 3/0412 |
| | | | 438/149 |
| 2003/0206608 A1 | 11/2003 | Kawahata et al. | |
| 2005/0146006 A1 | 7/2005 | Yamazaki. et al. | |
| 2009/0135169 A1 | 5/2009 | Hiratsuka | |
| 2013/0075761 A1* | 3/2013 | Akiyama | H10F 55/25 |
| | | | 257/E31.095 |
| 2014/0359756 A1 | 12/2014 | Alameh et al. | |
| 2015/0243678 A1 | 8/2015 | Umezaki | |
| 2015/0310929 A1 | 10/2015 | Umezaki | |
| 2015/0355767 A1 | 12/2015 | Abe et al. | |
| 2016/0225787 A1 | 8/2016 | Katsuta et al. | |
| 2017/0053585 A1 | 2/2017 | Sohn et al. | |
| 2017/0344173 A1 | 11/2017 | Tang et al. | |
| 2018/0074637 A1 | 3/2018 | Rosenberg et al. | |
| 2018/0151144 A1* | 5/2018 | Kawashima | G06F 3/0443 |
| 2018/0190202 A1 | 7/2018 | Kong | |
| 2019/0130087 A1 | 5/2019 | Mori et al. | |
| 2020/0105176 A1 | 4/2020 | Kurokawa et al. | |
| 2020/0319741 A1 | 10/2020 | Heo et al. | |
| 2021/0035497 A1 | 2/2021 | Toyotaka et al. | |
| 2021/0066669 A1 | 3/2021 | Kubota et al. | |
| 2021/0096678 A1 | 4/2021 | Kubota et al. | |
| 2021/0183294 A1 | 6/2021 | Toyotaka et al. | |
| 2021/0225257 A1* | 7/2021 | Tsai | G09G 3/2092 |
| 2021/0303099 A1 | 9/2021 | Strutt et al. | |
| 2021/0327979 A1 | 10/2021 | Kamada et al. | |
| 2021/0350733 A1 | 11/2021 | Liu et al. | |
| 2022/0057873 A1 | 2/2022 | Kubota et al. | |
| 2022/0147242 A1 | 5/2022 | Ording | |
| 2022/0285461 A1 | 9/2022 | Hatsumi et al. | |
| 2022/0292871 A1 | 9/2022 | Kawashima et al. | |
| 2022/0327187 A1 | 10/2022 | Yoshimoto et al. | |
| 2022/0327857 A1 | 10/2022 | Kusunoki et al. | |
| 2022/0335747 A1 | 10/2022 | Kubota et al. | |
| 2022/0350432 A1 | 11/2022 | Takahashi et al. | |
| 2022/0384526 A1 | 12/2022 | Yamazaki et al. | |
| 2022/0413633 A1 | 12/2022 | Garelli et al. | |
| 2023/0005424 A1 | 1/2023 | Kawashima et al. | |
| 2023/0032396 A1 | 2/2023 | Wang | |
| 2023/0117024 A1 | 4/2023 | Kubota et al. | |

FOREIGN PATENT DOCUMENTS

| | | |
|---|---|---|
| CN | 110178174 A | 8/2019 |
| CN | 110832573 A | 2/2020 |
| EP | 3839935 A | 6/2021 |
| JP | 07-036406 A | 2/1995 |
| JP | 09-055909 A | 2/1997 |
| JP | 2002-165136 A | 6/2002 |
| JP | 2009-128776 A | 6/2009 |
| JP | 2009-271308 A | 11/2009 |
| JP | 2014-211621 A | 11/2014 |
| JP | 2015-228019 A | 12/2015 |
| JP | 2015-232602 A | 12/2015 |
| JP | 2016-142880 A | 8/2016 |
| KR | 2020-0002908 A | 1/2020 |
| WO | WO-2018/197985 | 11/2018 |
| WO | WO-2020/136495 | 7/2020 |

OTHER PUBLICATIONS

Written Opinion (Application No. PCT/IB2021/059548) Dated Dec. 21, 2021.

* cited by examiner

20a

FIG. 27A PIX1
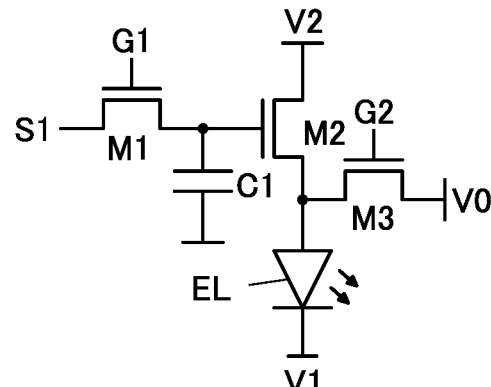
FIG. 27B
PIX2
FIG. 27C
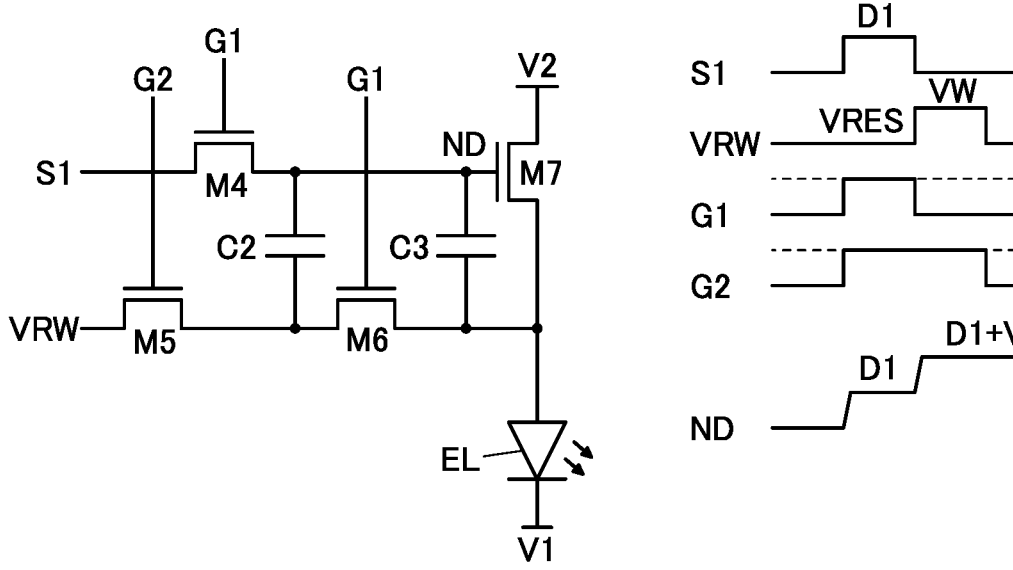
FIG. 27D
PIX3
FIG. 27E
PIX3
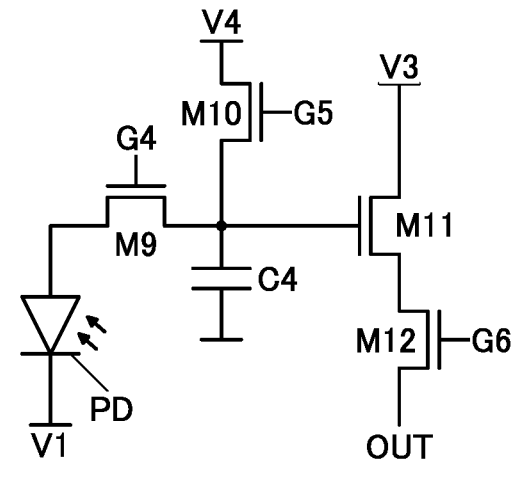
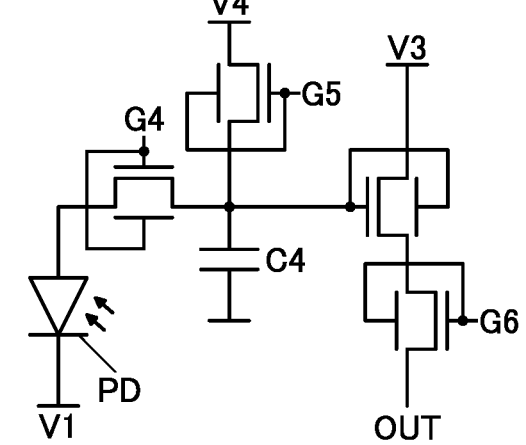

9100

9200

9101

9201

9102

9201

9201

FIG. 38A
7100
FIG. 38B
7200
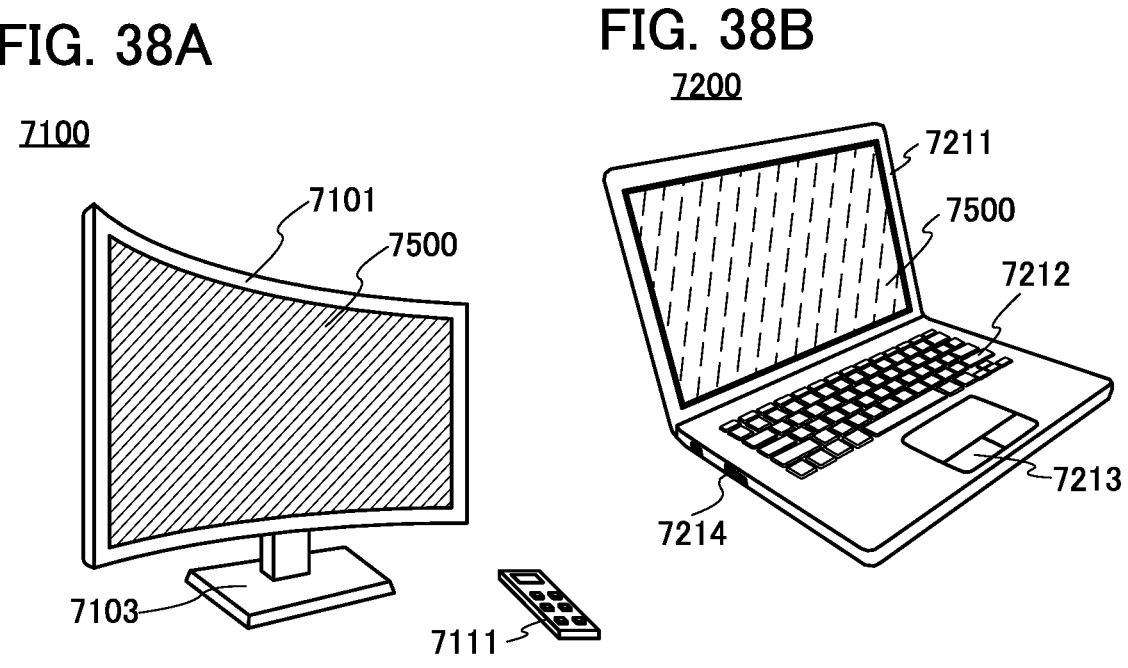
7101
7500
7103
7111
7211
7500
7212
7213
7214
FIG. 38C
7300
FIG. 38D
7400
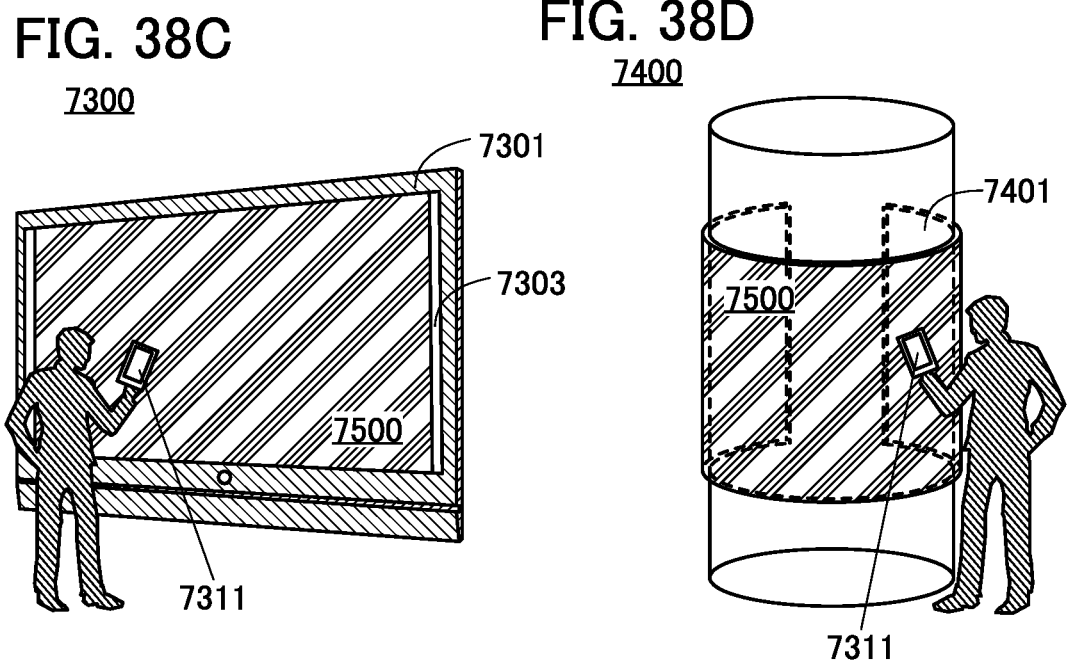
7301
7303
7500
7311
7401
7500
7311

SEMICONDUCTOR APPARATUS, DISPLAY DEVICE, AND ELECTRONIC DEVICE

TECHNICAL FIELD

One embodiment of the present invention relates to a semiconductor apparatus and a display device including the semiconductor apparatus.

Note that one embodiment of the present invention is not limited to the above technical field. Examples of the technical field of one embodiment of the present invention disclosed in this specification and the like include a semiconductor apparatus, a display device, a light-emitting device, a power storage device, a memory device, an imaging device, an electronic device, a lighting device, an input device, an input/output device, a driving method thereof, and a manufacturing method thereof. A semiconductor apparatus generally means an apparatus that can function by utilizing semiconductor characteristics.

BACKGROUND ART

For the purpose of downsizing an electronic device or improving the degree of freedom of designing the electronic device, making a display device with a narrow bezel has been required. In order to make a display device with a narrow bezel, it is effective to provide a pixel portion and part or the whole of a driver circuit portion monolithically over the same substrate.

In addition, the driver circuit portion can be manufactured by a process common to the pixel portion; thus, IC chip mounting and the like become unnecessary and manufacturing cost can be reduced. For example, Patent Document 1 discloses a technique in which circuits such as shift registers are formed using transistors having the same conductivity type.

REFERENCE

Patent Document

[Patent Document 1] Japanese Published Patent Application No. 2014-211621

SUMMARY OF THE INVENTION

Problems to be Solved by the Invention

A display device can be an advanced display device when a sensor element or the like is included in a pixel. For example, a display device can function as a touch panel when a capacitance sensor is included in the display device. In addition, it is possible to add an imaging function, a non-contact input function, or the like to a display device when an optical sensor is included in the display device.

However, like a display element, a driver circuit is needed to drive a sensor element, which interferes making a display device with a narrow bezel.

Thus, an object of one embodiment of the present invention is to provide a semiconductor apparatus for driving two different circuits. Another object is to provide a semiconductor apparatus for driving a pixel including a first circuit and a second circuit. Another object is to provide a display device including the semiconductor apparatus. Another object is to provide a method for driving the semiconductor apparatus and the display device, for example. Another object is to provide a novel semiconductor apparatus, a novel display device, or the like.

Note that the description of these objects does not disturb the existence of other objects. Note that one embodiment of the present invention does not need to achieve all the objects. Note that objects other than these can be derived from the description of the specification, the drawings, the claims, and the like.

Means for Solving the Problems

One embodiment of the present invention relates to a common semiconductor apparatus for driving two different circuits. Alternatively, one embodiment of the present invention relates to a display device including the semiconductor apparatus.

One embodiment of the present invention is a semiconductor apparatus including a first block, a second block, a third block, and a first switch circuit. The first block to the third block each include a plurality of flip-flop circuits and a plurality of output circuits. A pair of output circuits is electrically connected to each of the flip-flop circuits. In each of the first block to the third block, the plurality of flip-flop circuits are cascaded. A flip-flop circuit in the last stage of the first block, a flip-flop circuit in a first stage of the second block, a flip-flop circuit in the last stage of the second block, and a flip-flop circuit in a first stage of the third block are electrically connected to the first switch circuit. The output circuit includes a second switch circuit, a first circuit, and a second circuit. The second switch circuit is electrically connected to the flip-flop circuit, the first circuit, and the second circuit.

The first switch circuit can have a function of selecting one of an operation of outputting a signal potential from the first block, the second block, and the third block and an operation of outputting a signal potential from the first block and the third block.

The second switch circuit can have a function of selecting one of conduction between the flip-flop circuit and the first circuit and conduction between the flip-flop circuit and the second circuit.

The flip-flop circuit can output a first signal potential to the second switch circuit. The second switch circuit can output a second signal potential based on the first signal potential to the first circuit. The second switch circuit can output a third signal potential based on the first signal potential to the second circuit. The first circuit can output a fourth signal potential based on the second signal potential. The second circuit can output a fifth signal potential based on the third signal potential.

A sixth signal potential, a seventh signal potential, or an eighth signal potential can be input to the first switch circuit and the second switch circuit. When the sixth signal potential is input to the first switch circuit and the second switch circuit, the first circuit included in each of the first block to the third block can output a signal potential. When the seventh signal potential is input to the first switch circuit and the second switch circuit, the second circuit included in each of the first block to the third block can output a signal potential. When the eighth signal potential is input to the first switch circuit and the second switch circuit, the second circuit included in each of the first block and the third block can output a signal potential.

When the last stage of the flip-flop circuit included in the first block is a fourth stage, the last stage of the flip-flop circuit included in the second block can be a 4n-th stage (n is an integer greater than or equal to 2) and the last stage of the flip-flop circuit included in the third block can be a 4n+4-th stage.

In addition, another embodiment of the present invention is a display device including the semiconductor apparatus and a pixel. The pixel includes a third circuit including a display element and a fourth circuit including a light-receiving element. The first circuit is electrically connected to the third circuit, and the second circuit is electrically connected to the fourth circuit.

The display element can be a light-emitting element, and the light-receiving element can share an electrode with the light-emitting element.

In addition, it is preferable that the third circuit and the fourth circuit each include a transistor containing a metal oxide in a channel formation region, and that the metal oxide include In, Zn, and M (M is Al, Ti, Ga, Sn, Y, Zr, La, Ce, Nd, or Hf).

Effect of the Invention

According to one embodiment of the present invention, a semiconductor apparatus for driving two different circuits can be provided. Alternatively, a semiconductor apparatus for driving a pixel including a first circuit and a second circuit can be provided. Alternatively, a display device including the semiconductor apparatus can be provided. Alternatively, a method for driving the semiconductor apparatus and the display device can be provided, for example. Alternatively, a novel semiconductor apparatus, a novel display device, or the like can be provided.

Note that the description of these effects does not preclude the existence of other effects. Note that one embodiment of the present invention does not need to have all the effects. Note that other effects can be derived from the description of the specification, the drawings, and the claims.

BRIEF DESCRIPTION OF THE DRAWINGS

FIG. 27A, FIG. 27B, FIG. 27D, and FIG. 27E are diagrams each illustrating a circuit that can be applied to a pixel of the display device. FIG. 27C is a timing chart showing the operation of PIX2.

FIG. 38A to FIG. 38D are diagrams illustrating electronic devices.

MODE FOR CARRYING OUT THE INVENTION

Figure 1:
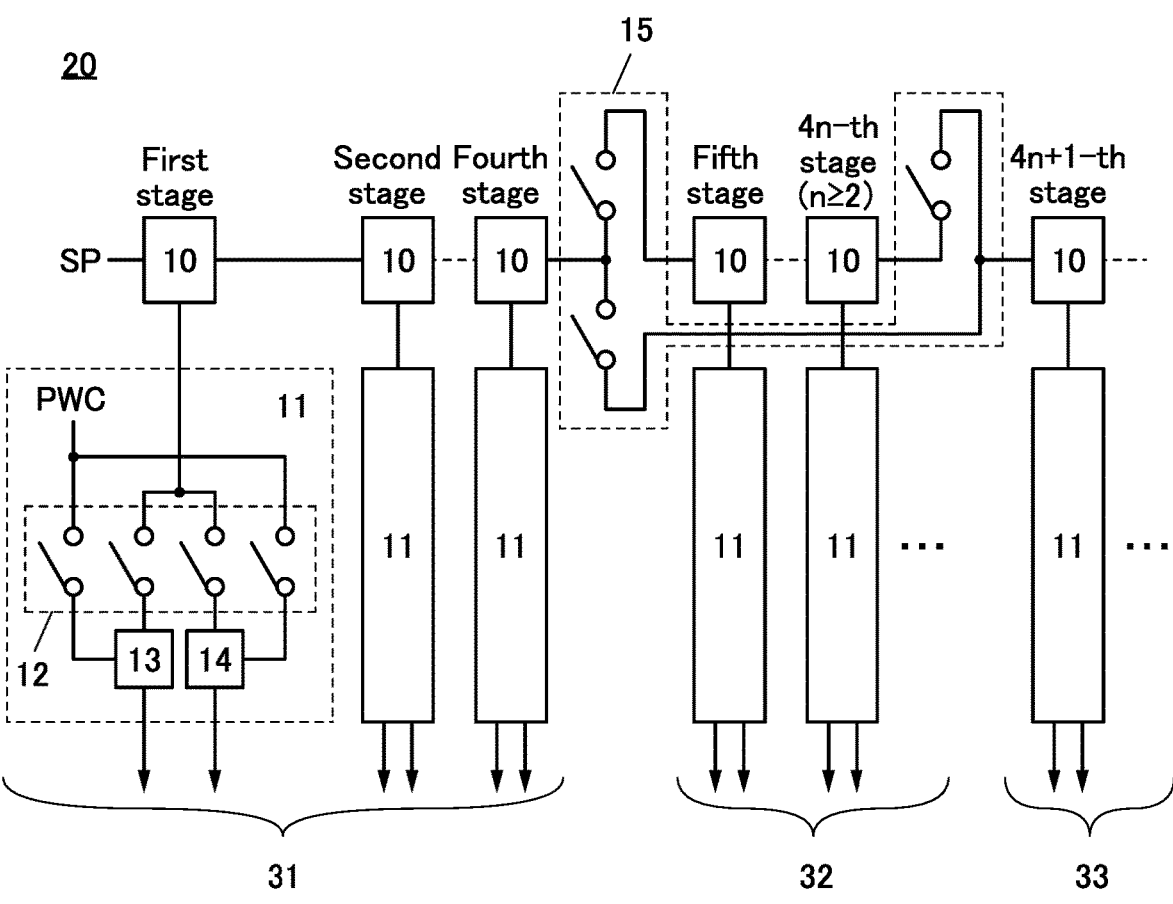
FIG. 1 is a diagram illustrating a semiconductor apparatus.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, a semiconductor apparatus that is one embodiment of the present invention will be described with reference to drawings.

One embodiment of the present invention is a semiconductor apparatus capable of switching a plurality of signal potentials and sequentially outputting the plurality of signal potentials to the outside. For example, the semiconductor apparatus can make one of two different circuits arranged in a matrix operate in all the rows and can make the other circuit operate in all the rows or only in a specific row.

For example, in the case where the semiconductor apparatus is applied to a row driver that drives pixels of a display device in which sensor elements are incorporated, the operation of display elements in pixels in all the rows and the operation of sensor elements in pixels in all the rows or in a specific row can be switched.

Note that the two different circuits that are operated by the semiconductor apparatus are not limited to a combination of a circuit including a display element and a circuit including a sensor element and may be a combination of a circuit including a first display element and a circuit including a second display element. For example, a light-emitting device such as an organic EL element and a non-light-emitting device such as a liquid crystal element can be operated by the semiconductor apparatus.

Alternatively, a combination of a circuit including a first sensor element and a circuit including a second sensor element may be employed. For example, an imaging element for image capturing and an imaging element for measuring distance (a TOF (Time Of Flight) sensor or the like) can be operated by the semiconductor apparatus. Alternatively, a combination of one of a display element and a sensor element, and a memory circuit may be employed.

Figures 2A, 2B, 2C, 2D:
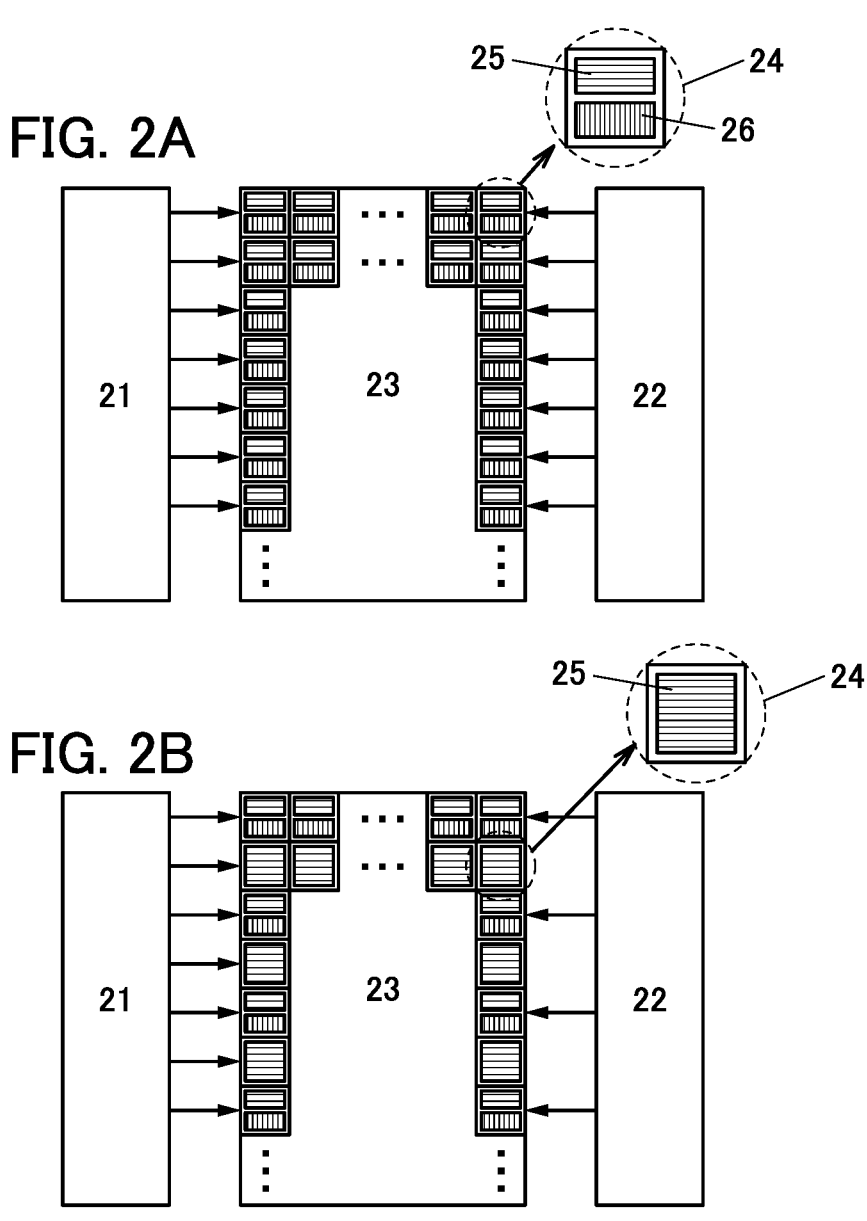
FIG. 2A and FIG. 2B are diagrams each illustrating a conventional example.
FIG. 2C and FIG. 2D are diagrams each illustrating an application example of a semiconductor apparatus.

FIG. 2A and FIG. 2B each illustrate a conventional technology example in which two driver circuits are used for driving pixels 24 included in a pixel array 23. In the conventional technology, in the case where the pixel 24 includes a circuit 25 including a display element and a circuit 26 including a sensor element, different driver circuits (a row driver 21 and a row driver 22) have been required for driving the circuit 25 and the circuit 26. This is due to, for example, different timings of controlling the output of signals in the circuit 25 and the circuit 26 or driving different rows in the circuit 25 and the circuit 26, such as the case where not all the rows are provided with the circuits 26 as illustrated in FIG. 2B.

When a semiconductor apparatus 20 according to one embodiment of the present invention is used as a row driver, it is possible to switch the operation of the circuit 25 in all the rows or the operation of the circuit 26 in all the rows illustrated in FIG. 2C and the operation of the circuit 26 in a specific row illustrated in FIG. 2D.

That is, the two different row drivers can be reduced to one row driver; thus, the number of wirings and the occupation area of a transistor and the like included in the row driver can be reduced. Therefore, a narrow bezel can be achieved, and a display device or the like can be downsized.

FIG. 1 is a block diagram illustrating a semiconductor apparatus according to one embodiment of the present invention. The semiconductor apparatus 20 is a sequential circuit that sequentially outputs signal potentials to the outside and is also referred to as a shift register. Note that FIG. 1 is a schematic diagram and does not illustrate details such as a signal potential input to each component, power supply voltage, and a mode of connection between components.

The semiconductor apparatus 20 includes a block 31, a block 32, and a block 33. The blocks 31, 32, and 33 each include a plurality of flip-flop circuits 10 and an output circuit 11. The plurality of flip-flop circuits 10 included in the blocks 31, 32, and 33 are cascaded. In addition, a pair of output circuits 11 is electrically connected to each of the flip-flop circuits 10.

The flip-flop circuit 10 in the last stage of the block 31, the flip-flop circuit 10 in a first stage of the block 32, the flip-flop circuit 10 in the last stage of the block 32, and the flip-flop circuit 10 in the last stage of the block 32 are electrically connected to a switch circuit 15.

The switch circuit 15 can switch a first mode that activates an operation of outputting signal potentials in the block 31, the block 32, and the block 33 and a second mode that activates an operation of outputting signal potentials in the block 31 and the block 33. In the first mode, signal potentials can be sequentially output from all the blocks to the outside. In the second mode, the block 32 does not operate, so that signal potentials can be sequentially output from the block 31 and the block 33 to the outside.

Note that as illustrated in FIG. 1, in the case where a start pulse SP is input to the flip-flop circuit 10 in a first stage of the block 31 and the flip-flop circuit 10 in a fourth stage is the last stage of the block 31, the block 32 can include the flip-flop circuits 10 in a fifth stage to a 4n-th stage (n is an integer greater than or equal to 2). In addition, the block 33 can include the flip-flop circuits 10 in a 4n+1-th stage to a 4n+4-th stage.

For example, when n equals 2 in the second mode, it is possible to perform an operation where the flip-flop circuits in the first stage to the fourth stage and the ninth stage to the twelfth stage output signal potentials and the flip-flop circuits in the fifth stage to the eighth stage do not output signal potentials. In addition, when n equals 9, it is possible to perform an operation where the flip-flop circuits in the first stage to the fourth stage and a thirty-seventh stage to a fortieth stage output signal potentials and the flip-flop circuits in the fifth stage to a thirty-sixth stage do output signal potentials.

Specifically, in the case where the semiconductor apparatus 20 is applied to a display device or the like including a sensor element and a display element in a pixel, the first mode is used when image data writing and a sensing function that needs a high resolution (fingerprint authentication or the like) are performed. In contrast, a panel operation function or the like with or without contact does not need a high resolution, so that the second mode is used. A high-speed operation is possible in the second mode because the number of rows to operate can be reduced.

Note that in blocks after the block 33, circuits with structures similar to those of the switch circuit 15, the block 32, and the block 33 can be repeatedly connected.

Next, the output circuit 11 that is electrically connected to the flip-flop circuit 10 is described. The output circuit 11 includes a switch circuit 12, a circuit 13, and a circuit 14. The switch circuit 12 is electrically connected to the flip-flop circuit 10. In addition, the switch circuit 12 is electrically connected to the circuit 13 and the circuit 14.

The switch circuit 12 can output a second signal potential to one of the circuit 13 and the circuit 14 in accordance with a first signal potential input from the flip-flop circuit 10. In addition, a pulse width control signal PWC is input to the one of the circuit 13 and the circuit 14 through the switch circuit 12. The circuit 13 or the circuit 14 can output a third signal potential to the outside in accordance with the pulse width control signal PWC and the second signal potential.

For example, the circuit 13 can be electrically connected to a circuit that drives a display element included in a pixel of the display device. The circuit 14 can be electrically connected to a circuit that drives a sensor element included in a pixel of the display device. Note that although FIG. 1 illustrates one output path for each of the circuit 13 and the circuit 14, two or more output paths may be employed. By increasing the number of pulse width control signals PWC to be input to the switch circuit 12, the circuit 13, and the circuit 14, signal potentials can be output from two or more paths at different timings.

Figure 3:
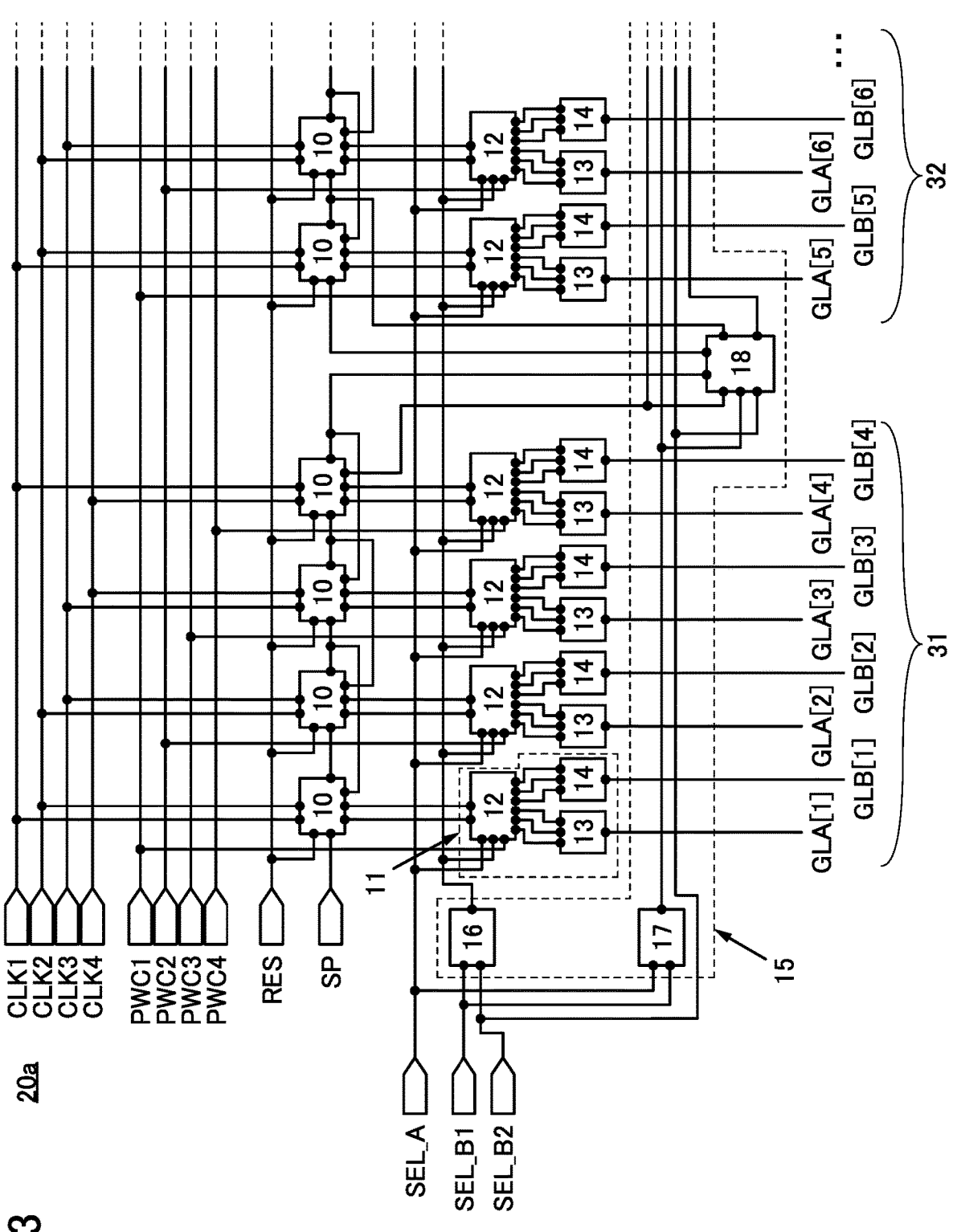
FIG. 3 is a diagram illustrating a semiconductor apparatus.
Figure 4:
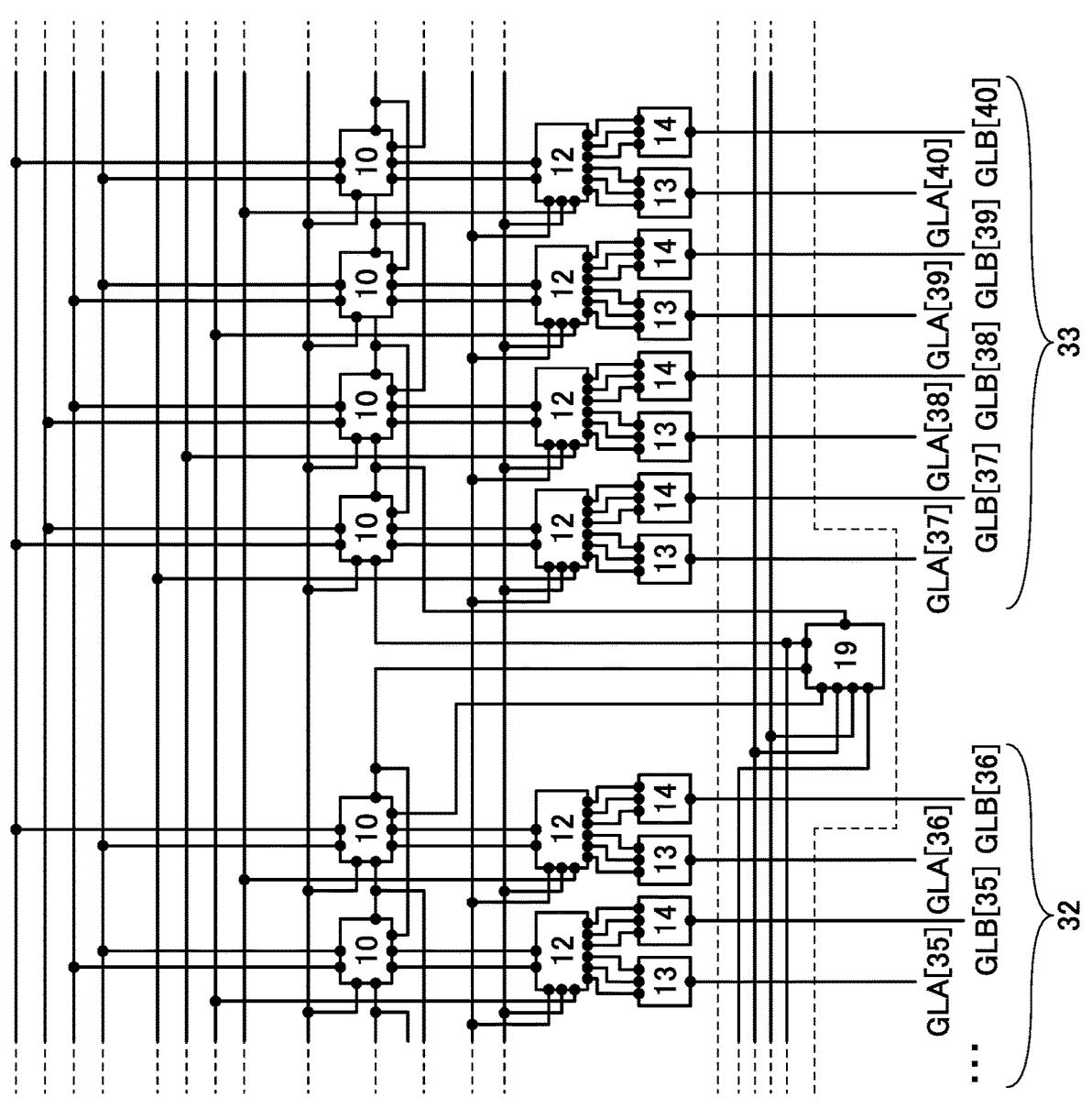
FIG. 4 is a diagram illustrating the semiconductor apparatus.

FIG. 3 and FIG. 4 are detailed block diagrams of a semiconductor apparatus 20a that can be applied to the semiconductor apparatus 20 when n equals 9. The flip-flop circuits 10 and the output circuits 11 (the switch circuits 12, the circuits 13, and the circuits 14) illustrated in FIG. 3 and FIG. 4 correspond to those in the block diagram illustrated in FIG. 1. The switch circuit 15 illustrated in FIG. 1 includes a switch circuit 16, a switch circuit 17, and a switch circuit 18 that are illustrated in FIG. 3, a switch circuit 19 illustrated in FIG. 4, and the like as components.

As described above, the output circuit 11 can output signal potentials from the circuit 13 or the circuit 14. FIG. 3 and FIG. 4 each illustrate a mode where signal potentials GLA (GLA[1] to GLA[40]) are output from the circuit 13 and signal potentials GLB (GLB [1] to GLB[40]) are output from the circuit 14.

In addition, FIG. 3 shows an example where the switch circuit 18 is provided between the flip-flop circuit 10 in the fourth stage and the flip-flop circuit in the fifth stage, and FIG. 4 shows an example where the switch circuit 19 is provided between the flip-flop circuit 10 in the thirty-sixth stage and the flip-flop circuit 10 in the thirty-seventh stage.

That is, the flip-flop circuits 10 and the output circuits 11 in the first stage to the fourth stage illustrated in FIG. 3 correspond to the block 31 illustrated in FIG. 1. In addition, the flip-flop circuits 10 and the output circuits 11 in the fifth stage to the thirty-sixth stage illustrated in FIG. 3 and FIG. 4 correspond to the block 32 illustrated in FIG. 1. Furthermore, the flip-flop circuits 10 and the output circuits 11 in the thirty-seventh stage to the fortieth stage illustrated in FIG. 4 correspond to the block 33 illustrated in FIG. 1.

Note that the number of stages in each block can be changed within the range of the description on FIG. 1. Moreover, in the structures illustrated in FIG. 3 and FIG. 4, an output signal of the flip-flop circuit 10 in a subsequent stage is input to the flip-flop circuit 10 in a former stage;

thus, a required number of dummy flip-flop circuits 10 are provided in the last block (not illustrated) in the entire semiconductor apparatus 20a.

As input signals of the semiconductor apparatus 20a, clock signals CLK1 to CLK4, pulse width control signals PWC1 to PWC4, a reset signal RES, a start pulse signal SP, a selection signal SEL_A, a selection signal SEL_B1, and a selection signal SEL_B2 can be used.

Figure 5A:
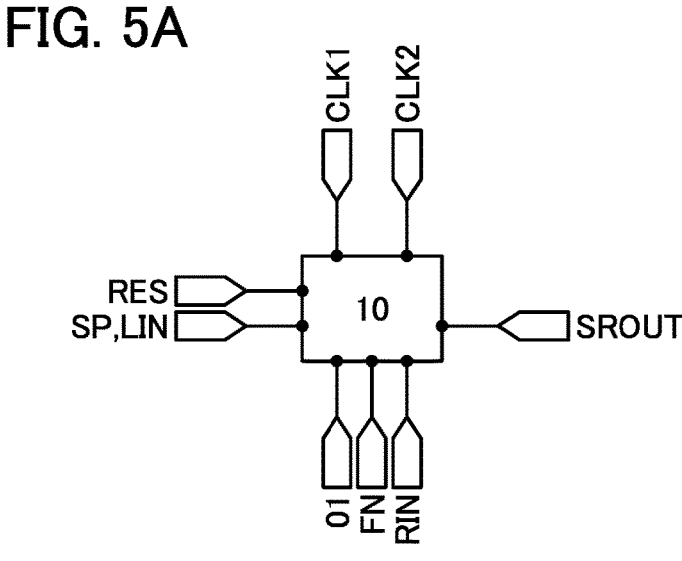
FIG. 5A and FIG. 5B are diagrams illustrating a flip-flop circuit.
Figure 5B:
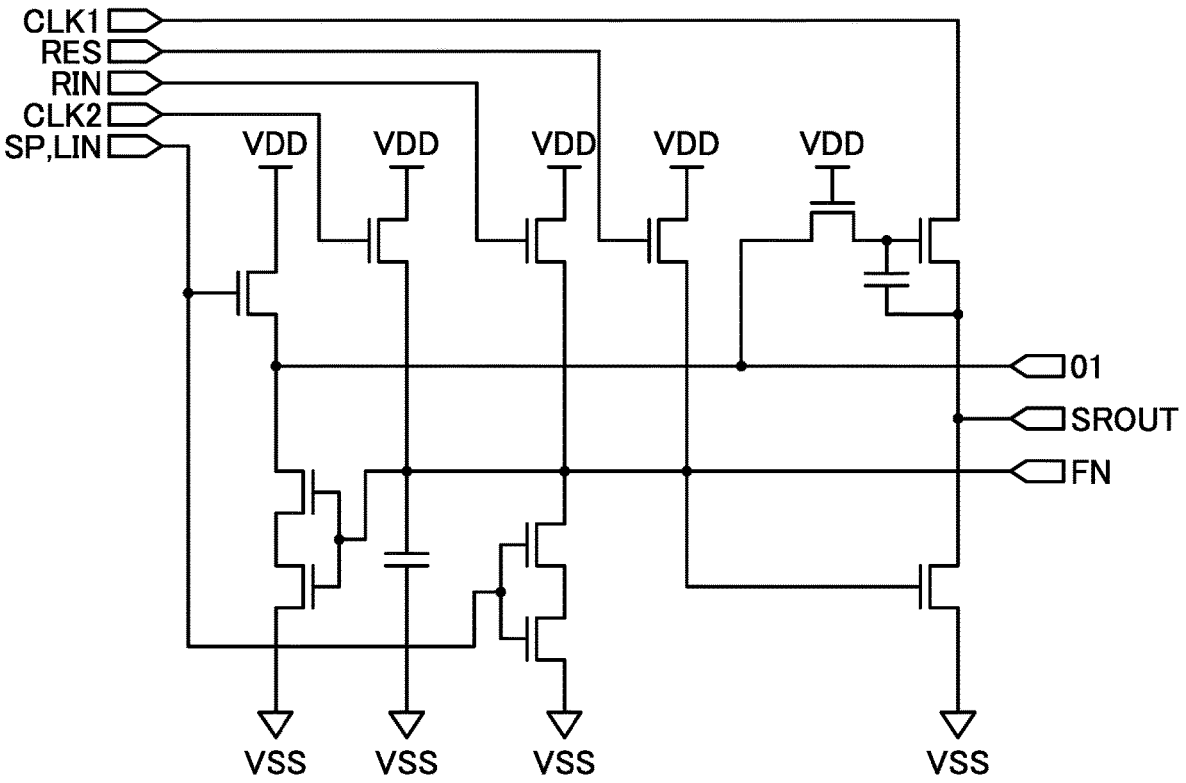

FIG. 5A illustrates a block diagram of the flip-flop circuit 10, and FIG. 5B shows an example of a circuit diagram of the flip-flop circuit 10. FIG. 5B is referred to for the connection mode of transistors and capacitors included in the flip-flop circuit 10, and its description is omitted. Note that VDD refers to a high power supply potential, and VSS refers to a lower power supply potential. In addition, the transistors included in the semiconductor apparatus 20a are n-channel transistors.

Input signals are clock signals of two systems, the reset signal RES, a reset signal RIN input from the flip-flop circuit 10 in the subsequent stage, and a shift signal LIN input from the flip-flop circuit 10 in the former stage. Note that in the flip-flop circuit 10 in the first stage, the clock signals CLK1 and CLK2 are used, and the start pulse signal SP is used instead of the shift signal LIN.

Output signals are a signal potential 01, a signal potential SROUT, and a signal potential FN. The signal potential 01 is used to generate a signal potential output to the outside in the circuit 13 or the circuit 14. The signal potential FN is used to control a transistor to be a pulldown resistor in the circuit 13 or the circuit 14. The signal potential SROUT is used as the shift signal LIN with respect to the flip-flop circuit 10 in the subsequent stage and is used as the reset signal RIN with respect to the flip-flop circuit 10 in the former stage.

Figure 6A:
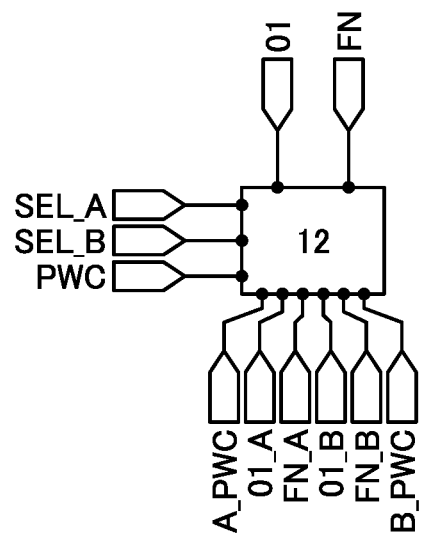
FIG. 6A and FIG. 6B are diagrams illustrating a switch circuit included in an output circuit.
Figure 6B:
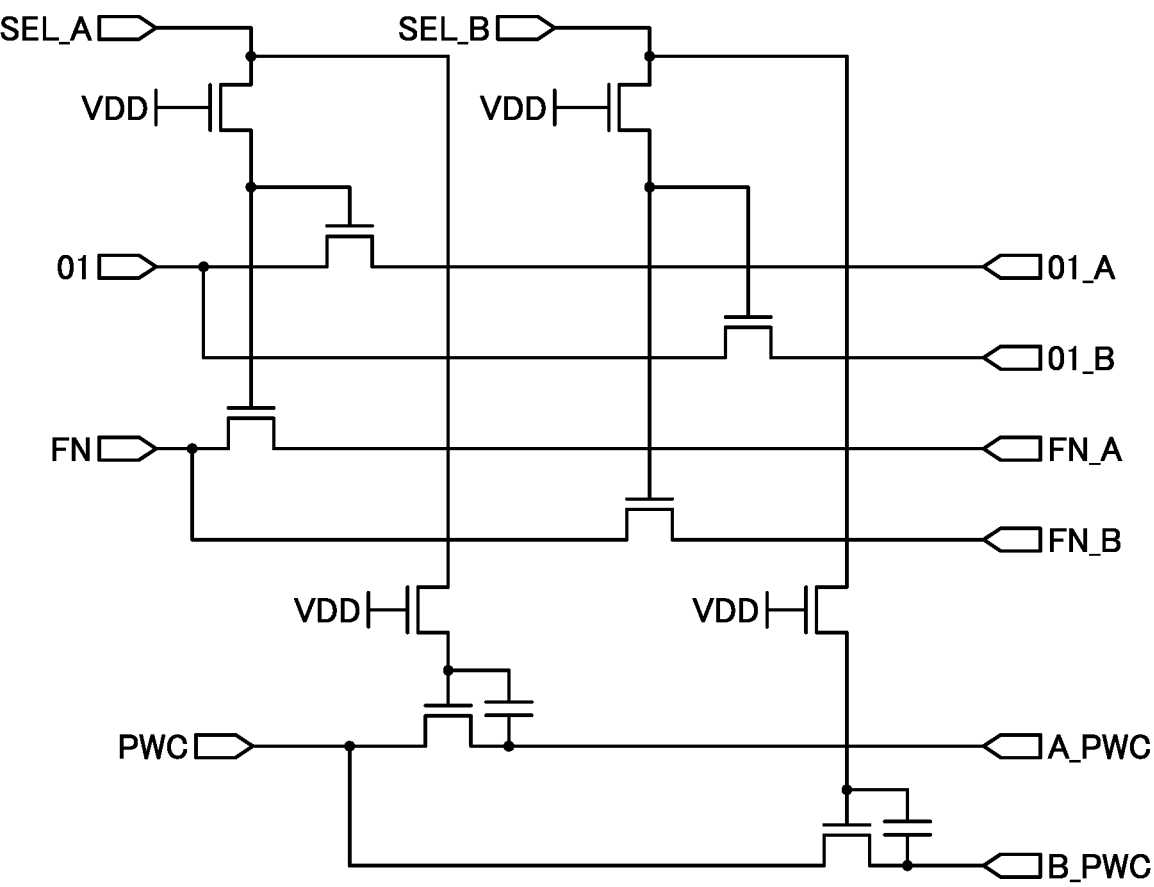

FIG. 6A illustrates a block diagram of the switch circuit 12, and FIG. 6B shows an example of a circuit diagram of the switch circuit 12. FIG. 6B is referred to for the connection mode of transistors and capacitors included in the switch circuit 12, and its description is omitted.

Input signals are the pulse width control signal PWC, the selection signal SEL_A, a selection signal SEL_B, and the signal potential 01 and the signal potential FN that are input from the flip-flop circuit 10. The selection signal SEL_A and the selection signal SEL_B are signals for selecting whether to output signal potentials to the outside from either the circuit 13 or the circuit 14. The selection signal SEL_B is a signal potential generated in the switch circuit 16 to be described later.

Output signals are a signal potential 01_A, a signal potential 01_B, a signal potential FN_A, a signal potential FN_B, a pulse width control signal A_PWC, and a pulse width control signal B_PWC. By inputting the selection signal SEL_A, the signal potential 01_A, the signal potential FN_A, and the pulse width control signal A_PWC are generated. By inputting the selection signal SEL_B, the signal potential 01_B, the signal potential FN_B, and the pulse width control signal B_PWC are generated.

The signal potential 01_A and the signal potential 01_B are used to generate signal potentials output from the circuit 13 or the circuit 14. The signal potential FN_A and the signal potential FN_B are used to control a transistor to be a pulldown resistor in the circuit 13 or the circuit 14. The pulse width control signal A_PWC and the pulse width control signal B_PWC are used to control the pulse width of signal potentials output from the circuit 13 or the circuit 14.

That is, two pulse width control signals are generated from one pulse width control signal in the switch circuit 12, so that the number of signals input to the semiconductor apparatus can be reduced.

Figures 7A, 7B:
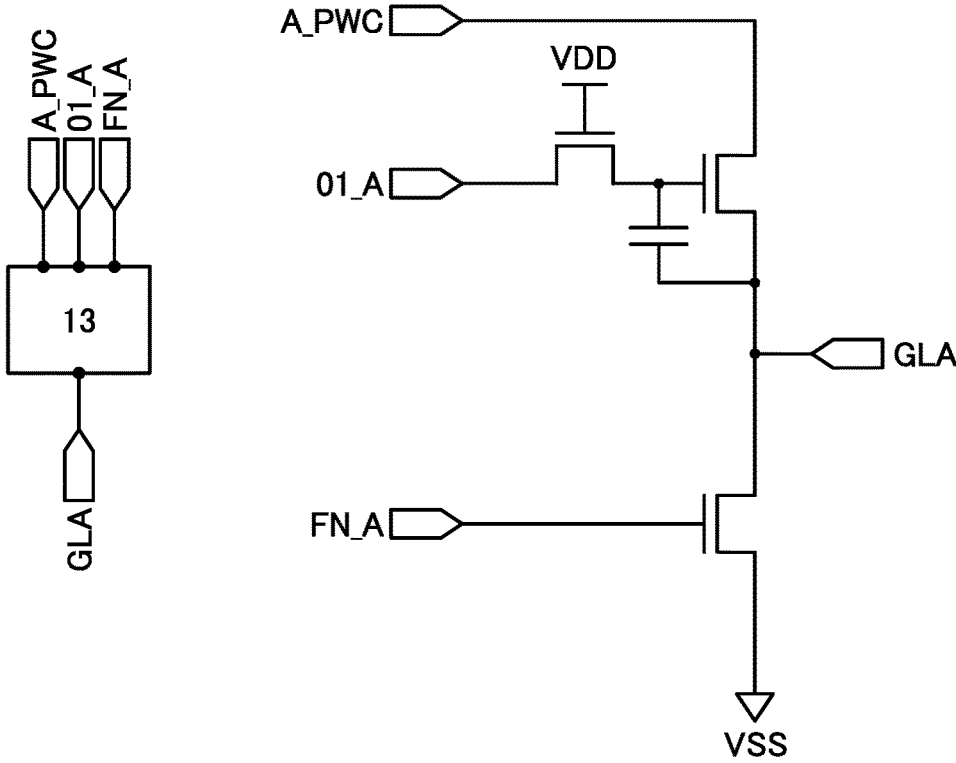
FIG. 7A to FIG. 7D are diagrams illustrating circuits included in the output circuit.

FIG. 7A illustrates a block diagram of the circuit 13, and FIG. 7B shows an example of a circuit diagram of the circuit 13. FIG. 7B is referred to for the connection mode of transistors and a capacitor included in the circuit 13, and its description is omitted.

Input signals are the signal potential 01_A, the signal potential FN_A, and the pulse width control signal A_PWC that are input from the switch circuit 12. The signal potential GLA that is generated by inputting the signal potential 01_A and the pulse width control signal A_PWC can be output to a wiring to which an external circuit is connected. In addition, by inputting the signal potential FN_A, the transistor corresponding to the pulldown resistor can be operated, and the potential of the wiring can be stabilized at VSS.

Figures 7C, 7D:
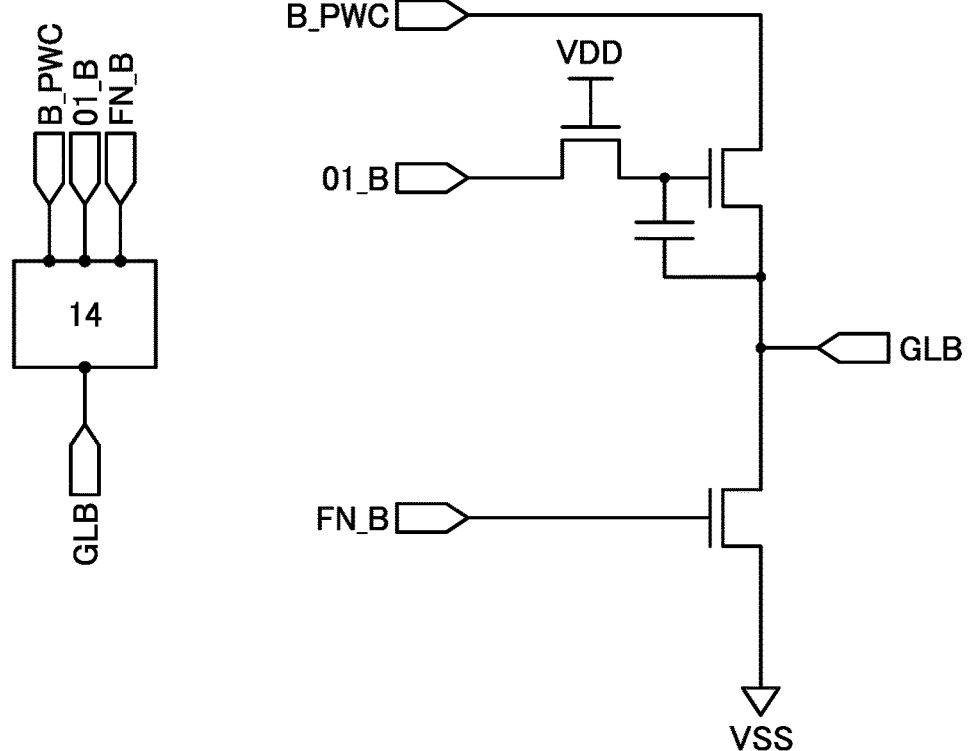

FIG. 7C illustrates a block diagram of the circuit 14, and FIG. 7D shows an example of a circuit diagram of the circuit 14. FIG. 7D is referred to for the connection mode of transistors and a capacitor included in the circuit 14, and its description is omitted.

Input signals are the signal potential 01_B, the signal potential FN_B, and the pulse width control signal B_PWC that are input from the switch circuit 12. The signal potential GLB that is generated by inputting the signal potential 01_B and the pulse width control signal B_PWC can be output to a wiring to which an external circuit is connected. In addition, by inputting the signal potential FN_B, the transistor corresponding to the pulldown resistor can be operated, and the potential of the wiring can be stabilized at VSS.

Figure 8A:
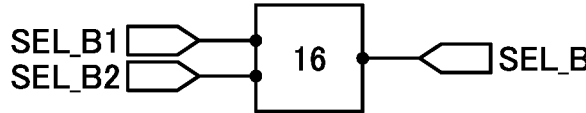
FIG. 8A to FIG. 8D are diagrams illustrating switch circuits.
Figure 8B:
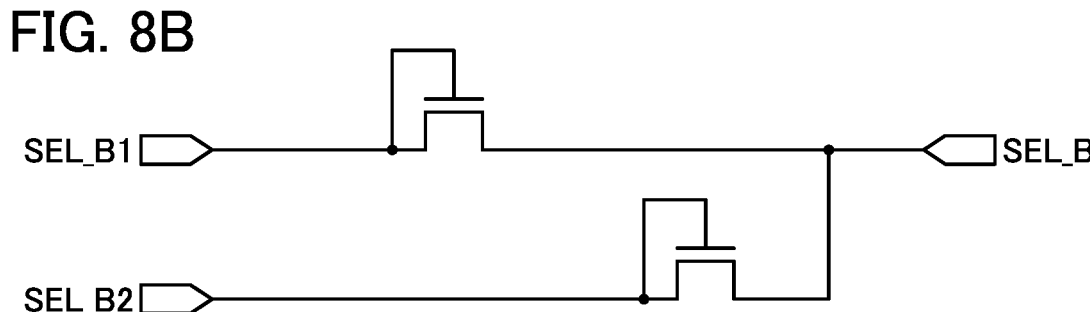

FIG. 8A illustrates a block diagram of the switch circuit 16, and FIG. 8B shows an example of a circuit diagram of the switch circuit 16. FIG. 8B is referred to for the connection mode of transistors included in the switch circuit 16, and its description is omitted.

Input signals are the selection signal SEL_B1 and the selection signal SEL_B2. Even when any selection signal is input, a signal potential SEL_B is generated. The signal potential SEL_B is input to the switch circuit 12. When the selection signal SEL_B is input to the switch circuit 12, the output of signal potentials from the circuit 14 to the outside can be activated.

Figure 8C:
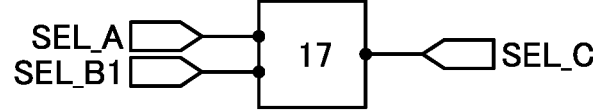
Figure 8D:
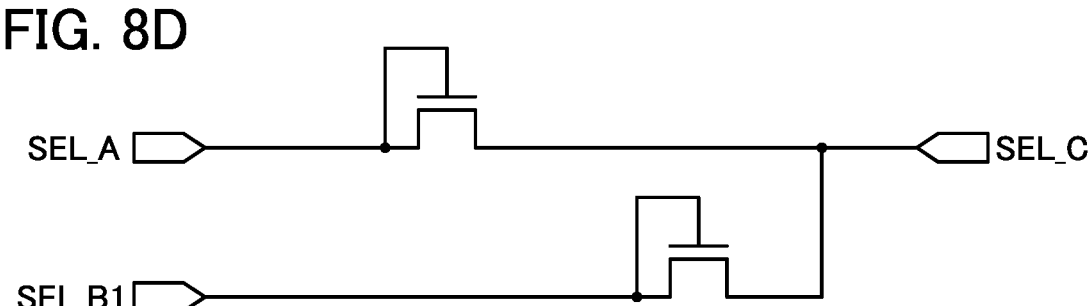

FIG. 8C illustrates a block diagram of the switch circuit 17, and FIG. 8D shows an example of a circuit diagram of the switch circuit 17. FIG. 8D is referred to for the connection mode of transistors included in the switch circuit 17, and its description is omitted.

Input signals are the selection signal SEL_A and the selection signal SEL_B1. Even when any selection signal is input, the signal potential SEL_C is generated. The signal potential SEL_C is input to the switch circuit 18 and the switch circuit 19 to be described later.

Figure 9A:
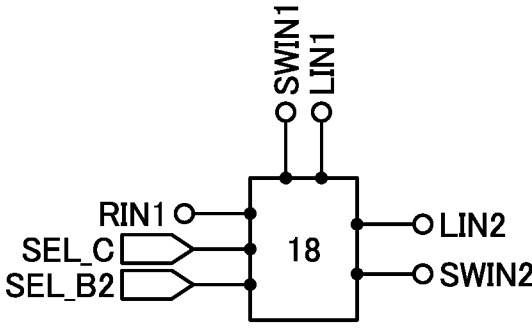
FIG. 9A and FIG. 9B are diagrams illustrating a switch circuit.
Figure 9B:
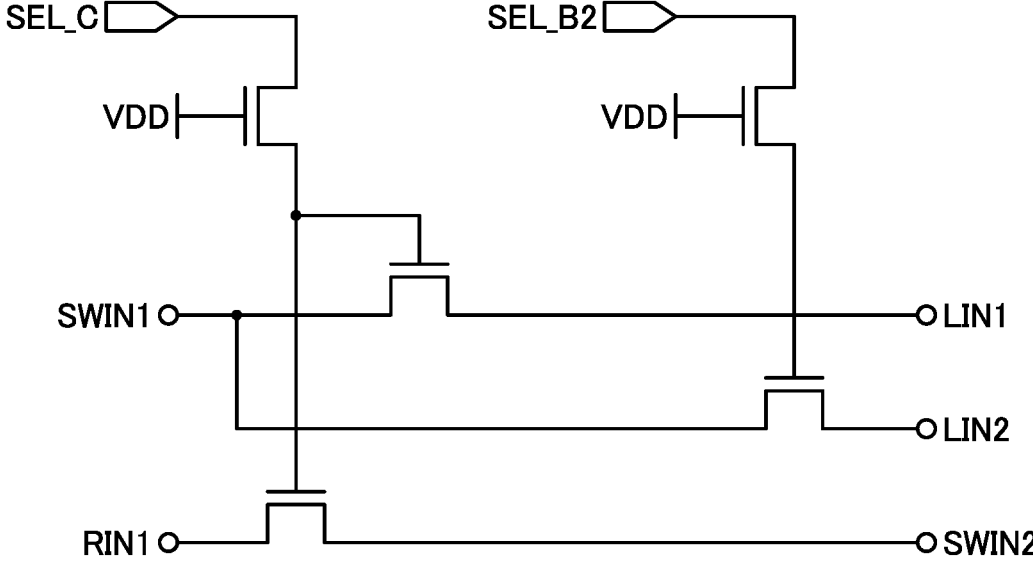

FIG. 9A illustrates a block diagram of the switch circuit 18, and FIG. 9B shows an example of a circuit diagram of the switch circuit 18. FIG. 9B is referred to for the connection mode of transistors included in the switch circuit 18, and its description is omitted.

Input signals are a selection signal SEL_C and the selection signal SEL_B2. In addition, the switch circuit 18 includes a terminal SWIN1, a terminal RIN1, a terminal LIN1, a terminal LIN2, and a terminal SWIN2. In FIG. 3, the terminal SWIN1 is electrically connected to an output terminal (a terminal for outputting the signal potential SROUT) of the flip-flop circuit 10 in the fourth stage. The terminal RIN1 is electrically connected to an input terminal (a terminal to which the reset signal RIN is input) of the flip-flop circuit 10 in the fourth stage. The terminal LIN1 is electrically connected to an input terminal (a terminal to which the shift signal LIN is input) of the flip-flop circuit 10 in the fifth stage. In FIG. 3 and FIG. 4, the terminal LIN2 is electrically connected to an input terminal (a terminal to which the shift signal LIN is input) of the flip-flop circuit 10 in the thirty-seventh stage and the switch circuit 19 to be described later. The terminal SWIN2 is electrically connected to an output terminal (a terminal for outputting the signal potential SROUT) of the flip-flop circuit 10 in the fifth stage.

Figure 10A:
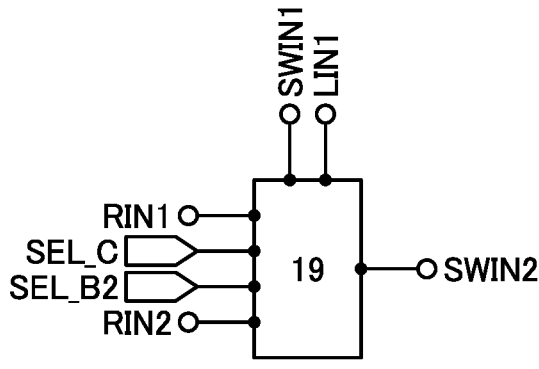
FIG. 10A and FIG. 10B are diagrams illustrating a switch circuit.
Figure 10B:
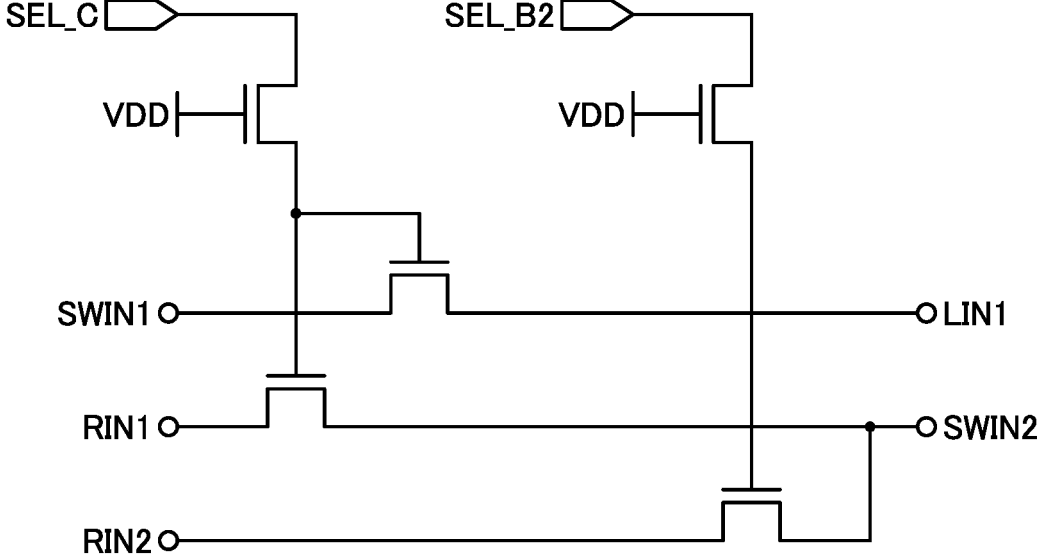

FIG. 10A illustrates a block diagram of the switch circuit 19, and FIG. 10B shows an example of a circuit diagram of the switch circuit 19. FIG. 10B is referred to for the connection mode of transistors included in the switch circuit 19, and its description is omitted.

Input signals are the selection signal SEL_C and the selection signal SEL_B2. In addition, the switch circuit 19 includes the terminal SWIN1, the terminal RIN1, a terminal RIN2, the terminal LIN1, and the terminal SWIN2. In FIG. 4, the terminal SWIN1 is electrically connected to an output terminal (a terminal for outputting the signal potential SROUT) of the flip-flop circuit 10 in the thirty-sixth stage. The terminal RIN1 is electrically connected to an input terminal (a terminal to which the reset signal RIN is input) of the flip-flop circuit 10 in the thirty-sixth stage. In FIG. 3 and FIG. 4, the terminal RIN2 is electrically connected to the input terminal (the terminal to which the reset signal RIN is input) of the flip-flop circuit 10 in the fourth stage. In FIG. 4, the terminal LIN1 is electrically connected to the input terminal (the terminal to which the shift signal LIN is input) of the flip-flop circuit 10 in the thirty-seventh stage. The terminal SWIN2 is electrically connected to an output terminal (a terminal for outputting the signal potential SROUT) of the flip-flop circuit 10 in the thirty-seventh stage.

Here, in the case where the selection signal SEL_C is input to the switch circuit 18 and the switch circuit 19, the terminal SWIN1 and the terminal LIN1 are brought into conduction and the terminal RIN1 and the terminal SWIN2 are brought into conduction in the switch circuit 18. In addition, the terminal SWIN1 and the terminal LIN1 are brought into conduction and the terminal RIN1 and the terminal SWIN2 are brought into conduction in the switch circuit 19.

Thus, the signal potential SROUT output from the flip-flop circuit 10 in the fourth stage is input to the flip-flop circuit 10 in the fifth stage as the shift signal LIN. The signal potential SROUT output from the flip-flop circuit 10 in the fifth stage is input to the flip-flop circuit 10 in the fourth stage as the reset signal RIN. Accordingly, by inputting the selection signal SEL_C, operations of outputting signal potentials in the block 31 and the block 32 illustrated in FIG. 1 are selected.

In addition, the signal potential SROUT output from the flip-flop circuit 10 in the thirty-sixth stage is input to the flip-flop circuit 10 in the thirty-seventh stage as the shift signal LIN. The signal potential SROUT output from the flip-flop circuit 10 in the thirty-seventh stage is input to the flip-flop circuit 10 in the thirty-sixth stage as the reset signal RIN. Accordingly, by inputting the selection signal SEL_C, an operation of outputting signal potentials in the block 33 illustrated in FIG. 1 is further selected.

That is, by inputting the selection signal SEL_C, the operations of the block 31, the block 32, and the block 33 that are illustrated in FIG. 1 are selected, so that the signal potentials GLA[1] to GLA[40] or the signal potentials GLB[1] to GLB can be output.

In contrast, in the case where the selection signal SEL_B2 is input to the switch circuit 18 and the switch circuit 19, the terminal SWIN1 and the terminal LIN2 are brought into conduction in the switch circuit 18. In addition, the terminal RIN2 and the terminal SWIN2 are brought into conduction in the switch circuit 19.

Thus, the signal potential SROUT output from the flip-flop circuit 10 in the fourth stage is input to the flip-flop circuit 10 in the thirty-seventh stage as the shift signal LIN. The signal potential SROUT output from the flip-flop circuit 10 in the thirty-seventh stage is input to the flip-flop circuit 10 in the fourth stage as the reset signal RIN.

That is, by inputting the selection signal SEL_B2, operations of outputting signal potentials in the block 31 and the block 33 illustrated in FIG. 1 are selected, so that the signal potentials GLA[1] to GLA[4] and the signal potentials GLA[37] to GLA[40], or the signal potentials GLB [1] to GLB[4] and the signal potentials GLB[37] to GLB[40] can be output.

Table 1 summarizes the selection signals input to the semiconductor apparatus 20a and the circuits for outputting the signal potentials that have been described so far.

TABLE 1

| Selection signal | Output block | Output circuit |
|---|---|---|
| SEL_A | Blocks 31, 32, and 33 | Circuit 13 |
| SEL_B1 | Blocks 31, 32, and 33 | Circuit 14 |
| SEL_B2 | Blocks 31 and 33 | Circuit 14 |

Note that in the above description, the example where one path is provided for outputting the signal potentials from each of the circuit 13 and the circuit 14 is shown. However, by increasing the number of control signals PWC input to the switch circuit 12, the circuit 13, and the circuit 14, the signal potentials can be output through two or more paths at different timings.

Figure 11:
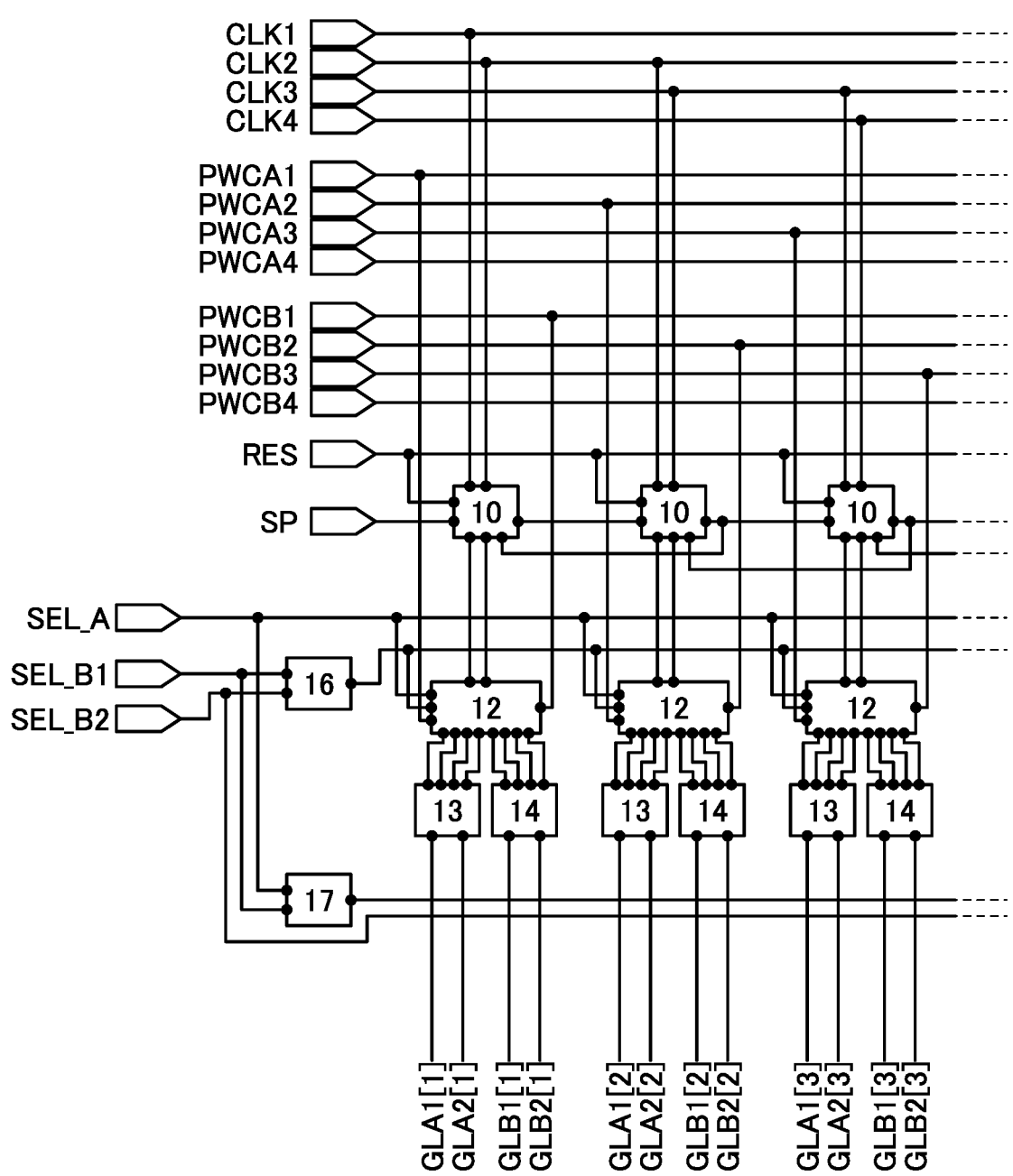
FIG. 11 is a diagram illustrating a semiconductor apparatus.

FIG. 11 is a block diagram of a semiconductor apparatus 20b that shows an example where two signal potentials are output from each of the circuit 13 and the circuit 14. A signal potential GLA1 and a signal potential GLA2 can be output from the circuit 13 at different timings. In addition, a signal potential GLB1 and a signal potential GLB2 can be output from the circuit 14 at different timings.

The semiconductor apparatus 20b differs from the semiconductor apparatus 20a illustrated in FIG. 3 and FIG. 4 in that input signals are increased from the pulse width control signal PWC to pulse width control signals PWCA (PWCA1 to PWCA4) and pulse width control signals PWCB (PWCB1 to PWCB4). In addition, the semiconductor apparatus 20b differs from the semiconductor apparatus 20a in the structures of the switch circuit 12, the circuit 13, and the circuit 14. Note that the structures of the flip-flop circuit 10, the switch circuits 16 and 17, and the switch circuits 18 and 19 (not illustrated) included in the semiconductor apparatus 20b and connection structures of these components can be the same as those of the semiconductor apparatus 20a.

Figure 12A:
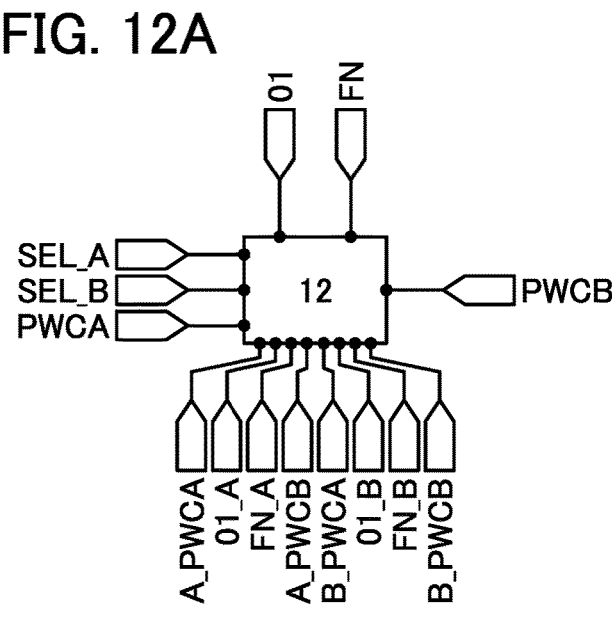
FIG. 12A and FIG. 12B are diagrams illustrating the switch circuit included in the output circuit.
Figure 12B:
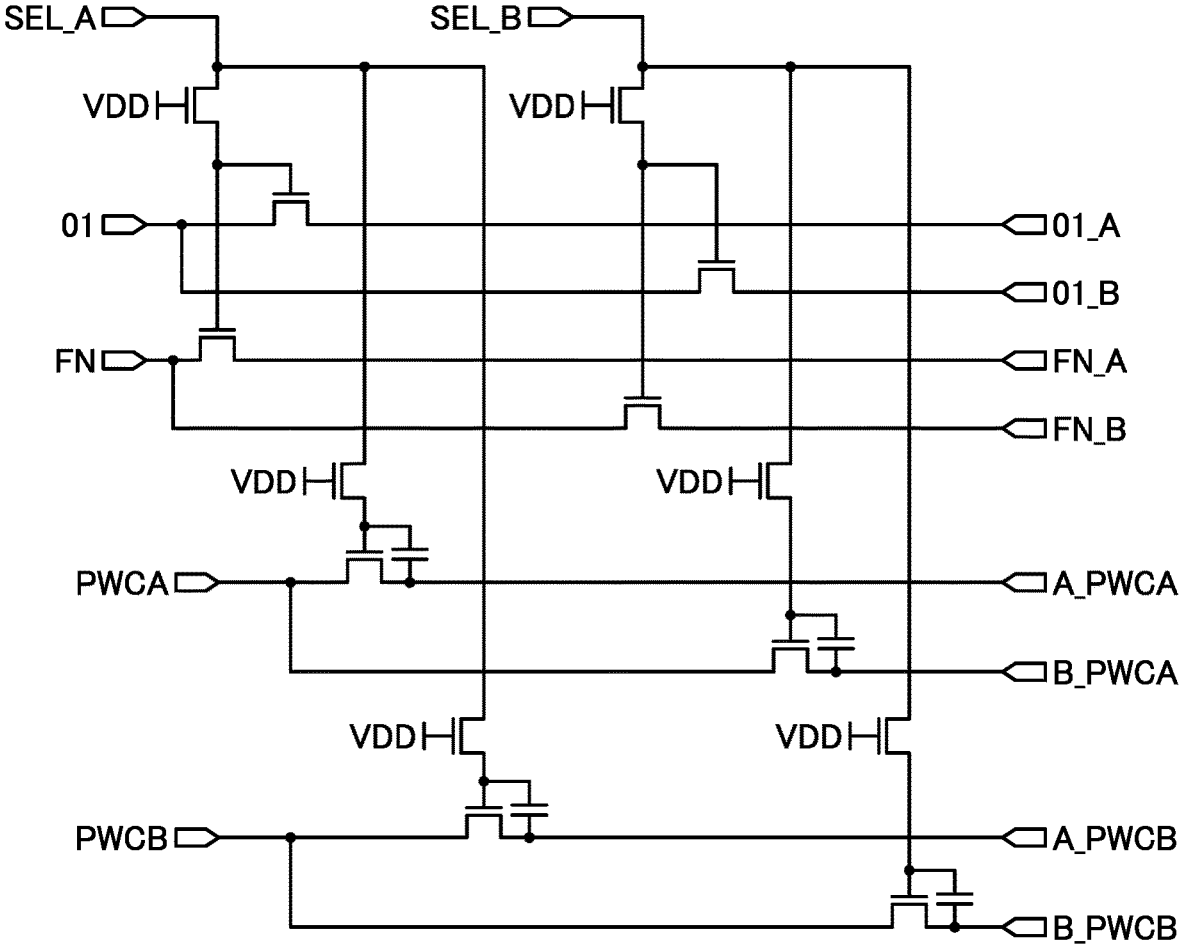

FIG. 12A illustrates a block diagram of the switch circuit 12 included in the semiconductor apparatus 20b, and FIG. 12B shows an example of a circuit diagram of the switch circuit 12. FIG. 12B is referred to for the connection mode of transistors and capacitors included in the switch circuit 12, and its description is omitted.

Input signals are the pulse width control signals PWCA, the pulse width control signals PWCB, the selection signal SEL_A, the selection signal SEL_B, and the signal potential 01 and the signal potential FN that are input from the flip-flop circuit 10. The selection signal SEL_A and the selection signal SEL_B are signals for selecting whether to output signal potentials to the outside from either the circuit 13 or the circuit 14.

Output signals are the signal potential 01_A, the signal potential 01_B, the signal potential FN_A, the signal potential FN_B, a pulse width control signal A_PWCA, a pulse width control signal B_PWCA, a pulse width control signal A_PWCB, a pulse width control signal B_PWCB. By inputting the selection signal SEL_A, the signal potential 01_A, the signal potential FN_A, the pulse width control signal A_PWCA, and the pulse width control signal A_PWCB are generated. By inputting the selection signal SEL_B, the signal potential 01_B, the signal potential FN_B, the pulse width control signal B_PWCA, and the pulse width control signal B_PWCB are generated.

The signal potential 01_A and the signal potential 01_B are used to generate signal potentials output from the circuit 13 or the circuit 14. The signal potential FN_A and the signal potential FN_B are used to control a transistor to be a pulldown resistor in the circuit 13 or the circuit 14. The pulse width control signals A_PWCA and A_PWCB and the pulse width control signals B_PWCA and B_PWCB are used to control the pulse width and timing of signal potentials output from the circuit 13 or the circuit 14.

Figure 13A:
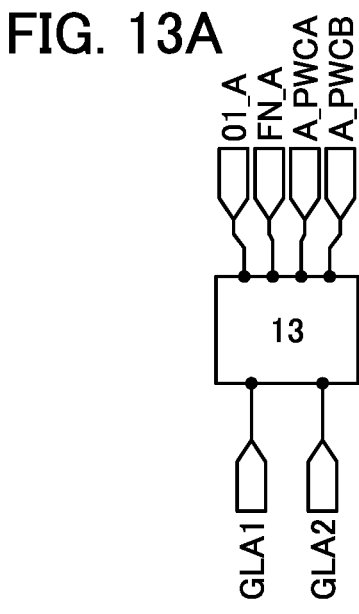
FIG. 13A and FIG. 13B are diagrams illustrating the circuit included in the output circuit.
Figure 13B:
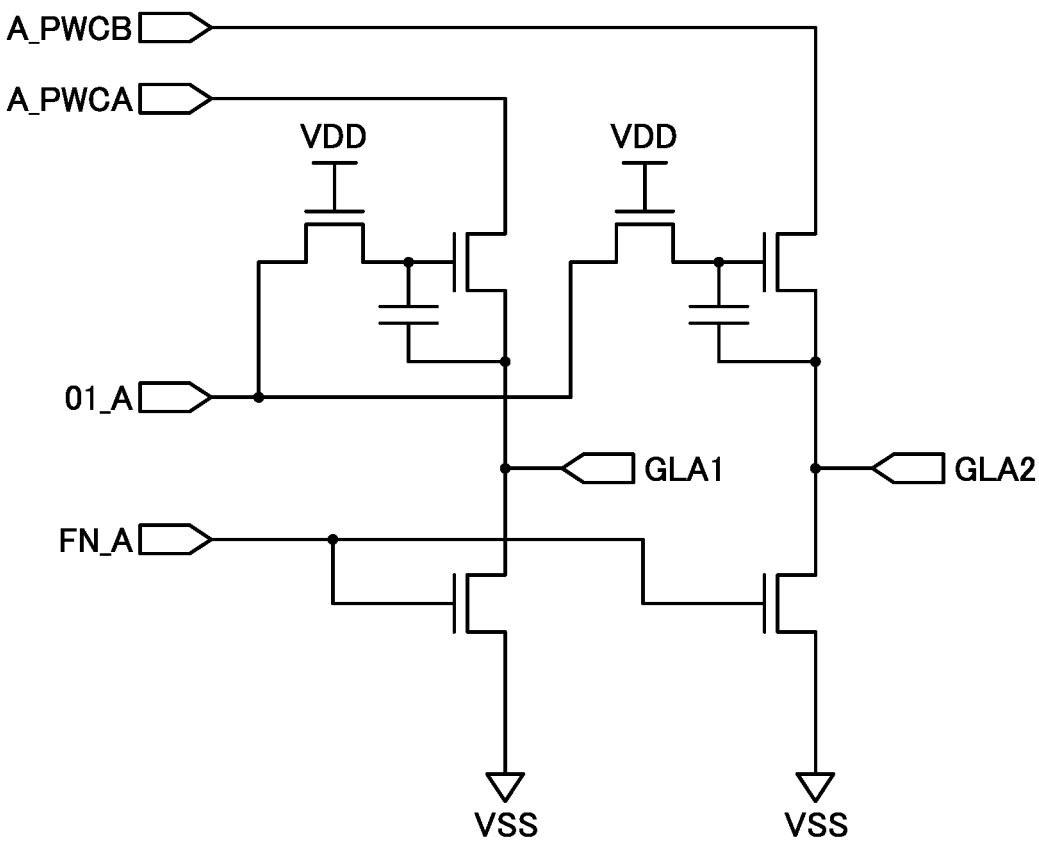

FIG. 13A illustrates a block diagram of the switch circuit 13 included in the semiconductor apparatus 20b, and FIG. 13B shows an example of a circuit diagram of the switch circuit 13. FIG. 13B is referred to for the connection mode of transistors and capacitors included in the switch circuit 13, and its description is omitted.

Input signals are the signal potential 01_A, the signal potential FN_A, and the pulse width control signals A_PWCA and A_PWCB that are input from the switch circuit 12.

By inputting the signal potential 01_A and the pulse width control signal A_PWCA, the signal potential GLA1 can be output to a wiring to which an external circuit is connected. In addition, by inputting the signal potential FN_A and the pulse width control signal A_PWCA, a transistor corresponding to a pulldown resistor can be operated, and the potential of the wiring can be stabilized at VSS.

In addition, by inputting the signal potential 01_A and the pulse width control signal A_PWCB, the signal potential GLA2 can be output to a wiring to which an external circuit is connected. Furthermore, by inputting the signal potential FN_A and the pulse width control signal A_PWCB, the transistor corresponding to the pulldown resistor can be operated, and the potential of the wiring can be stabilized at VSS.

Therefore, the signal potential GLA1 and the signal potential GLA2 can be output to the outside at different timings.

Figure 14A:
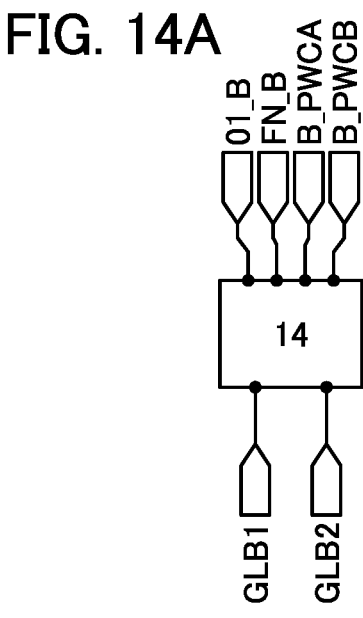
FIG. 14A and FIG. 14B are diagrams illustrating the circuit included in the output circuit.
Figure 14B:
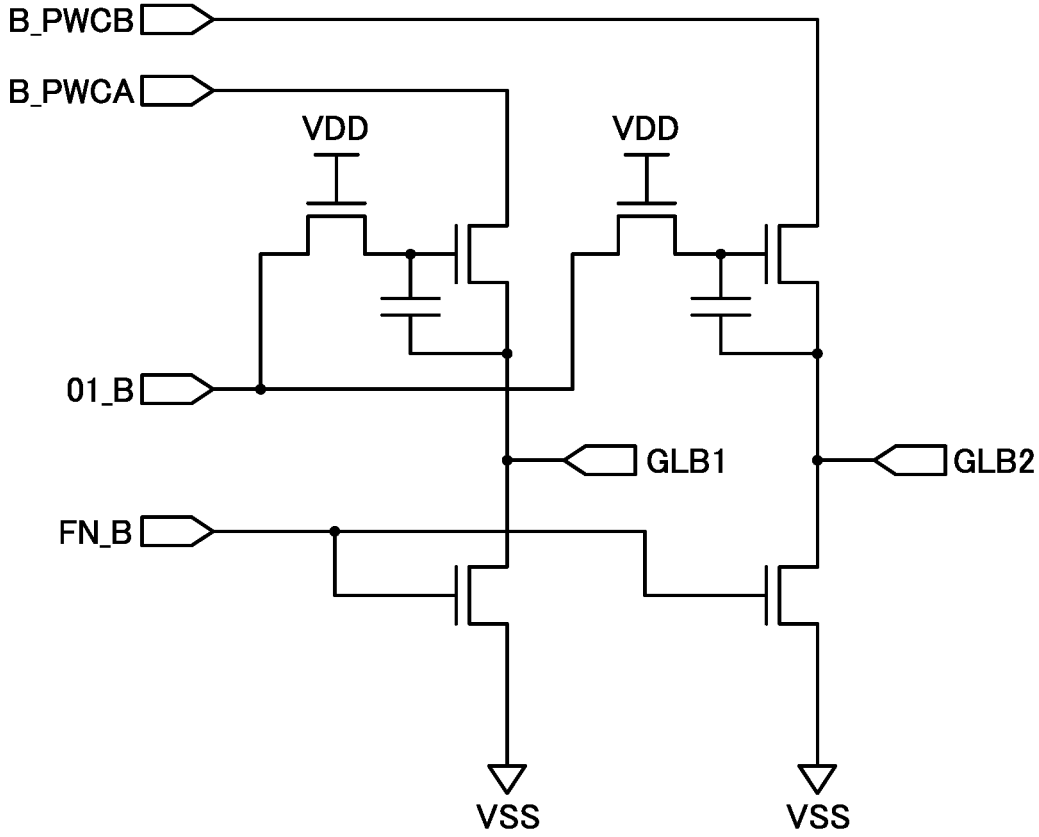

FIG. 14A illustrates a block diagram of the switch circuit 14 included in the semiconductor apparatus 20b, and FIG. 14B shows an example of a circuit diagram of the switch circuit 14. FIG. 14B is referred to for the connection mode of transistors and capacitors included in the switch circuit 14, and its description is omitted.

Input signals are the signal potential 01_B, the signal potential FN_B, and the pulse width control signals B_PWCA and B_PWCB that are input from the switch circuit 12.

By inputting the signal potential 01_B and the pulse width control signal B_PWCA, the signal potential GLB1 can be output to a wiring to which an external circuit is connected. In addition, by inputting the signal potential FN_B and the pulse width control signal B_PWCA, a transistor corresponding to a pulldown resistor can be operated, and the potential of the wiring can be stabilized at VSS.

In addition, by inputting the signal potential 01_B and the pulse width control signal B_PWCB, the signal potential GLB2 can be output to a wiring to which an external circuit is connected. Furthermore, by inputting the signal potential FN_B and the pulse width control signal B_PWCB, the transistor corresponding to the pulldown resistor can be operated, and the potential of the wiring can be stabilized at VSS.

Therefore, the signal potential GLB1 and the signal potential GLB2 can be output to the outside at different timings.

The semiconductor apparatus 20a and the semiconductor apparatus 20b can each use an n-channel transistor as a component. Silicon or a metal oxide is preferable as a semiconductor material that can be used for a channel formation region of an n-channel transistor.

Amorphous silicon, microcrystalline silicon, polycrystalline silicon, single crystal silicon, or the like can be used for a transistor using silicon in a channel formation region (hereinafter, a Si transistor). Note that amorphous silicon or polycrystalline silicon is preferably used in the case where the transistor is provided on an insulating surface of a glass substrate or the like.

Amorphous silicon is preferably used for a large device because a technique of forming amorphous silicon on a large-area glass substrate by a plasma CVD (chemical vapor deposition) method has been established. In addition, polycrystalline silicon is preferably used for a small- and medium-sized high-resolution device because a transistor with high mobility can be formed and the transistor size can be reduced. Furthermore, a transistor using polycrystalline silicon can operate at high speed; thus, a driver circuit can be also formed. Specifically, a display device and the like can be given as the devices.

High-quality polycrystalline silicon can be obtained easily by using a laser crystallization step or the like. In addition, the high-quality polycrystalline silicon can be also obtained by a solid-phase growth method in which a metal catalyst such as nickel or palladium is added to amorphous silicon and then heated. Furthermore, to enhance crystallinity, the polycrystalline silicon formed by the solid-phase growth method using a metal catalyst may be subjected to laser irradiation. Note that the metal catalyst remains in the polycrystalline silicon and worsens electrical characteristics of the transistor; therefore, it is preferable to provide a region to which phosphorus, a noble gas, or the like is added other than the channel formation region, so that the region captures the metal catalyst.

In contrast, a transistor using a metal oxide in a channel formation region (hereinafter, an OS transistor) has higher mobility than a transistor using amorphous silicon in a channel formation region. In addition, the OS transistor can be formed on an insulating surface such as a glass substrate by a sputtering method or the like; thus, the OS transistor is easily compatible with a large-area device. Accordingly, the OS transistor can be widely applied to a small- and medium-sized device to a large device.

In the OS transistor, a semiconductor layer has a large energy gap, and thus the OS transistor can have an extremely low off-state current of several yoctoamperes per micrometer (current per micrometer of channel width). Therefore, in the case where the OS transistor is used in a pixel circuit of a display device, a data potential can be retained in the pixel circuit for a long time.

Accordingly, appropriate image display can be performed even when frame frequency is lowered. For example, switching between first frame frequency (for example, higher than or equal to 60 Hz) in moving image display and second frame frequency that is lower than the first frame frequency (for example, approximately 1 to 10 Hz) in still image display can reduce power consumption of the display device.

A semiconductor apparatus according to one embodiment of the present invention can be used for a driver circuit (for example, a row driver) of the display device. When the driver circuit is formed using a process equivalent to that of the pixel circuit, IC chip mounting or the like becomes unnecessary; thus, a display device with a narrow bezel can be formed. That is, forming the semiconductor apparatus according to one embodiment of the present invention by using OS transistors together with the pixel circuit is effective in forming a display device with a narrow bezel.

Note that the semiconductor apparatus according to one embodiment of the present invention is not limited to the structure where all the transistors included in the pixel circuit and the driver circuit are formed using Si transistors or OS transistors. One of the pixel circuit and the driver circuit may be formed using a Si transistor, and the other of the pixel circuit and the driver circuit may be formed using an OS transistor. Alternatively, some of the transistors included in the pixel circuit and the driver circuit may be formed using one of a Si transistor and an OS transistor, and the other transistors may be formed using the other of the Si transistor and the OS transistor. The structure is determined as appropriate depending on the required function or the like of the display device.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

An OS transistor has features such that impact ionization, an avalanche breakdown, a short-channel effect, and the like do not occur, which are different from those of a Si transistor, and enables formation of a highly reliable circuit. Moreover, variation in electrical characteristics due to crystallinity unevenness, which is caused in Si transistors, is less likely to occur in OS transistors.

A semiconductor layer included in an OS transistor can be, for example, a film represented by an In—M—Zn-based oxide that contains indium, zinc, and M (a metal such as aluminum, titanium, gallium, germanium, yttrium, zirconium, lanthanum, cerium, tin, neodymium, or hafnium). The In—M—Zn-based oxide can be typically formed by a sputtering method. Alternatively, the In—M—Zn-based oxide can be formed by an ALD (Atomic layer deposition) method.

It is preferable that the atomic ratio of metal elements in a sputtering target used to form an In—M—Zn oxide by a sputtering method satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

An oxide semiconductor with low carrier concentration is used for the semiconductor layer. For example, for the semiconductor layer, an oxide semiconductor whose carrier concentration is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/cm$^3$, preferably lower than or equal to $2\times10^{17}$ atoms/cm$^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/cm$^3$, preferably lower than or equal to $2\times10^{16}$ atoms/cm$^3$.

Furthermore, when nitrogen is contained in the oxide semiconductor that constitutes the semiconductor layer, electrons serving as carriers are generated and the carrier concentration is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/cm$^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Moreover, the semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, will be described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment. Meanwhile, the CAC-OS relates to the material composition of an oxide semiconductor.

In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and a favorable switching operation can be achieved.

Accordingly, when the CAC-OS is used for a semiconductor device, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility (μ) can be achieved.

In addition, a semiconductor device using the CAC-OS has high reliability. Thus, the CAC-OS is suitable for a constituent material of a variety of semiconductor apparatuses.

Furthermore, although the semiconductor apparatus 20*a* and the semiconductor apparatus 20*b* use n-channel transistors as components, the semiconductor apparatus 20*a* and the semiconductor apparatus 20*b* may use p-channel transistors as components.

Figure 15:
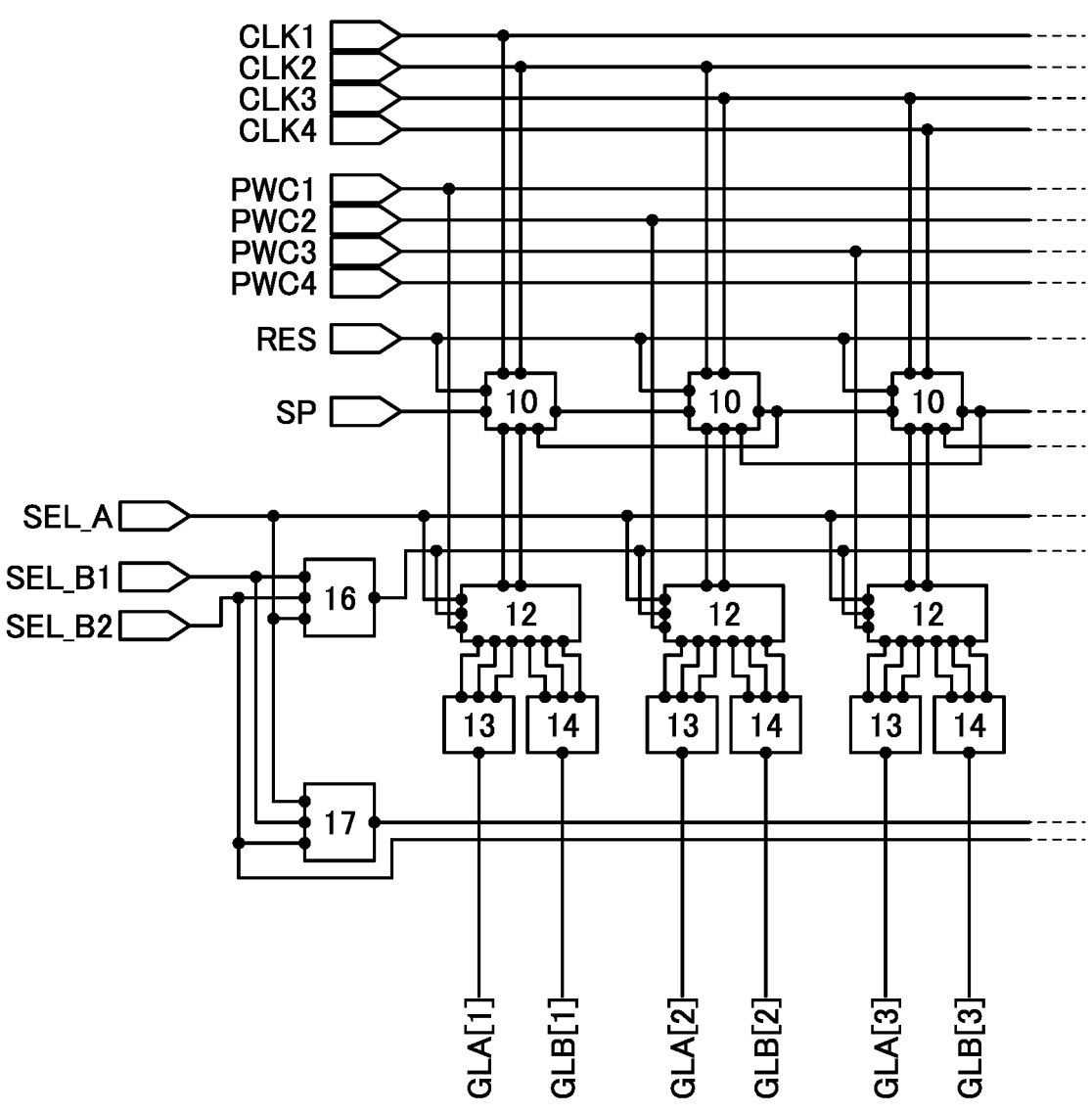
FIG. 15 is a diagram illustrating a semiconductor apparatus.

FIG. 15 is a block diagram of the semiconductor apparatus 20*c* using p-channel transistors as circuit components. Note that the connection structure of each component circuit is the same as that of the semiconductor apparatus 20*a* illustrated in FIG. 3 and FIG. 4, and FIG. 15 illustrates part of the connection structure of each component circuit. Note that the semiconductor apparatus 20*c* differs from the semiconductor apparatus 20*a* in the structures of the switch circuit 16 and the switch circuit 17 and signals input to the switch circuit 16 and the switch circuit 17, in addition to the structure where the p-channel transistors are used as the circuit components.

Figure 16A:
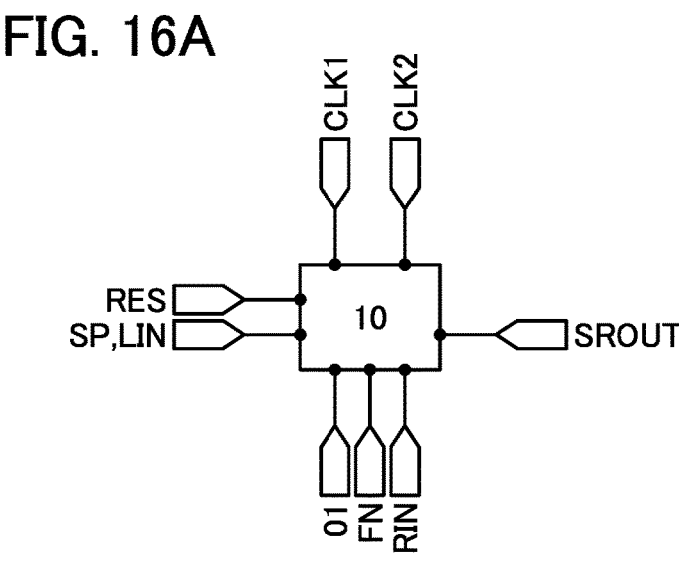
FIG. 16A and FIG. 16B are diagrams illustrating the flip-flop circuit.
Figure 16B:
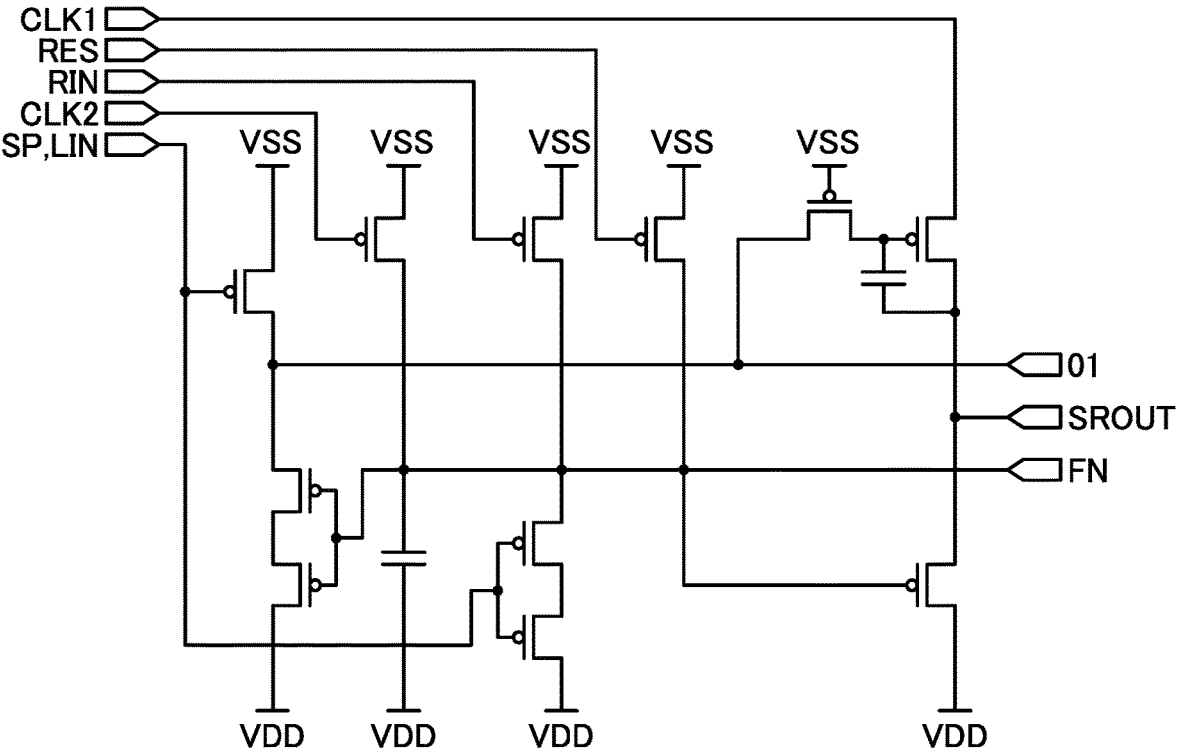

FIG. 16A illustrates a block diagram of the flip-flop circuit 10, and FIG. 16B shows an example of a circuit diagram of the flip-flop circuit 10 formed using p-channel transistors. FIG. 16B is referred to for the connection mode of transistors and capacitors included in the flip-flop circuit 10, and its description is omitted. In addition, the description on FIG. 5B can be referred to for the description of input signals and output signals. Note that power supply voltages that are inverted from the power supply voltages (VDD and VSS) illustrated in FIG. 5B are applied to the flip-flop circuit 10 illustrated in FIG. 16B.

Figure 17A:
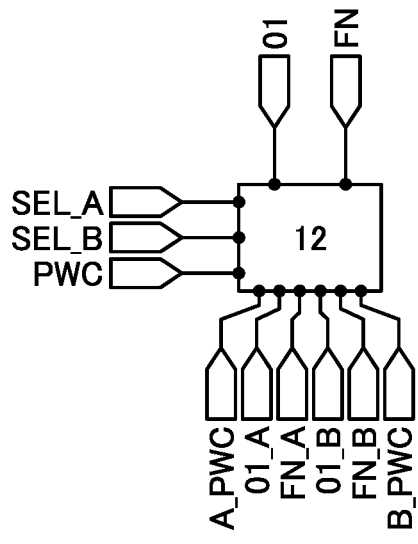
FIG. 17A and FIG. 17B are diagrams illustrating the switch circuit included in the output circuit.
Figure 17B:
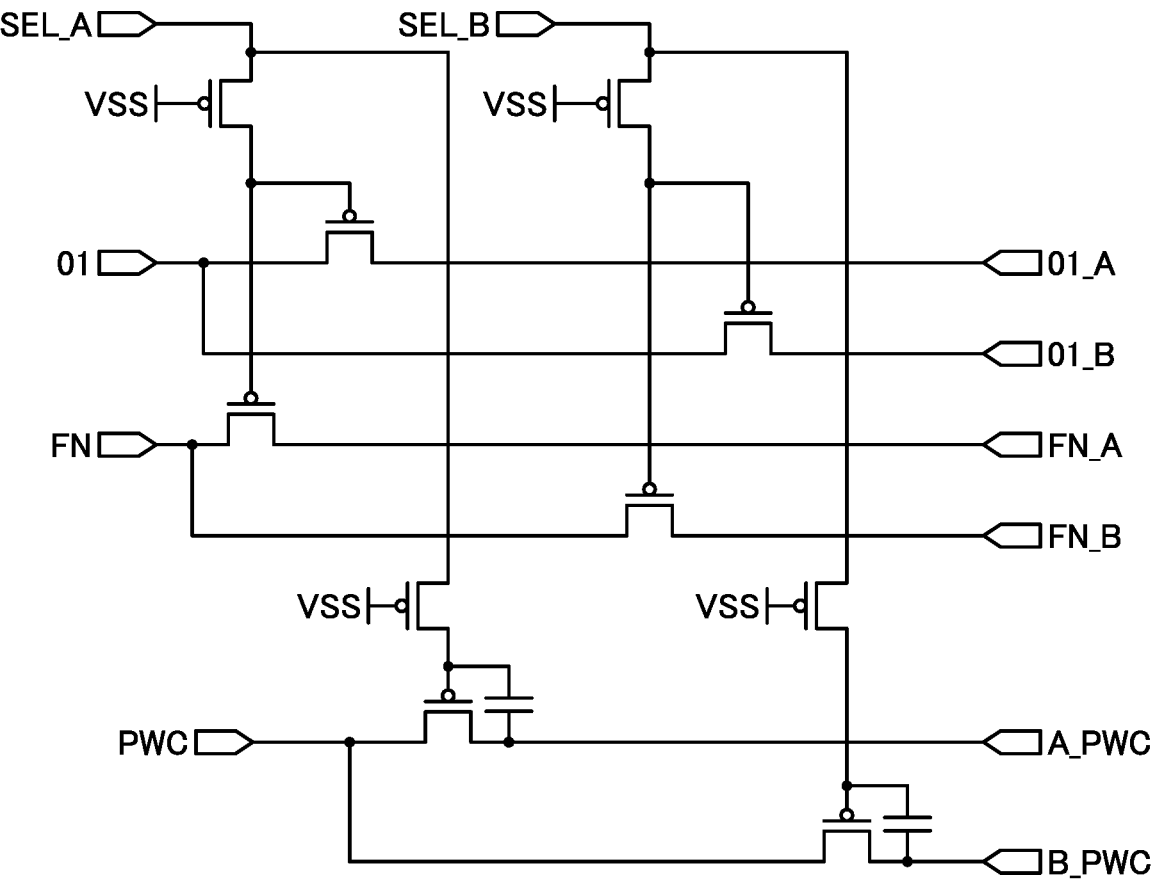

FIG. 17A illustrates a block diagram of the switch circuit 12, and FIG. 17B shows an example of a circuit diagram of the switch circuit 12 formed using p-channel transistors. FIG. 6B is referred to for the connection mode of transistors and capacitors included in the switch circuit 12, and its description is omitted. In addition, the description on FIG. 6B can be referred to for the description of input signals and output signals. Note that power supply voltages that are inverted from the power supply voltages (VDD and VSS) illustrated in FIG. 6B are applied to the switch circuit 12 illustrated in FIG. 17B.

Figures 18A, 18B:
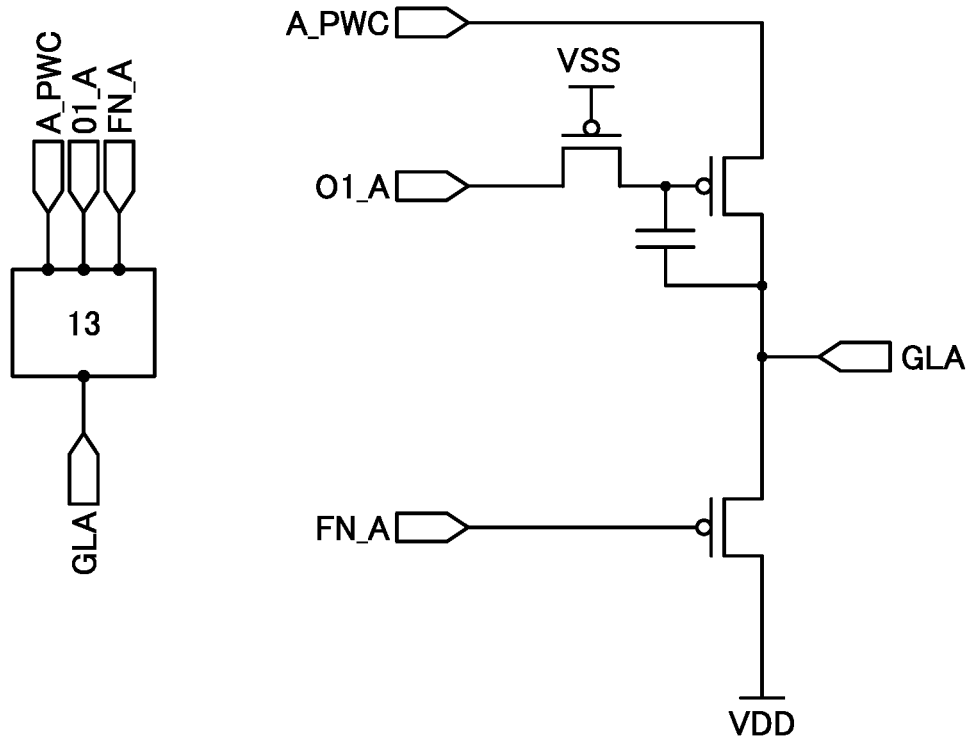
FIG. 18A to FIG. 18D are diagrams illustrating the circuits included in the output circuit.

FIG. 18A illustrates a block diagram of the circuit 13, and FIG. 18B shows an example of a circuit diagram of the circuit 13 formed using p-channel transistors. FIG. 7B is referred to for the connection mode of transistors and a capacitor included in the circuit 13, and its description is omitted. In addition, the description on FIG. 7B can be referred to for the description of input signals and output signals. Note that power supply voltages that are inverted from the power supply voltages (VDD and VSS) illustrated in FIG. 7B are applied to the circuit 13 illustrated in FIG. 18B.

Figures 18C, 18D:
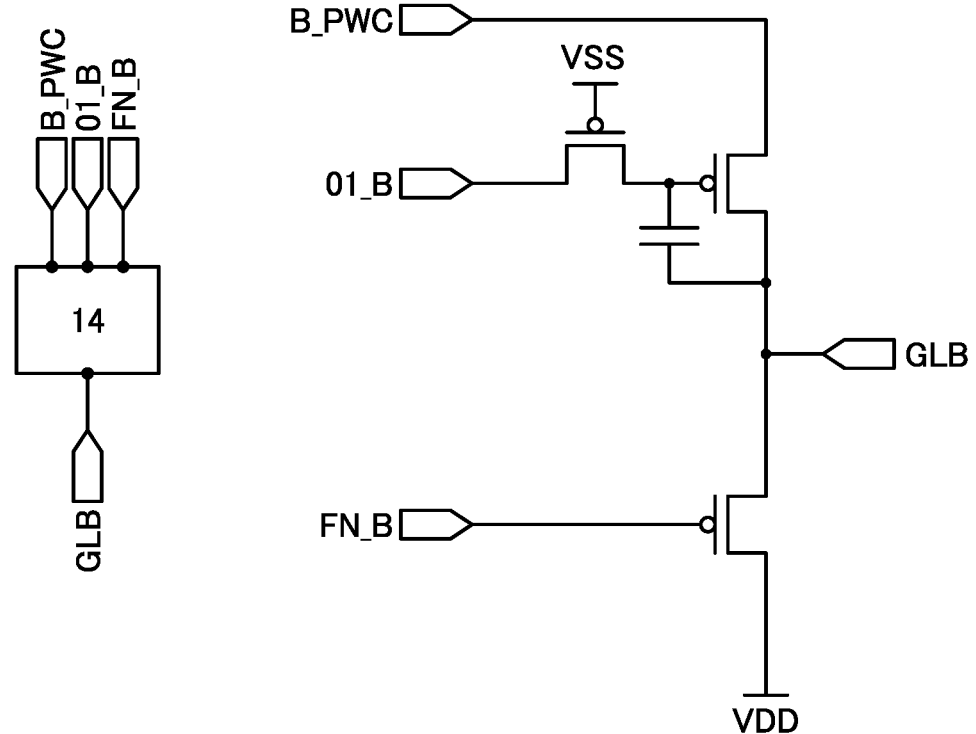

FIG. 18C illustrates a block diagram of the circuit 14, and FIG. 18D shows an example of a circuit diagram of the circuit 14 formed using p-channel transistors. FIG. 18D is referred to for the connection mode of transistors and a capacitor included in the circuit 14, and its description is omitted. In addition, the description on FIG. 7D can be referred to for the description of input signals and output signals. Note that power supply voltages that are inverted from the power supply voltages (VDD and VSS) illustrated in FIG. 7D are applied to the circuit 14 illustrated in FIG. 18D.

Figure 19A:
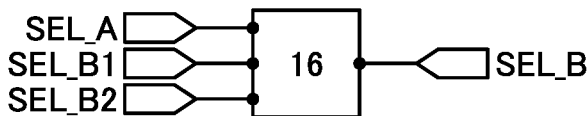
FIG. 19A to FIG. 19D are diagrams illustrating the switch circuits.
Figure 19B:
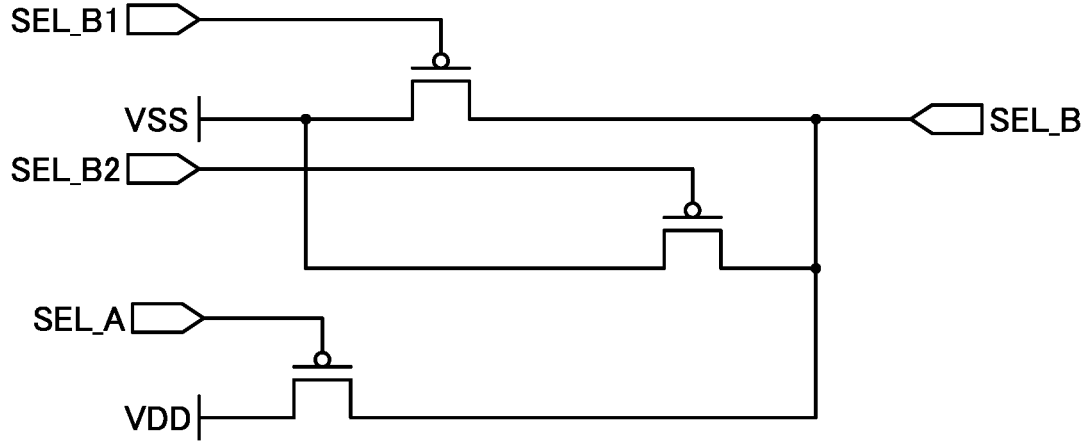

FIG. 19A illustrates a block diagram of the switch circuit 16, and FIG. 19B shows an example of a circuit diagram of the switch circuit 16 formed using p-channel transistors. FIG. 19B is referred to for the connection mode of transistors included in the switch circuit 16, and its description is omitted.

Input signals are the selection signal SEL_A, the selection signal SEL_B1, and the selection signal SEL_B2. When the selection signal SEL_B1 or the selection signal SEL_B2 is input, the signal potential SEL_B is generated. The signal potential SEL_B is input to the switch circuit 12. When the selection signal SEL_B is input to the switch circuit 12, the output of signal potentials from the circuit 14 to the outside can be activated. When the selection signal SEL_A is input, the effective signal potential SEL_B is not generated.

Figure 19C:
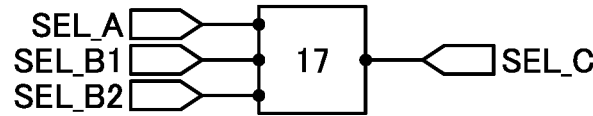
Figure 19D:
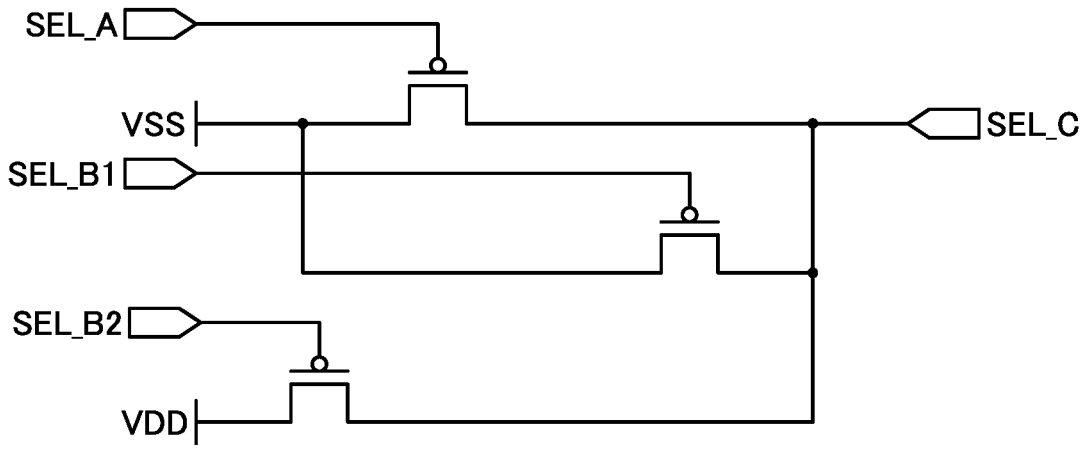

FIG. 19C illustrates a block diagram of the switch circuit 17, and FIG. 19D shows an example of a circuit diagram of the switch circuit 17 formed using p-channel transistors. FIG. 19D is referred to for the connection mode of transistors included in the switch circuit 17, and its description is omitted.

Input signals are the selection signal SEL_A, the selection signal SEL_B1, and the selection signal SEL_B2. When the selection signal SEL_B1 or the selection signal SEL_B2 is input, the signal potential SEL_C is generated. The signal potential SEL_C is input to the switch circuit 18 and the switch circuit 19 to be described later. When the selection signal SEL_A is input, the effective signal potential SEL_B is not generated.

Figure 20A:
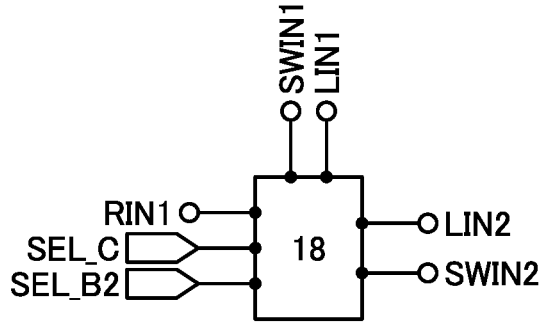
FIG. 20A and FIG. 20B are diagrams illustrating the switch circuit.
Figure 20B:
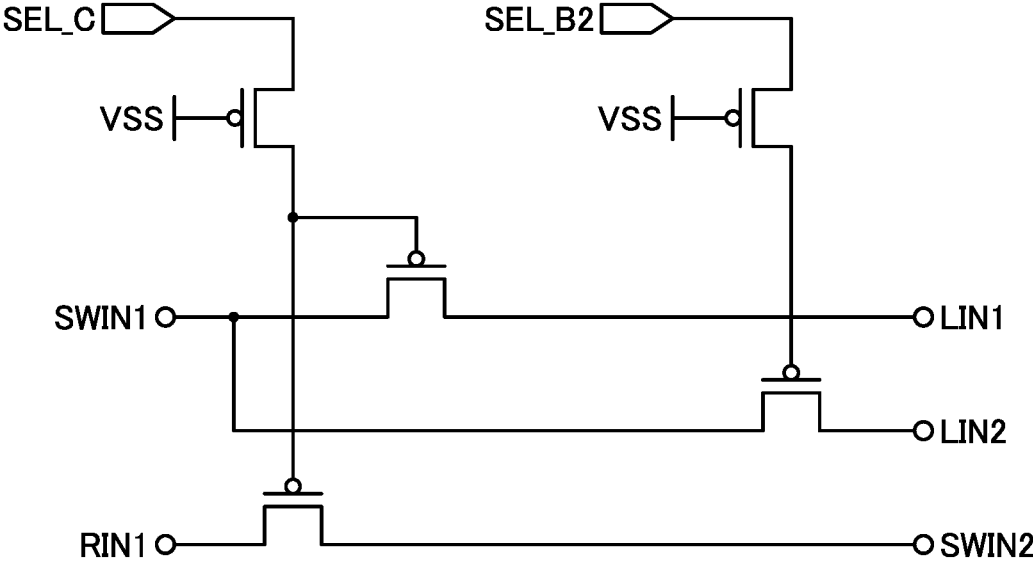

FIG. 20A illustrates a block diagram of the switch circuit 18, and FIG. 20B shows an example of a circuit diagram of the switch circuit 18 formed using p-channel transistors. FIG. 20B is referred to for the connection mode of transistors included in the switch circuit 18, and its description is omitted. In addition, the description on FIG. 9B can be referred to for the description of input signals and output signals. Note that power supply voltages that are inverted from the power supply voltages (VDD and VSS) illustrated in FIG. 9B are applied to the circuit 14 illustrated in FIG. 20B.

Figure 21A:
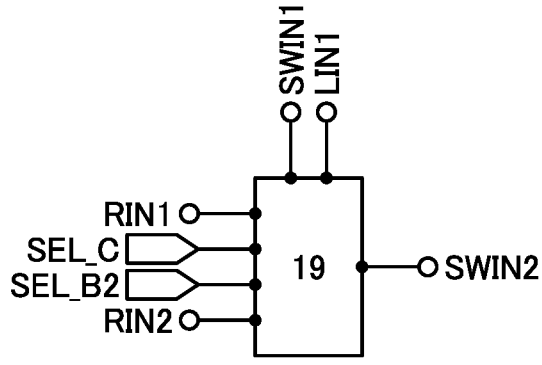
FIG. 21A and FIG. 21B are diagrams illustrating the switch circuit.
Figure 21B:
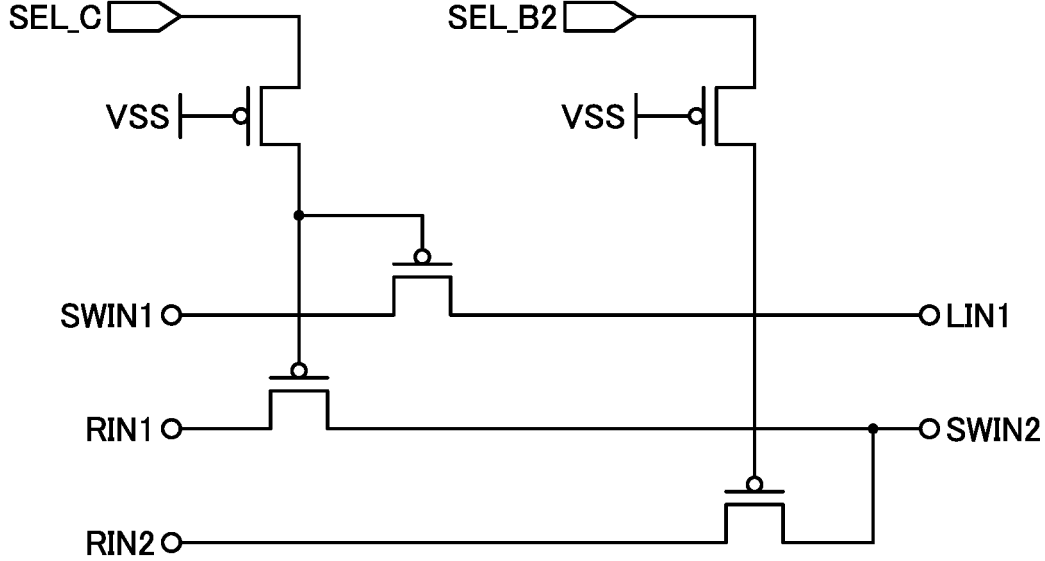

FIG. 21A illustrates a block diagram of the switch circuit 19, and FIG. 21B shows an example of a circuit diagram of the switch circuit 19 formed using p-channel transistors. FIG. 21B is referred to for the connection mode of transistors included in the switch circuit 19, and its description is omitted. In addition, the description on FIG. 10B can be referred to for the description of input signals and output signals. Note that power supply voltages that are inverted from the power supply voltages (VDD and VSS) illustrated in FIG. 10B are applied to the circuit 14 illustrated in FIG. 21B.

Note that in the above description, the example where one path is provided for outputting the signal potentials from each of the circuit 13 and the circuit 14 is shown. However, by increasing the number of control signals PWC input to the switch circuit 12, the circuit 13, and the circuit 14, the signal potentials can be output through two or more paths at different timings.

Figure 22:
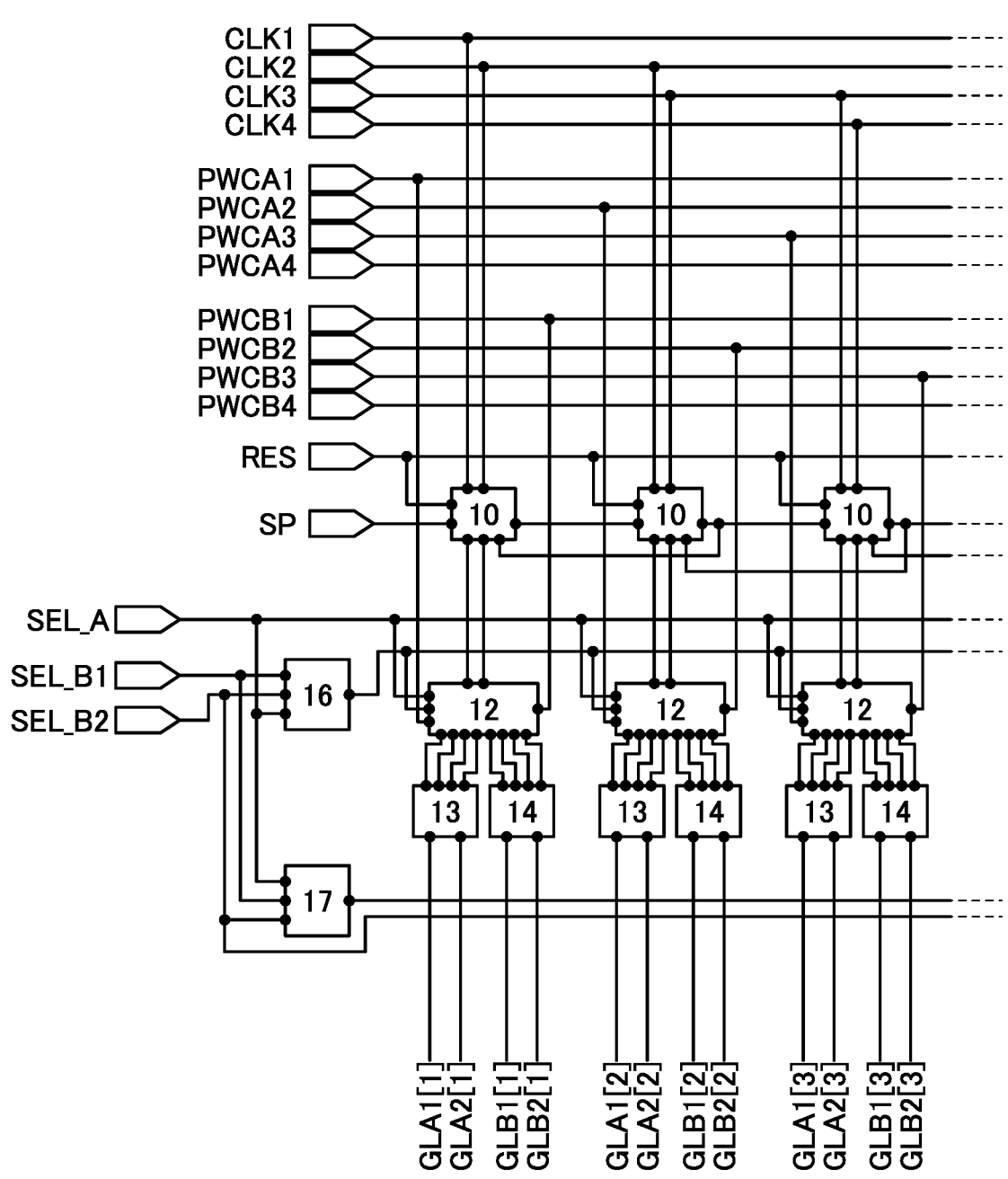
FIG. 22 is a diagram illustrating a semiconductor apparatus.

FIG. 22 is a block diagram of a semiconductor apparatus 20*d* that shows an example where two paths are provided for outputting the signal potentials from each of the circuit 13 and the circuit 14. The signal potential GLA1 and the signal potential GLA2 can be output from the circuit 13 at different timings. In addition, the signal potential GLB1 and the signal potential GLB2 can be output from the circuit 14 at different timings.

The semiconductor apparatus 20*d* differs from the semiconductor apparatus 20*c* illustrated in FIG. 5 in that input signals are increased from the pulse width control signal PWC to the pulse width control signals PWCA (PWCA1 to PWCA4) and the pulse width control signals PWCB (PWCB1 to PWCB4). In addition, the semiconductor apparatus 20*d* differs from the semiconductor apparatus 20*c* in the structures of the switch circuit 12, the circuit 13, and the circuit 14. Note that the structures of the flip-flop circuit 10, the switch circuits 16 and 17, and the switch circuits 18 and 19 (not illustrated) included in the semiconductor apparatus and connection structures of these components can be the same as those of the semiconductor apparatus 20*c*.

Figure 23A:
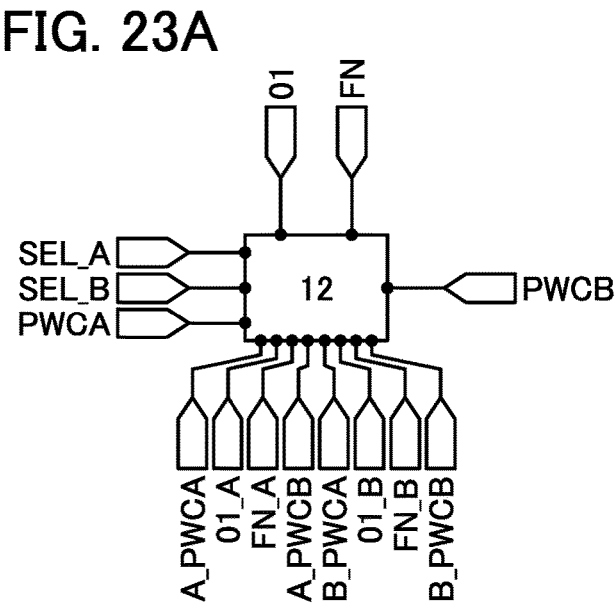
FIG. 23A and FIG. 23B are diagrams illustrating the switch circuit included in the output circuit.
Figure 23B:
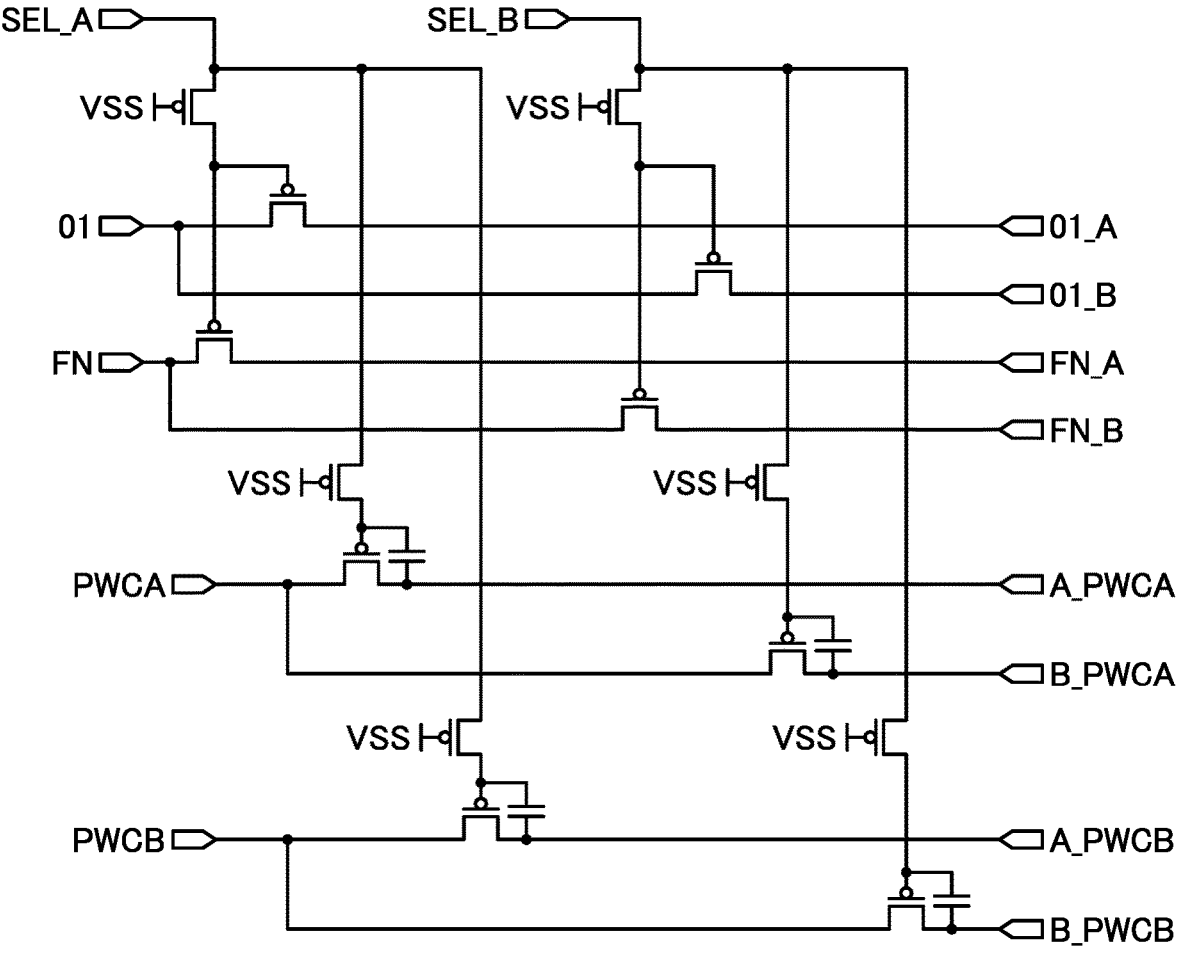

FIG. 23A illustrates a block diagram of the switch circuit 12 included in the semiconductor apparatus 20*d*, and FIG. 23B shows an example of a circuit diagram of the switch circuit 12 formed using p-channel transistors. FIG. 23B is referred to for the connection mode of transistors and capacitors included in the switch circuit 12, and its description is omitted. In addition, the description on FIG. 12B can be referred to for the description of input signals and output signals. Note that power supply voltages that are inverted from the power supply voltages (VDD and VSS) illustrated in FIG. 12B are applied to the switch circuit 12 illustrated in FIG. 23B.

Figure 24A:
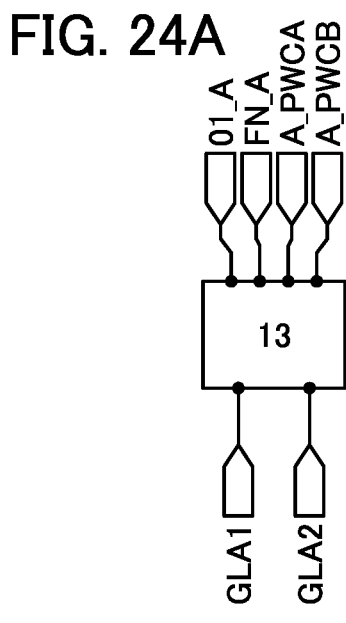
FIG. 24A and FIG. 24B are diagrams illustrating the circuit included in the output circuit.
Figure 24B:
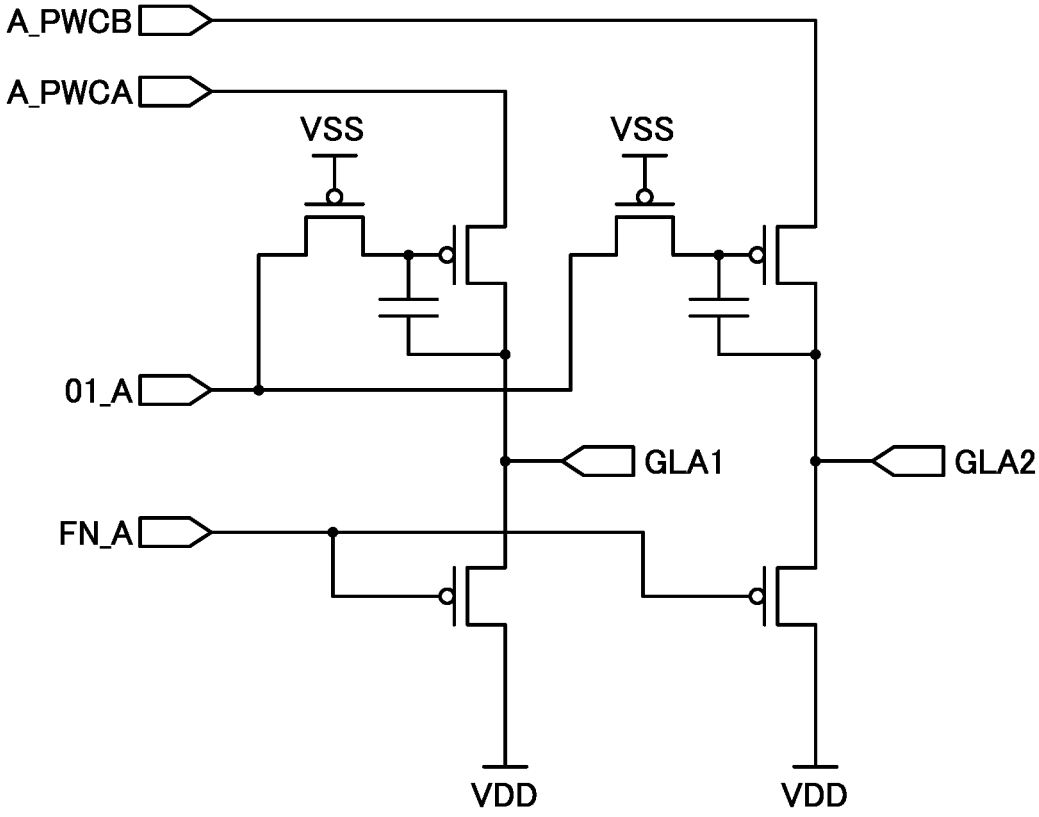

FIG. 24A illustrates a block diagram of the circuit 13 included in the semiconductor apparatus 20*d*, and FIG. 24B shows an example of a circuit diagram of the circuit 13 formed using p-channel transistors. FIG. 24B is referred to for the connection mode of transistors and a capacitor included in the circuit 13, and its description is omitted. In addition, the description on FIG. 13B can be referred to for the description of input signals and output signals. Note that power supply voltages that are inverted from the power supply voltages (VDD and VSS) illustrated in FIG. 13B are applied to the circuit 13 illustrated in FIG. 23B.

Figure 25A:
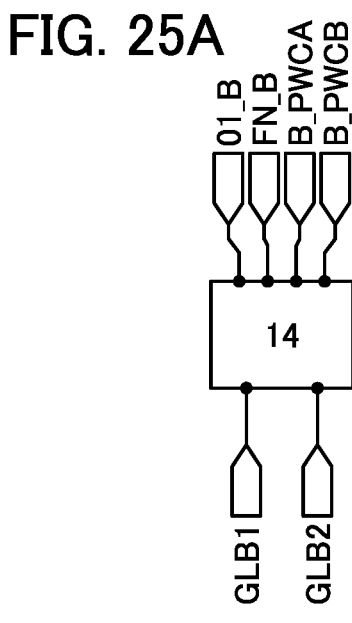
FIG. 25A and FIG. 25B are diagrams illustrating the circuit included in the output circuit.
Figure 25B:
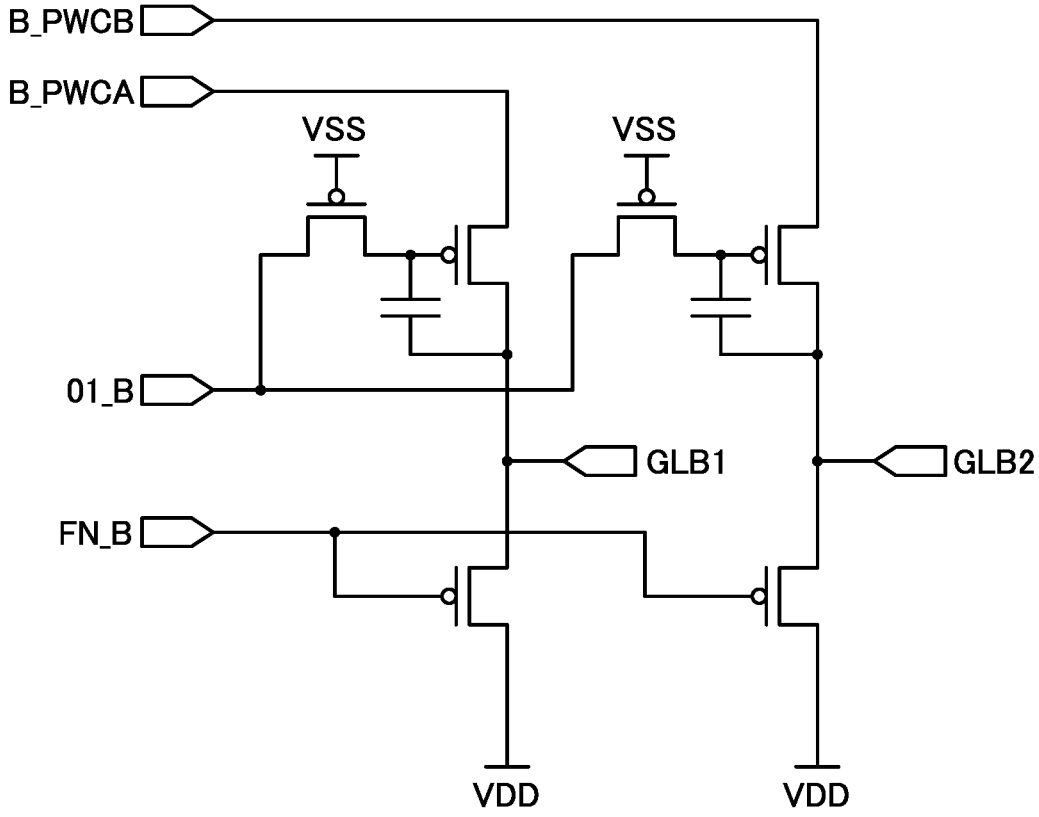

FIG. 25A illustrates a block diagram of the circuit 14 included in the semiconductor apparatus 20*d*, and FIG. 25B shows an example of a circuit diagram of the circuit 14 formed using p-channel transistors. FIG. 25B is referred to for the connection mode of transistors and a capacitor included in the circuit 14, and its description is omitted. In addition, the description on FIG. 14B can be referred to for the description of input signals and output signals. Note that power supply voltages that are inverted from the power supply voltages (VDD and VSS) illustrated in FIG. 14B are applied to the circuit 14 illustrated in FIG. 23B.

Note that Si transistors are preferably used as the p-channel transistors. In particular, it is preferable to use polycrystalline silicon or single crystal silicon that can form transistors with high mobility even when the transistors are the p-channel transistors.

Note that the semiconductor apparatus according to one embodiment of the present invention is not limited to the structure where all the transistors included in the pixel circuit and the driver circuit are formed using Si transistors. The driver circuit may be formed using a Si transistor, and the pixel circuit may be formed using an OS transistor. Alternatively, some of the transistors included in the pixel circuit and the driver circuit may be formed using one of a Si transistor and an OS transistor, and the other transistors may be formed using the other of the Si transistor and the OS transistor. The structure is determined as appropriate depending on the required function or the like of the display device.

At least part of this embodiment can be implemented in combination with the other embodiment described in this specification as appropriate.

Embodiment 2

In this embodiment, an example of a display device to which the semiconductor apparatus described in Embodiment 1 can be applied is described.

Figure 26:
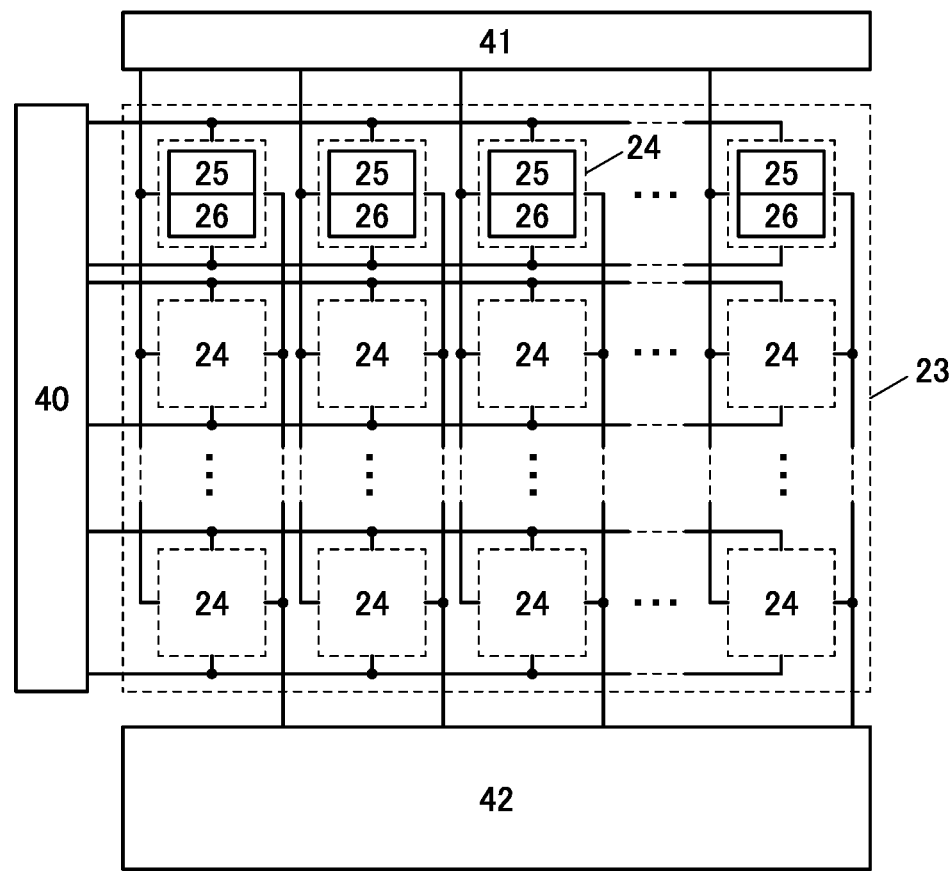
FIG. 26 is a diagram illustrating a display device.

FIG. 26 is a diagram illustrating a display device according to one embodiment of the present invention. The display device includes the pixel array 23 including the pixels 24 arranged in a column direction and a row direction, a circuit 40, a circuit 41, and a circuit 42. Note that wirings for connecting each block illustrated in FIG. 26 are simplified, and the number of such wirings is sometimes different from the actual number of wirings.

The pixels 24 each include the circuit 25 and the circuit 26. The circuit 25 has a function of emitting light for display. The circuit 26 has a function of detecting light. Note that the circuit 25 and the circuit 26 can be also referred to as subpixels.

The circuit 25 includes a light-emitting device (also referred to as a light-emitting element) that emits visible light. As the light-emitting device, an EL element such as an OLED (Organic Light Emitting Diode) or a QLED (Quantum-dot Light Emitting Diode) is preferably used. As a light-emitting substance included in the EL element, a substance that emits fluorescence (a fluorescent material), a substance that emits phosphorescence (a phosphorescent material), an inorganic compound (a quantum dot material or the like), a substance that exhibits thermally activated delayed fluorescence (a Thermally Activated Delayed Fluorescence (TADF) material), and the like can be given. In addition, an LED (Light Emitting Diode) such as a micro-LED can be used as the light-emitting device.

The circuit 26 includes a light-receiving device (also referred to as a light-receiving element). For example, a pn or pin photodiode can be used as the light-receiving device. A photoelectric conversion element that detects incident light and generates electric charge can be used as the light-receiving device. The amount of electric charge generated in the light-receiving device is determined depending on the amount of incident light.

It is preferable to use an organic photodiode including an organic compound in a photoelectric conversion layer as the light-receiving device. An organic photodiode is easily made thin and lightweight and easily has a large area. In addition, an organic photodiode can be applied to a variety of display devices because of its high flexibility in shape and design. Alternatively, a photodiode using amorphous silicon, crystalline silicon (single crystal silicon, polycrystalline silicon, microcrystalline silicon, or the like), a metal oxide, or the like can be used as the light-receiving device.

In the case where an organic compound is used in a photoelectric conversion layer of a photodiode, selecting an appropriate material can make the photodiode have sensitivity to light ranging from ultraviolet light to infrared light. In the case where amorphous silicon is used in the photoelectric conversion layer, the photodiode mainly has sensitivity to visible light. In the case where crystalline silicon is used in the photoelectric conversion layer, the photodiode has sensitivity to light ranging from visible light to infrared light. Since a metal oxide has a wide energy gap, in the case where a metal oxide is used in the photoelectric conversion layer, the photodiode mainly has high sensitivity to light having higher energy than visible light. Note that the In—M—Zn-based oxide or the like described in Embodiment 1 can be used as the metal oxide, for example.

In one embodiment of the present invention, an organic EL element is used as the light-emitting device, and an organic photodiode is used as the light-receiving device. A large number of layers in the organic photodiode can have structures in common with the organic EL element. Accordingly, the light-receiving device can be incorporated in the display device without a significant increase in the number of manufacturing steps. For example, the photoelectric conversion layer of the light-receiving device and the light-emitting layer of the light-emitting device may be separately formed, and the other layers may have the same structure for the light-emitting device and the light-receiving device.

The circuit 40 is a row driver (a gate driver) for driving the circuit 25 and the circuit 26. For the circuit 40, the semiconductor apparatus 20a, the semiconductor apparatus 20b, the semiconductor apparatus 20c, or the semiconductor apparatus 20d described in Embodiment 1 can be used.

The circuit 41 is a column driver (a source driver) for supplying image data or the like to the circuit 25. A shift register circuit, a decoder circuit, or the like can be used as the circuit 41, for example.

The circuit 42 is a read circuit for data output from the circuit 26. The circuit 42 includes, for example, an A/D converter circuit and has a function of converting analog data output from the circuit 26 into digital data. In addition, the circuit 42 may include a CDS circuit that performs correlated double sampling processing on the data output from the circuit 26. Furthermore, a selection circuit (a multiplexer circuit) may be included between the CDS circuit and the A/D converter circuit. Moreover, a column driver that outputs digital data to the outside may be included.

The circuit 26 can have a function of an input interface. The circuit 26 includes a light-receiving device and is capable of reading positional information or the like on an object that comes close to the display device from changes in the amount of light reaching the pixel array 23. Thus, operations equivalent to those of a touch panel can be performed without contact. In addition, an operation of a pointer or the like can be performed without contact.

In addition, captured image data may be acquired by the circuit 26 when an object is made to be in contact with the display device. When the object is made to be in contact with the display device, high-resolution captured image data on a fingerprint, a palm print, or the like can be acquired. That is, a biological authentication function can be added to the display device. Note that the display device according to one embodiment of the present invention can obtain the captured image data when the circuit 26 receives light that is emitted from the circuit 25 and reflected by the object. At this time, the light emitted from the circuit 25 is preferably green light or white light.

FIG. 27A illustrates an example of a pixel circuit PIX1 that is applicable to the circuit 25. The pixel circuit PIX1 includes a light-emitting device EL, a transistor M1, a transistor M2, a transistor M3, and a capacitor C1. Here, an example in which a light-emitting diode is used as the light-emitting device EL is illustrated. An organic EL element that emits visible light is preferably used as light-emitting device EL.

A gate of the transistor M1 is electrically connected to a wiring G1, one of a source and a drain of the transistor M1 is electrically connected to a wiring Si, and the other of the source and the drain of the transistor M1 is electrically connected to one electrode of the capacitor C1 and a gate of the transistor M2. One of a source and a drain of the transistor M2 is electrically connected to a wiring V2, and the other of the source and the drain of the transistor M2 is electrically connected to an anode of the light-emitting device EL and one of a source and a drain of the transistor M3. A gate of the transistor M3 is electrically connected to a wiring G2, and the other of the source and the drain of the transistor M3 is electrically connected to a wiring V0. A cathode of the light-emitting device EL is electrically connected to a wiring V1.

A constant potential is supplied to each of the wiring V1 and the wiring V2. Light emission can be performed when the anode side of the light-emitting device EL is set to a high potential and the cathode side of the light-emitting device EL is set to a low potential. The transistor M1 is controlled by a signal supplied to the wiring G1 and functions as a selection transistor for controlling the selection state of the pixel circuit PIX1. In addition, the transistor M2 functions as a driving transistor that controls current flowing through the light-emitting device EL in accordance with a potential supplied to the gate.

When the transistor M1 is in a conduction state, a potential supplied to the wiring S1 is supplied to the gate of the transistor M2, and the emission luminance of the light-emitting device EL can be controlled in accordance with the potential. The transistor M3 is controlled by a signal supplied to the wiring G2. A potential between the transistor M3 and the light-emitting device EL can be reset to a constant potential supplied from the wiring V0; thus, a potential can be written to the gate of the transistor M2 in a state where the source potential of the transistor M2 is stabilized.

FIG. 27B illustrates an example of a pixel circuit PIX2 that is applicable to the circuit 25. The pixel circuit PIX2 has a voltage boosting function. The pixel circuit PIX2 includes the light-emitting device EL, a transistor M4, a transistor M5, a transistor M6, a transistor M7, a capacitor C2, and a capacitor C3.

A gate of the transistor M4 is electrically connected to the wiring G1, one of a source and a drain of the transistor M4 is electrically connected to the wiring S1, and the other of the source and the drain of the transistor M4 is electrically connected to one electrode of the capacitor C2, one electrode of the capacitor C3, and a gate of the transistor M7. A gate of the transistor M5 is electrically connected to the wiring G2, one of a source and a drain of the transistor M5 is electrically connected to a wiring VRW, and the other of the source and the drain of the transistor M5 is electrically connected to the other electrode of the capacitor C2 and one of a source and a drain of the transistor M6.

A gate of the transistor M6 is electrically connected to the wiring G1, and the other of the source and the drain of the transistor M6 is electrically connected to the other electrode of the capacitor C3, one of a source and a drain of the transistor M7, and the anode of the light-emitting device EL. The other of the source and the drain of the transistor M7 is electrically connected to the wiring V2.

The transistor M4 and the transistor M6 are controlled by a signal supplied to the wiring G1, and the transistor M5 is controlled by a signal supplied to the wiring G2. The transistor M7 functions as a driving transistor that controls current flowing through the light-emitting device EL in accordance with a potential supplied to the gate.

When the transistor M5 and the transistor M6 are brought into conduction, a potential between the transistor M7 and the light-emitting device EL can be reset to a constant potential (for example, a reset potential VRES) that is supplied from the wiring VRW. Accordingly, the potential of the wiring Si can be written to the gate of the transistor M7 while the source potential of the transistor M7 is stabilized. In addition, when the reset potential VRES is set to the same potential as the potential of the wiring V1 or a potential lower than the potential of the wiring V1, light emission of the light-emitting device EL can be inhibited.

In the pixel circuit PIX2, the emission intensity of the light-emitting device EL can be increased. The voltage boosting function of the pixel circuit PIX2 is described using a timing chart shown in FIG. 27C. Note that a node to which the gate of the transistor M7 is connected is referred to as a node ND.

First, when the potentials of the wiring G1 and the wiring G2 are each set to "H" (a high potential), the transistor M4 is brought into conduction, and a potential D1 of the wiring S1 is supplied to the node ND. In addition, the transistor M5 and the transistor M6 are brought into conduction, and the reset potential VRES is supplied to the other electrode of the capacitor C2.

Next, when the potential of the wiring G1 is set to "L" (a low potential), the transistor M4 and the transistor M6 are brought out of conduction, and the node ND is set in a floating state. At this time, the potential D1-VRES is retained in the capacitor C2.

Then, when the potential of the wiring VRW is changed from the reset potential VRES to a potential VW for voltage boosting, the amount of change in the potential of the other electrode of the capacitor C2 (VW-VRES) is added to the potential of the node ND by capacitive coupling.

Note that the actual increase in the potential of the node ND becomes $(C_2/(C_{ND}+C_2))\times(VW-VRES)$ in accordance with the ratio between the capacitance of the node ND and the capacitance of the capacitor C2. Here, $C_{ND}$ represents the capacitance of the node ND, and $C_2$ represents the capacitance of the capacitor C2. When $C_2$ is sufficiently large, $(C_2/(C_{ND}+C_2))$ approximates 1. In addition, when the reset potential VRES equals 0, the increase in the potential of the node ND becomes VW. Accordingly, the voltage of the node ND has been boosted from the potential D1 to the potential D1+VW.

When the potential of the node ND has been subjected to voltage boosting, a larger amount of current can flow through the light-emitting device EL, so that emission luminance can be increased. In the case where an object to be subjected to imaging is made in contact with the display device, a dark portion is reduced by the increase in the emission luminance; thus, more detailed captured image data can be obtained. In addition, when the pixel has a voltage boosting function, it becomes unnecessary to supply high voltage from the source driver, so that power consumption can be also reduced. Moreover, a high-power source driver also becomes unnecessary, so that manufacturing cost can be reduced.

FIG. 27D illustrates an example of a pixel circuit PIX3 that is applicable to the circuit 26. The pixel circuit PIX3 includes a light-receiving device PD, a transistor M9, a transistor M10, a transistor M11, a transistor M12, and a capacitor C4. Here, an example in which a photodiode is used as the light-receiving device PD is illustrated.

A cathode of the light-receiving device PD is electrically connected to the wiring V1, and an anode of the light-receiving device PD is electrically connected to one of a source and a drain of the transistor M9. A gate of the transistor M9 is electrically connected to a wiring G4, and the other of the source and the drain of the transistor M9 is electrically connected to one electrode of the capacitor C4, one of a source and a drain of the transistor M10, and a gate of the transistor M11. A gate of the transistor M10 is electrically connected to a wiring G5, and the other of the source and the drain of the transistor M10 is electrically connected to a wiring V4. One of a source and a drain of the transistor M11 is electrically connected to a wiring V3, and the other of the source and the drain of the transistor M11 is electrically connected to one of a source and a drain of the transistor M12. A gate of the transistor M12 is electrically connected to a wiring G6, and the other of the source and the drain of the transistor M12 is electrically connected to a wiring OUT.

A constant potential is supplied to each of the wiring V1, the wiring V3, and the wiring V4. When the light-receiving device PD is driven with a reverse bias, a potential that is lower than the potential of the wiring V1 is supplied to the wiring V4. The transistor M10 is controlled by a signal supplied to the wiring G5 and has a function of resetting the potential of a node (an electric charge read portion) connected to the gate of the transistor M11 to a potential to be supplied to the wiring V4. The transistor M9 is controlled by a signal to be supplied to the wiring G4 and has a function of controlling the timing at which the potential of the node changes, in accordance with the amount of current accumulated in the light-receiving device PD. The transistor M11 functions as an amplifier transistor for outputting a signal corresponding to the potential of the node. The transistor M12 is controlled by a signal supplied to the wiring G6 and functions as a selection transistor for reading an output corresponding to the potential of the node by an external circuit connected to the wiring OUT.

Here, an OS transistor is preferably applied to each of the transistors include in the pixel circuits PIX1 to PIX3. An OS transistor can achieve extremely low off-state current. Owing to low off-state current characteristics of the OS transistor, electric charge accumulated in a capacitor that is connected in series with the transistor can be retained for a long time.

It is particularly preferable to use OS transistors as the transistor M1, the transistor M4, the transistor M5, the transistor M6, the transistor M9, and the transistor M10, in each of which a current path is connected in series with the capacitor C1, the capacitor C2, or the capacitor C3. With the use of the OS transistors in the circuit 26, electric charge can be retained for a long time; thus, a global shutter system in which all the pixels perform an operation of accumulating electric charge at the same time can be employed without complicated circuit structures and driving methods. Moreover, the use of the OS transistors as the other transistors can reduce the manufacturing cost.

Alternatively, it is possible to use a Si transistor as each of the transistors included in the pixel circuits PIX1 to PIX3. In particular, the use of silicon with high crystallinity, such as single crystal silicon or polycrystalline silicon, is preferable because high field-effect mobility is achieved and a higher-speed operation is possible.

Alternatively, a structure may be used in which an OS transistor is used as one or more of the transistors included in the pixel circuits PIX1 to PIX3 and Si transistors are used as the other transistors.

Note that in the case where an OS transistor is used, each transistor may be provided with a back gate, as illustrated in FIG. 27E. Supplying the same potential to the back gate and a front gate can increase on-state current. In addition, supplying an appropriate constant potential to the back gate can adjust the threshold voltage of the transistor. Note that the structure where each transistor is provided with a back gate is also applicable to FIG. 27A to FIG. 27D. Alternatively, such a structure is also applicable to the semiconductor apparatus in Embodiment 1 where the OS transistor can be used.

Note that although FIG. 27A to FIG. 27E each illustrate an example in which n-channel transistors are used, p-channel transistors can also be used.

Next, a connection mode between the circuit 40 and the pixel 24 (the circuit 25 and the circuit 26), and operations of these circuits are described. As described above, the semiconductor apparatuses 20a to 20d described in Embodiment 1 can be used for the circuit 40. An example in which the semiconductor apparatus 20b is used for the circuit 40 is shown here.

Figure 28:
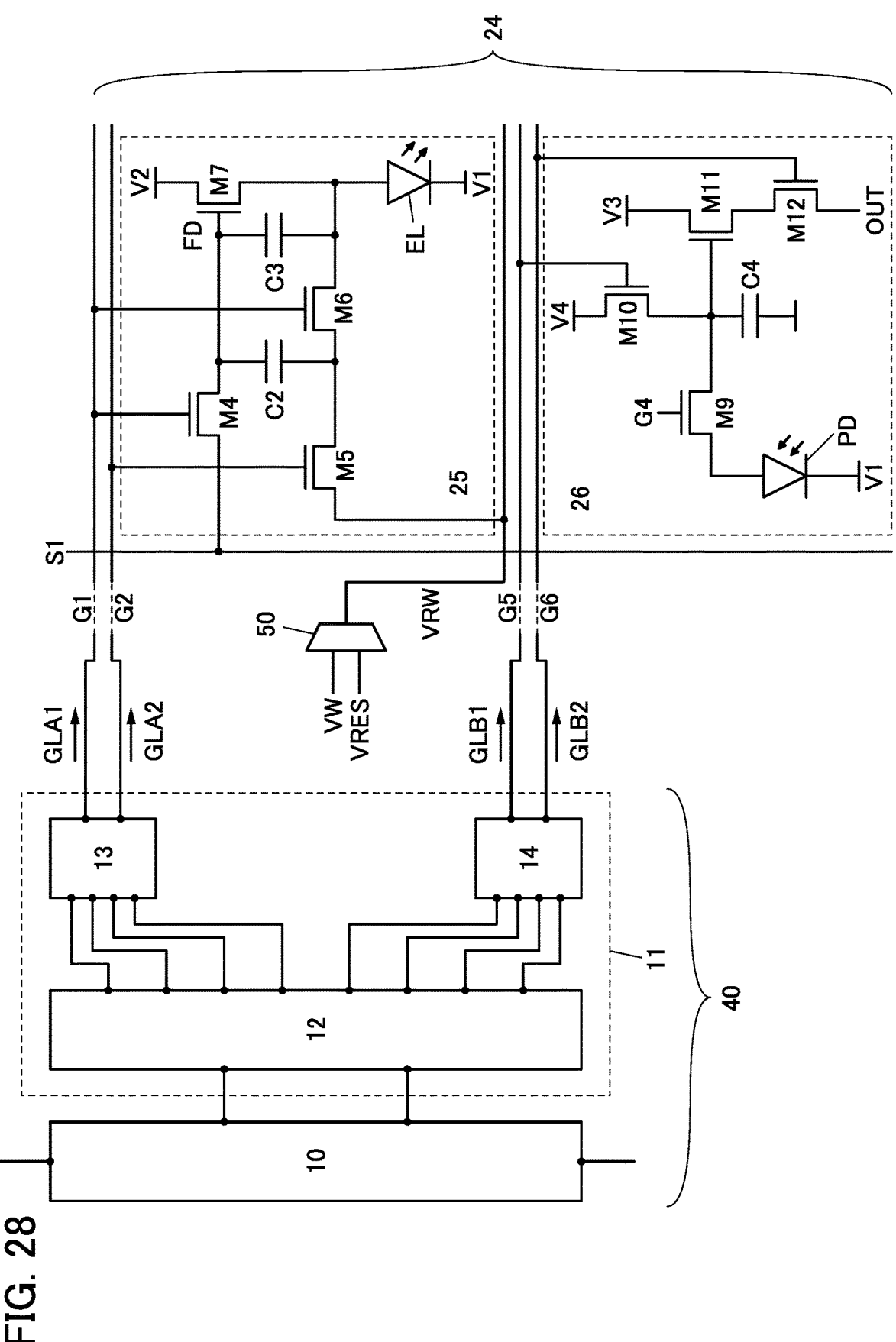
FIG. 28 is a diagram illustrating a connection mode of circuits included in the display device.

FIG. 28 illustrates a connection mode between part of the circuit 40 (the flip-flop circuit 10 for one stage and the output circuit 11 (the switch circuit 12, the circuit 13, and the circuit 14)), and the circuit 25 and the circuit 26 that are included in the pixel 24. Note that the pixel circuit PIX2 illustrated in FIG. 27B is used as the circuit 25, and the pixel circuit PIX3 illustrated in FIG. 27C is used as the circuit 26.

Note that FIG. 28 illustrates a structure in which one circuit 25 and one circuit 26 are provided in the pixel 24. In the case where display and captured image data follow grayscales, the structure can be used. In the case where color display is performed, at least the circuit 25 that emits three primary colors of light is needed. Therefore, as illustrated in FIG. 29A, the pixel 24 can use a structure where a circuit 25(R) for emitting red light, a circuit 25(G) for emitting green light, and a circuit 25(B) for emitting blue light are provided.

Figure 29A:
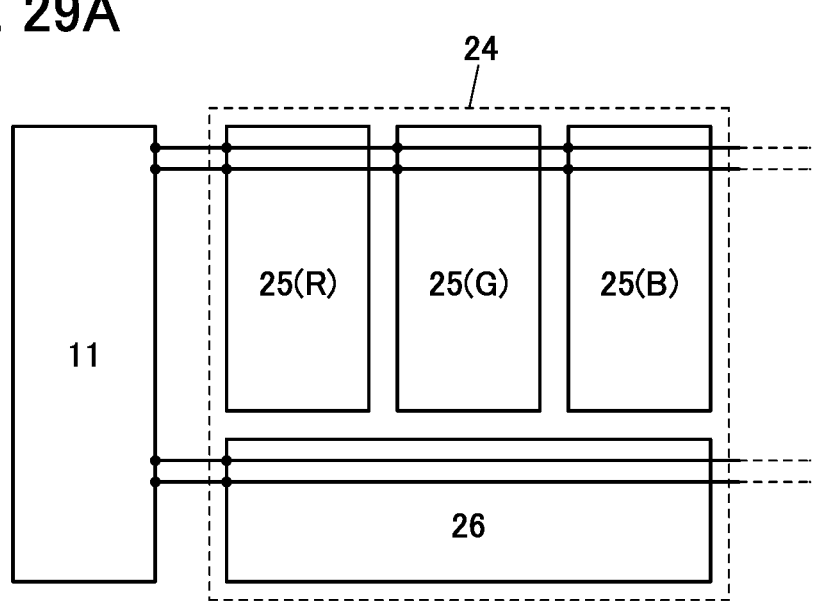
FIG. 29A and FIG. 29B are diagrams each illustrating a pixel mode.

In the structure illustrated in FIG. 29A, the light-emitting device EL included in the circuit 25 can be formed by using a light-emitting device for emitting red, green, or blue light. Alternatively, a light-emitting device for emitting white light may be used as the light-emitting device EL included in the circuit 25, and a red, green, or blue color filter may be provided over the light-emitting device.

Figure 29B:
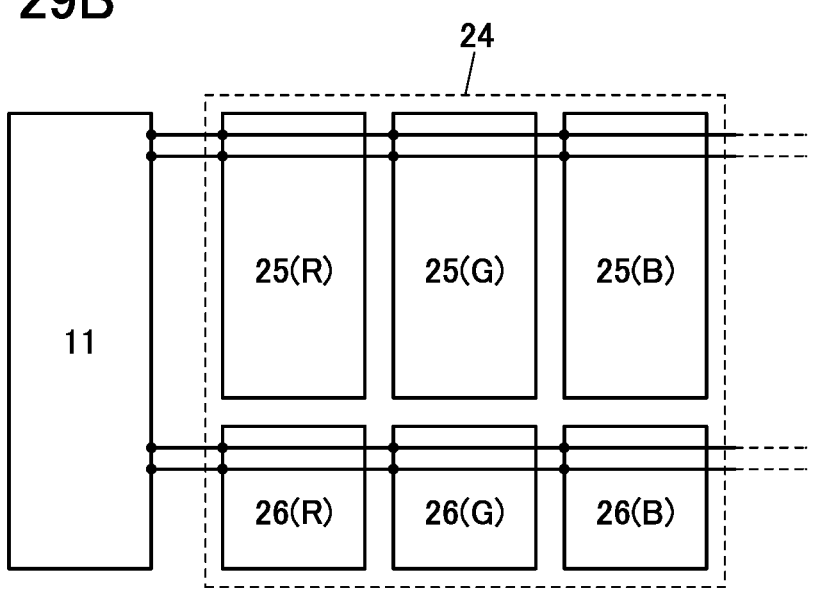

Moreover, in the case where color captured image data is acquired, as illustrated in FIG. 29B, the pixel 24 can use a structure including a circuit 26(R) for red light imaging, a circuit 26(G) for green light imaging, and a circuit 26(B) for blue light imaging. These circuits can be formed by using a light-emitting device including a photoelectric conversion layer that heavily absorbs light with one color of red, green, and blue compared to light with the other colors as the light-receiving device PD included in the circuit 26. Alternatively, a light-emitting device including a photoelectric conversion layer that has absorption in a wavelength band of red, green, and blue may be used as the light-receiving device PD included in the circuit 26, and a red, green, or blue color filter may be provided over the light-receiving device.

As illustrated in FIG. 28, the circuit 13 is electrically output to the wiring G1 and the wiring G2. The signal potential GLA1 output from the circuit 13 can be supplied to the wiring G1. The signal potential GLA2 output from the circuit 13 can be supplied to the wiring G2.

The circuit 14 is electrically output to the wiring G5 and the wiring G6. The signal potential GLB1 output from the circuit 14 can be supplied to the wiring G5. The signal potential GLB2 output from the circuit 14 can be supplied to the circuit 14.

Figures 30A, 30B:
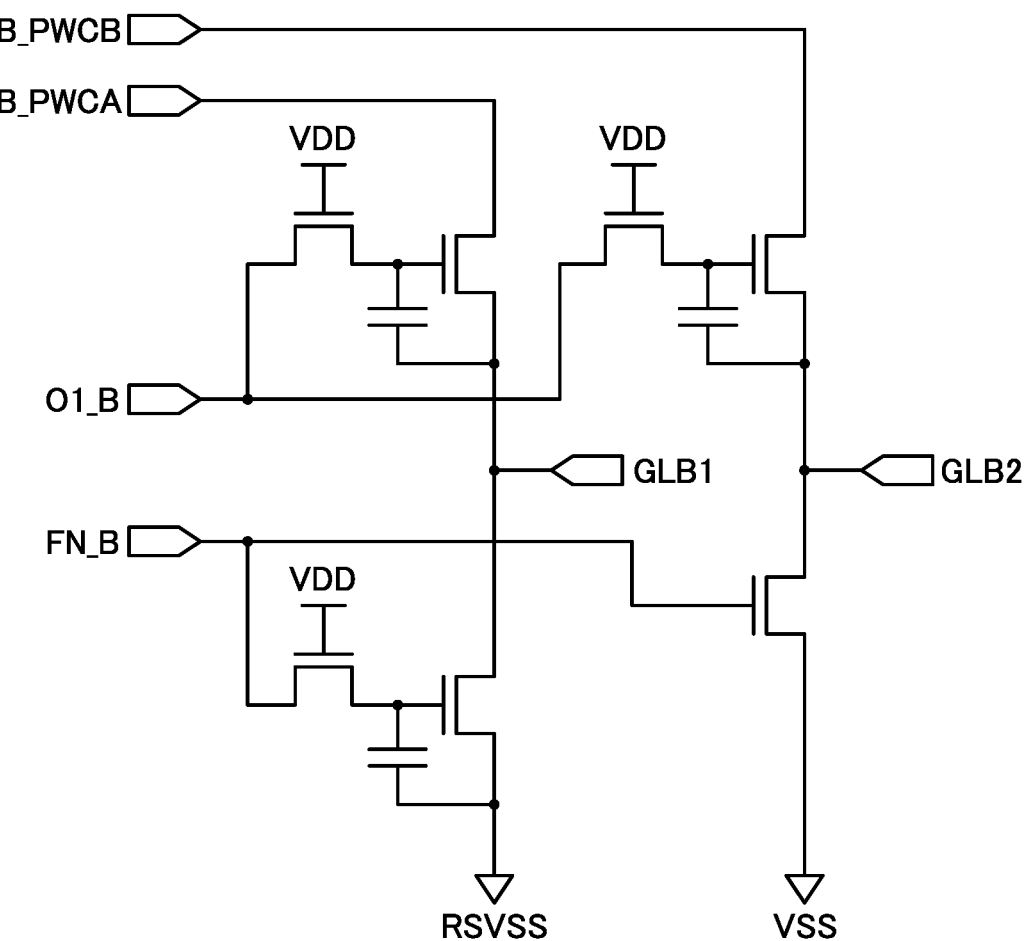
FIG. 30A and FIG. 30B are diagrams illustrating the circuit included in the output circuit.

Note that the wiring G5 is electrically connected to the gate of the transistor M10 included in the circuit 26. The transistor M10 is a transistor for a reset operation of resetting the gate potential of the transistor M11 to the potential of the wiring V4. When the OS transistors are used as the transistor M9, the transistor M10, and the like as described above, it is possible to employ the global shutter system in which all the pixels perform an operation of accumulating electric charge at the same time In the global shutter system, the reset operation is concurrently performed in all the pixels; thus, signal potentials for concurrently bringing the transistors M10 into conduction need to be supplied from the circuit 40 to all the circuits 26. In such a case, the circuit 14 preferably has a structure illustrated in FIG. 30A or FIG. 30B.

In the structure, when the signal potential FN_B is input and power supply voltage RSVSS for resetting is inverted from a low potential to a high potential, a high potential can be output as the signal potential GLB1. The operation is effective only when the power supply voltage RSVSS is inverted from a low potential to a high potential, and the signal potentials for concurrently bringing the transistors M10 into conduction can be supplied from the circuit 40 to all the circuits 26.

In addition, a selection circuit 50 is electrically connected to the wiring VRW. The selection circuit 50 can supply one of the reset potential VRES or the potential VW for voltage boosting to the wiring VRW.

Next, the operations of the circuit 40 and the pixel 24 illustrated in FIG. 26 and FIG. 28 are described using timing charts shown in FIG. 31 to FIG. 34. Note that the description of the operations is divided into writing of image data to all the circuits 25 (normal light emission, a mode A), writing of voltage boosting data to all the circuits 25 (light emission at high luminance, a mode B), reading of captured image data from all the circuits 26 (a mode C), and reading of captured image data from a specific circuit 26 (a mode D). In addition, the number of rows for the pixels 24 is set to 2340, and the circuit 40 can output signal potentials for driving the pixels 24 corresponding to the number of rows.

Figure 31:
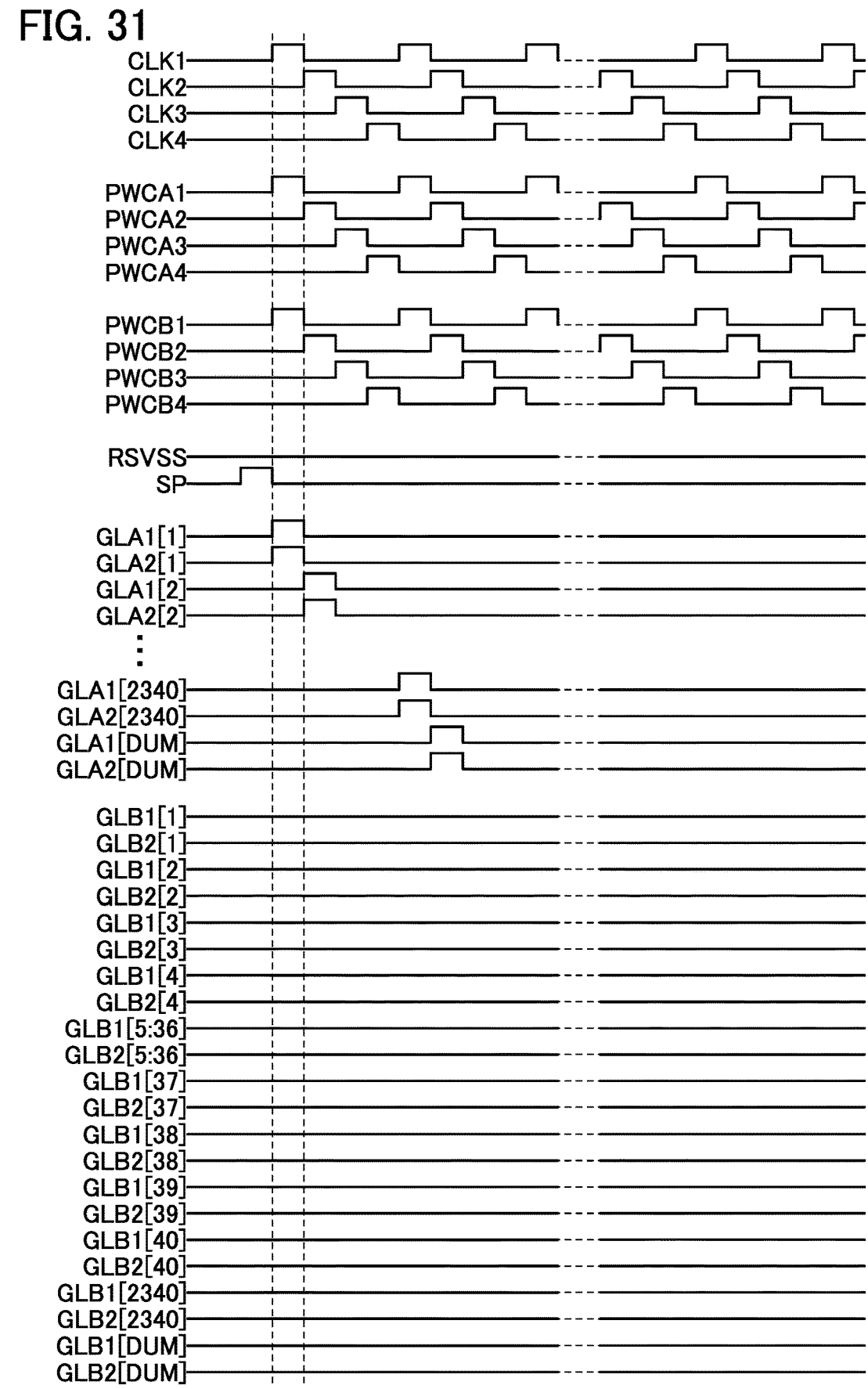
FIG. 31 is a timing chart showing the operation of the display device.

First, the image data writing (normal light emission, the mode A) is described using the timing chart shown in FIG. 31. Input signals shown in the timing chart are the clock signals CLK1 to CLK4, the pulse width control signals PWCA1 to PWCA4, the pulse width control signals PWCB1 to PWCB4, and the start pulse signal SP that are input to the circuit 40. Note that in the mode A and the mode B, the power supply voltage RSVSS for resetting is always a low potential.

Output signal shown in the timing chart are signal potentials GLA1 [1] to GLA1 [2340], signal potentials GLA2 [1] to GLA2 [2340], a signal potential GLA1 [DUM] in a dummy stage, and a signal potential GLA2[DUM] in the dummy stage that are output from the circuit 13 included in the circuit 40.

In addition, although the timing chart shows signal potentials GLB1[1] to GLB1[2340], signal potentials GLB2[1] to GLB2[2340], a signal potential GLB1[DUM] in the dummy stage, and a signal potential GLB2[DUM] in the dummy stage that are output from the circuit 14 included in the circuit 40, signal potentials for bringing the transistors included in the circuit 26 are not supplied from the circuit 14 at the operation timing of the mode A and the mode B.

In the operation in the mode A, the first mode that corresponds to the operation of the semiconductor apparatus 20 described in FIG. 1 is utilized. The start pulse signal is first input, and then the clock signals CLK1 to CLK4 are sequentially input. Furthermore, the pulse width control signals PWCA1 to PWCA4 and the pulse width control signals PWCB1 to PWCB4 are sequentially input at the same time as the clock signals CLK1 to CLK4.

The pulse of the signal potential GLA1 and the pulse of the signal potential GLA2 are sequentially output to the first stage to the dummy stage with the same pulse width at the same timing in accordance with the input signals. The signal potential GLA1 is supplied to the wiring G1, so that the transistor M4 and the transistor M6 included in the circuit 25 are brought into conduction. In addition, the signal potential GLA2 is supplied to the wiring G2, so that the transistor M5 included in the circuit 25 is brought into conduction. Furthermore, the selection circuit 50 supplies the reset potential VRES (for example, a low potential such as 0 V) to the wiring VRW (see FIG. 28).

At this time, the reset potential VRES is supplied to a source of the transistor M7 included in the circuit 25, and the gate (the node ND) of the transistor M7 has a data potential supplied from the wiring Si. That is, the data potential can be written to the node ND in a state where the source potential of the transistor M7 is stable. The light-emitting device EL emits light in accordance with the data potential.

The above is the description of the mode A.

Figure 32:
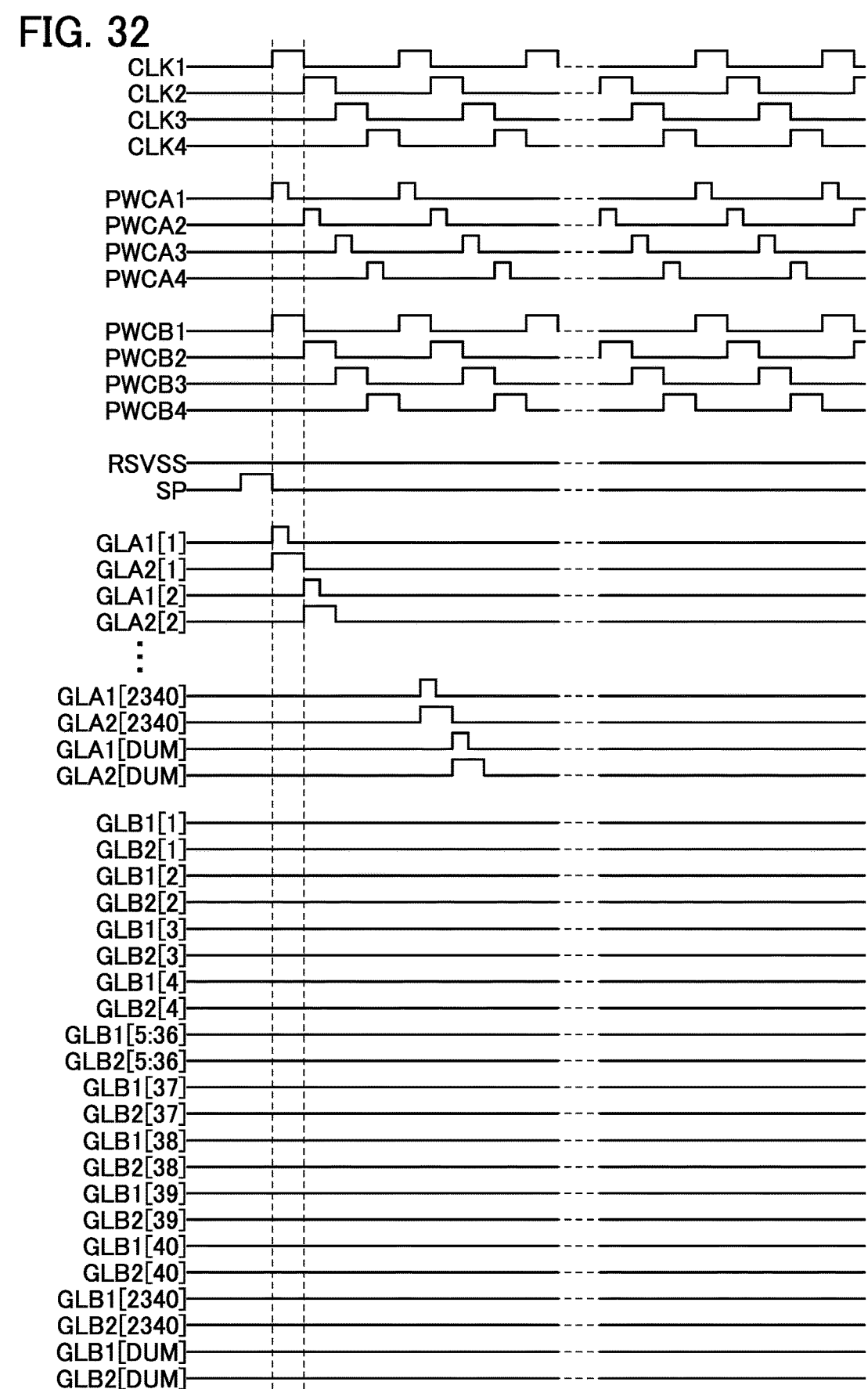
FIG. 32 is a timing chart showing the operation of the display device.

Next, the voltage boosting data writing (light emission at high luminance, the mode B) is described using the timing chart shown in FIG. 32.

In the operation in the mode B, the first mode that corresponds to the operation of the semiconductor apparatus 20 described in FIG. 1 is utilized. The start pulse signal is first input, and then the clock signals CLK1 to CLK4 are sequentially input. Furthermore, the pulse width control signals PWCA1 to PWCA4 and the pulse width control signals PWCB1 to PWCB4 are sequentially input at the same time as the clock signals CLK1 to CLK4. A difference from the image data writing (normal light emission) is that the pulse width of the pulse width control signals PWCA is smaller than the pulse width of the pulse width control signals PWCB.

The pulse of the signal potential GLA1 and the pulse of the signal potential GLA2 are started to be output at the same timing in accordance with the input signals, and the output of the pulse of the signal potential GLA1 is first terminated. With the use of the operation, the voltage boosting operation shown in FIG. 27C can be performed. Note that in the operation, the selection circuit 50 performs an operation of switching the potential to be supplied to the wiring VRW from the reset potential VRES to the potential VW (see FIG. 28).

The above is the description of the voltage boosting data writing (light emission at high luminance).

Figure 33:
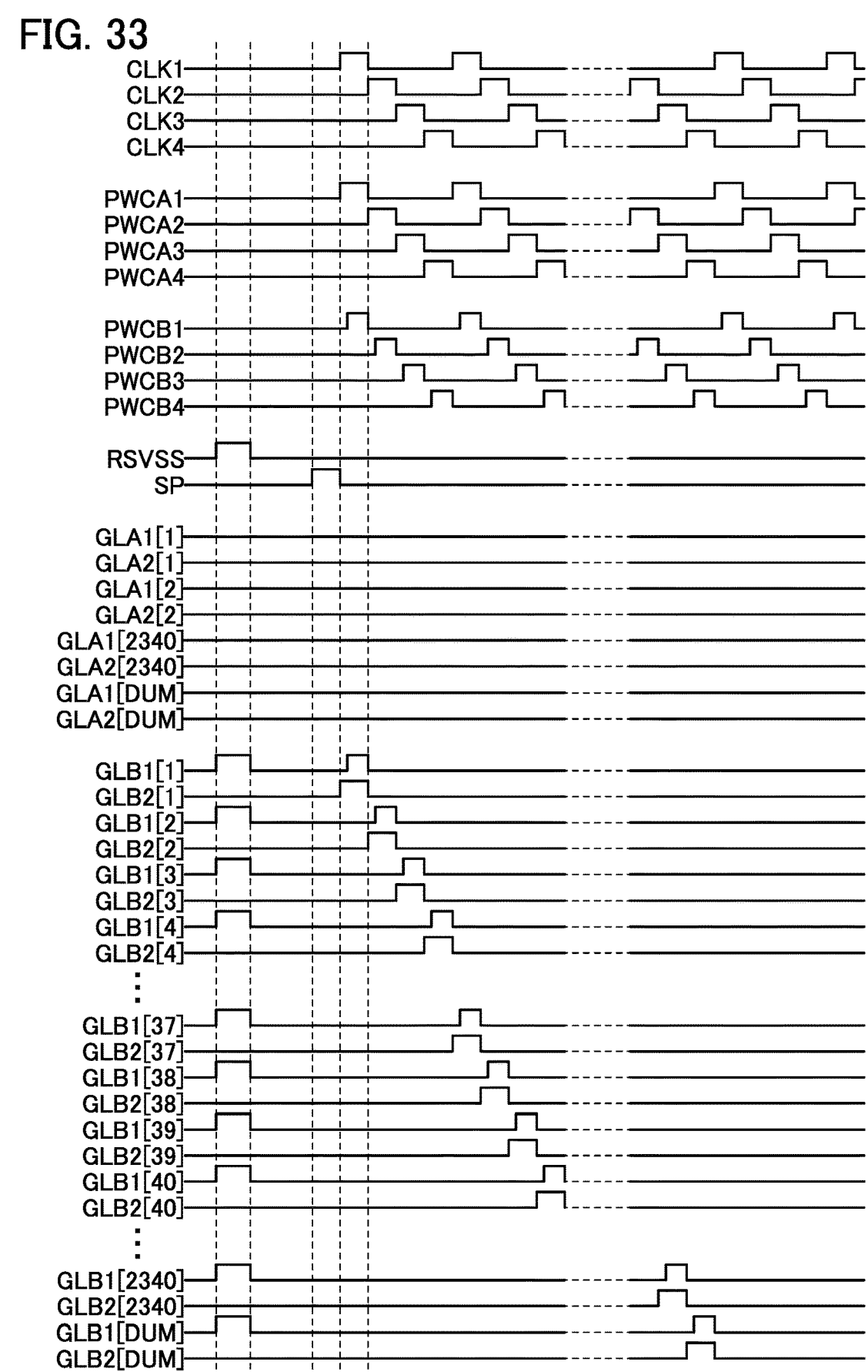
FIG. 33 is a timing chart showing the operation of the display device.

Next, reading of captured image data from all the circuits 26 (the mode C) is described using the timing chart shown in FIG. 33. In the mode C, captured image data is read from the circuits 26 in the pixels 24 in all the rows, so that high-resolution captured image data can be obtained.

In the operation in the mode C, the first mode that corresponds to the operation of the semiconductor apparatus 20 described in FIG. 1 is utilized. In the operation in the mode C, an imaging operation is performed by utilizing light emission in the operation in the mode A or the mode B. Thus, the operation in the mode C is performed after the operation in the mode A or the mode B.

In the operation in the mode C, an imaging operation by the circuit 26 is first performed. In the operation, by inverting the power supply voltage RSVSS for resetting that is shown in FIG. 30 into a high potential, the high potential is output from the circuit 14 as the signal potential GLB1. Through the operation, reset operations of the electric charge read portions in all the circuits 26 can be concurrently performed. Then, after a light exposure period, electric charge accumulated in the light-receiving device is transferred to the electric charge read portion, and the potential of the electric charge read portion is retained. The operation so far is the imaging operation.

Next, a read operation of the potential of the electric charge read portion that is retained by the imaging operation is performed. In the read operation, the start pulse signal is first input, and then the clock signals CLK1 to CLK4 are sequentially input. Furthermore, the pulse width control signals PWCA1 to PWCA4 are sequentially input at the same time as the clock signals CLK1 to CLK4. In addition, the pulse width control signals PWCB1 to PWCB4 that have waveforms each with smaller pulse width than that of the pulse width control signals PWCA are input with delay with respect to the pulses of the pulse width control signals PWCA1 to PWCA4.

The pulse of the signal potential GLB2 is first output in accordance with the input signal, the pulse of the signal potential GLB1 is output with delay, and the outputs of the pulse of the signal potential GLB2 and the pulse of the signal potential GLB1 are terminated at the same timing. With the use of the operation, it is possible to perform reading of the potential of the electric charge read portion at the time of data acquition and reading of the potential of the electric charge read portion at the time of resetting the electric charge read portion. A difference between these two pieces of data can be read by the CDS circuit included in the circuit 42 illustrated in FIG. 26 using the two pieces of data. The difference is a potential obtained by subtraction of a reset potential from a data potential (including the reset potential) and corresponds to data from which noise components have been removed.

Figure 34:
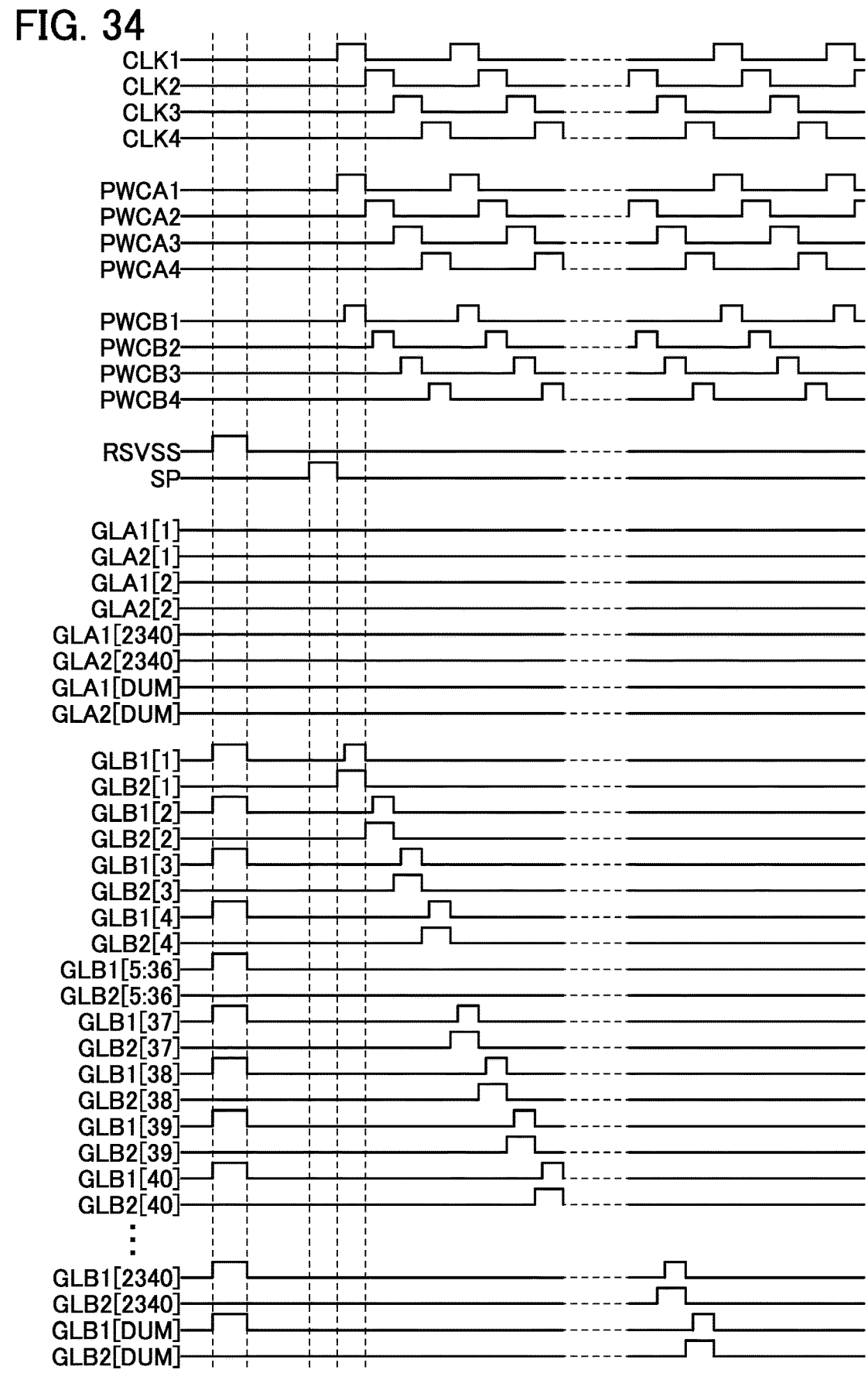
FIG. 34 is a timing chart showing the operation of the display device.

Next, the reading of captured image data from the specific circuit 26 (the mode D) is described using the timing chart shown in FIG. 34. In the mode D, captured image data is read from the circuits 26 in a specific row, so that captured image data can be acquired at high speed.

In the operation in the mode D, the second mode that corresponds to the operation of the semiconductor apparatus 20 described in FIG. 1 is utilized. In the operation in the mode D, an imaging operation by the circuit 26 is first performed as in the mode C.

Next, the read operation of the potential of the electric charge read portion is performed. The input signals are similar to those in the mode C. Although a signal potential GLB1[1:4] and a signal potential GLB2[1:4] are sequentially output, a signal potential GLB1[5:36] and a signal potential GLB2[5:36] are not output. In addition, a signal potential GLB1[37:40] and a signal potential GLB2[37:40] are sequentially output.

Therefore, reading is sequentially performed from the circuits 26 in a first row (the circuits 26 to which the signal potential GLB1[1] and the signal potential GLB2[1] are input) to the circuits 26 in a fourth row, reading is not performed in the circuits 26 from a fifth row to a thirty-sixth row, and reading is performed in the circuits 26 from a thirty-seventh row to a fortieth row.

Note that the operations in the mode A, the mode B, the mode C, and the mode D are sequentially switched and performed without any overlap. For example, an operation of switching from the mode A to the mode B, from the mode A to the mode D, from the mode B to the mode C, from the mode C to the mode A, or the like can be performed. Here, the number of operation steps in a display operation in the mode B is larger than that in the mode A because the display operation in the mode B has the voltage boosting operation. In addition, since the read operation from the pixels in all the rows is performed in the mode C, the number of operation steps in the read operation in the mode C is larger than that in the read operation from the pixels in the specific row in the mode D.

Therefore, operations may be performed in the mode A, the mode B, the mode C, and the mode D at suitable frame frequencies. For example, the operation may be performed in the mode A at 60 Hz, and the operation may be performed in the mode B by switching the frame frequency to 30 Hz. Alternatively, the operation may be performed in the mode B at 30 Hz, and the operation may be performed in the mode C by switching the frame frequency to 10 Hz. Alternatively, the operation may be performed in the mode A at 60 Hz, and the operation may be performed in the mode D without changing the frame frequency.

At least part of this embodiment can be implemented in combination with the other embodiment described in this specification as appropriate.

Embodiment 3

In this embodiment, a pixel structure of the display device described in Embodiment 2 will be described.

Figure 35:
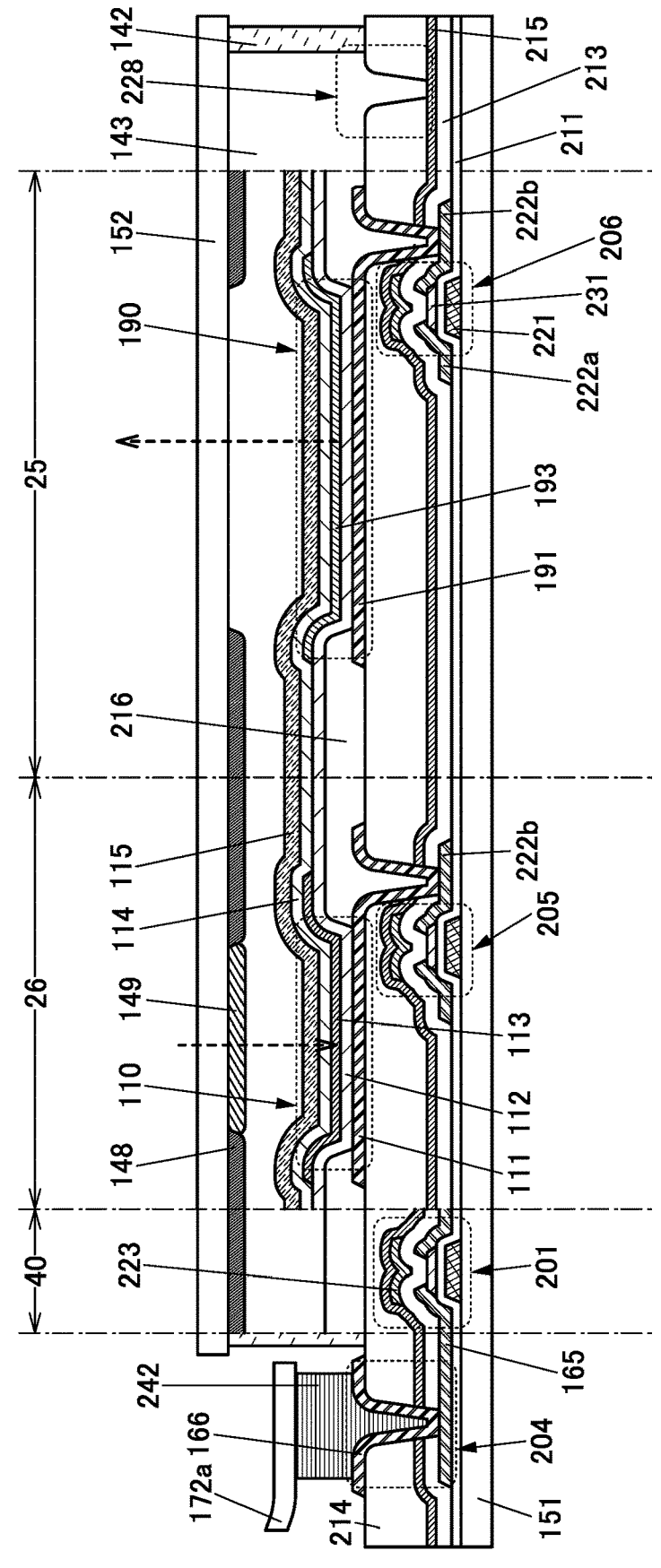
FIG. 35 is a cross-sectional view illustrating the display device.

FIG. 35 illustrates a cross-sectional example of a region that includes part of the circuit part of the circuit 25, and part of the circuit 26 in the pixel 24 of the display device illustrated in FIG. 26.

The display device illustrated in FIG. 35 includes a transistor 201, a transistor 205, a transistor 206, the light-emitting device 190, the light-receiving device 110, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting device 190 and the light-receiving device 110. A hollow sealing structure is employed in which a space 143 surrounded by the substrate 152, the adhesive layer 142, and the insulating layer 214 is filled with an inert gas (nitrogen, argon, or the like). The adhesive layer 142 may be provided to overlap the light-emitting device 190. In addition, a region surrounded by the substrate 152, the adhesive layer 142, and the insulating layer 214 may be filled with a resin different from that of the adhesive layer 142.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214. The transistor 206 has a function of controlling driving of the light-emitting device 190. End portions of the pixel electrodes 191 are covered with the partition 216.

The light-receiving device 110 has a stacked-layer structure in which the pixel electrode 111, the common layer 112, the photoelectric conversion layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. The end portion of the pixel electrode 111 is covered with the partition 216.

Light from the light-emitting device 190 is emitted toward the substrate 152 side. In addition, light enters the light-receiving device 110 through the substrate 152 and the space 143. For the substrate 152, a material having a high transmitting property with respect to visible light is preferably used.

The pixel electrode 111 and the pixel electrode 191 can be manufactured using the same material in the same step. The common layer 112, the common layer 114, and the common electrode 115 are used in both the light-receiving device 110 and the light-emitting device 190. The light-receiving device 110 and the light-emitting device 190 can have common structures except that the structures of the photoelectric conversion layer 113 and the light-emitting layer 193 are different. Thus, the light-receiving device 110 can be incorporated into the display device without a significant increase in the number of manufacturing steps.

A light-blocking layer 148 is provided on a surface of the substrate 152 on the substrate 151 side. The light-blocking layer 148 has openings in a position overlapped with the light-receiving device 110 and in a position overlapped with the light-emitting device 190. In addition, an optical filter 149 such as a color filter is provided in a position overlapped with the light-receiving device 110. Note that a structure without the optical filter 149 can be employed.

The transistor 201, the transistor 205, and the transistor 206 are all formed over the substrate 151. These transistors can be formed using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material into which impurities such as water and hydrogen are less likely to diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used. Note that a silicon oxynitride film refers to a film that includes oxygen at a higher proportion than nitrogen, and a silicon nitride oxide film refers to a film that includes nitrogen at a higher proportion than oxygen. Alternatively, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may be used. A stack including two or more of the above insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property against impurities than an inorganic insulating film. Therefore, the organic insulating film preferably has an opening in the vicinity of an end portion of the display device. This can inhibit diffusion of impurities from the end portion of the display device through the organic insulating film. Alternatively, in order to prevent the organic insulating film from being exposed at the end portion of the display device, the organic insulating film may be formed so that its end portion is positioned on the inner side compared to the end portion of the display device.

In a region 228 illustrated in FIG. 35, an opening is formed in the insulating layer 214. This can inhibit diffusion of impurities into the circuit 25 or the circuit 26 from the outside through the insulating layer 214 even when an organic insulating film is used as the insulating layer 214. Thus, the reliability of the display device can be increased.

The transistor 201, the transistor 205, and the transistor 206 each include a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structures of the transistors included in the display device of this embodiment. For example, a planar transistor, a staggered transistor, an inverted staggered transistor, or the like can be used. In addition, the transistor structure may be either a top-gate structure or a bottom-gate structure. Alternatively, gates may be provided above and below a semiconductor layer where a channel is formed.

A structure in which the semiconductor layer where a channel is formed is sandwiched between the two gates is used for the transistor 201, the transistor 205, and the transistor 206. The two gates may be connected to each other and supplied with the same signal to drive the transistor. Alternatively, one of the two gates may be supplied with a potential for controlling the threshold voltage of the transistor and the other may be supplied with a potential for driving.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used because degradation of the transistor characteristics can be inhibited.

A semiconductor layer of a transistor preferably contains a metal oxide (also referred to as an oxide semiconductor). Alternatively, the semiconductor layer of the transistor may contain silicon. Examples of silicon include amorphous silicon and crystalline silicon (low-temperature polysilicon, single crystal silicon, and the like).

The transistor included in the circuit 40, the transistor included in the circuit 25, and the transistor included in the circuit 26 may have either the same structure or different structures.

A connection portion 204 is provided in a region that is over the substrate 151 and is not overlapped with the substrate 152. In the connection portion 204, the wiring 165 is electrically connected to the FPC 172a through a conductive layer 166 and a connection layer 242. On a top surface of the connection portion 204, the conductive layer 166 obtained by processing the same conductive film as the pixel electrode 191 is exposed. Thus, the connection portion 204 and the FPC 172a can be electrically connected to each other through the connection layer 242.

A variety of optical members can be arranged on an outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting attachment of dust, a water repellent film suppressing attachment of stain, a hard coat film inhibiting generation of a scratch caused by the use, a shock absorbing layer, or the like may be provided on the outer side of the substrate 152.

Glass, quartz, ceramic, sapphire, a resin, or the like can be used for the substrate 151 and the substrate 152.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-liquid-mixture-type resin may be used. Alternatively, an adhesive sheet or the like may be used.

As the connection layer 242, an anisotropic conductive film (ACF), an anisotropic conductive paste (ACP), or the like can be used.

The light-emitting device 190 may be of a top emission type, a bottom emission type, a dual emission type, or the like. Although the light-emitting device 190 is preferably of a top emission type in one embodiment of the present invention, another structure can be employed when a light-emitting surface of the light-emitting device 190 and a light incident surface of the light-receiving device 110 face in the same direction.

The light-emitting device 190 includes at least the light-emitting layer 193. The light-emitting device 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114, and an inorganic compound may be contained. The layers included in the common layer 112, the light-emitting layer 193, and the common layer 114 can be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The photoelectric conversion layer 113 of the light-receiving device 110 contains a semiconductor. As the semiconductor, an inorganic semiconductor such as silicon or an organic semiconductor containing an organic compound can be used. This embodiment shows an example in which an organic semiconductor is used as the semiconductor included in the photoelectric conversion layer 113. The use of an organic semiconductor is preferable because the light-emitting layer 193 of the light-emitting device 190 and the photoelectric conversion layer 113 of the light-receiving device 110 can be formed by the same method (e.g., a vacuum evaporation method) and thus a manufacturing apparatus can be used in common.

Examples of an n-type semiconductor material contained in the photoelectric conversion layer 113 include electron-accepting organic semiconductor materials such as fullerene (e.g., $C_{60}$ and $C_{70}$) and derivatives thereof. In addition, examples of a p-type semiconductor material contained in the photoelectric conversion layer 113 include electron-donating organic semiconductor materials such as copper(II) phthalocyanine (CuPc), tetraphenyldibenzoperiflanthene (DBP), and zinc phthalocyanine (ZnPc).

For example, the photoelectric conversion layer 113 can be formed by co-evaporation of an n-type semiconductor and a p-type semiconductor.

As materials that can be used for conductive layers such as a variety of wirings and electrodes that constitute a display device, in addition to a gate, a source, and a drain of a transistor, metals such as aluminum, titanium, chromium, nickel, copper, yttrium, zirconium, molybdenum, silver, tantalum, or tungsten, an alloy containing the metal as its main component, and the like can be given. A film containing these materials can be used as a single-layer structure or a stacked-layer structure.

In addition, as a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the material is made thin enough to have a light-transmitting property. Furthermore, a stacked-layer film of the above materials can be used for a conductive layer. For example, a stacked-layer film of indium tin oxide and an alloy of silver and magnesium, or the like is preferably used for increased conductivity. They can also be used for conductive layers such as a variety of wirings and electrodes that constitute a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

The display device of this embodiment includes a light-receiving device and a light-emitting device in a display portion, and the display portion has both a function of displaying an image and a function of detecting light. Thus, the size and weight of an electronic device can be reduced as compared to the case where a sensor is provided outside a display portion or outside a display device. Moreover, an electronic device having more functions can be achieved by a combination of the display device of this embodiment and a sensor provided outside the display portion or outside the display device.

In the light-receiving device, at least one layer other than the photoelectric conversion layer can have a structure in common with the layer in the light-emitting device (the EL element). In addition, in the light-receiving device, all the layers other than the photoelectric conversion layer may have structures in common with the layers in the light-emitting device (EL element). With only addition of the step of depositing the photoelectric conversion layer to the manufacturing process of the light-emitting device, the light-emitting device and the light-receiving device can be formed over the same substrate, for example. Furthermore, in the light-receiving device and the light-emitting device, the pixel electrodes and the common electrode can be formed using the same material in the same step. Moreover, when a circuit electrically connected to the light-receiving device and a circuit electrically connected to the light-emitting device are formed using the same material in the same step, the manufacturing process of the display device can be simplified. In such a manner, a display device that incorporates a light-receiving device and is highly convenient can be manufactured without complicated steps.

At least part of this embodiment can be implemented in combination with the other embodiment described in this specification as appropriate.

Embodiment 4

In this embodiment, examples of an electronic device to which the display device according to one embodiment of the present invention can be applied will be described.

Figure 36A:
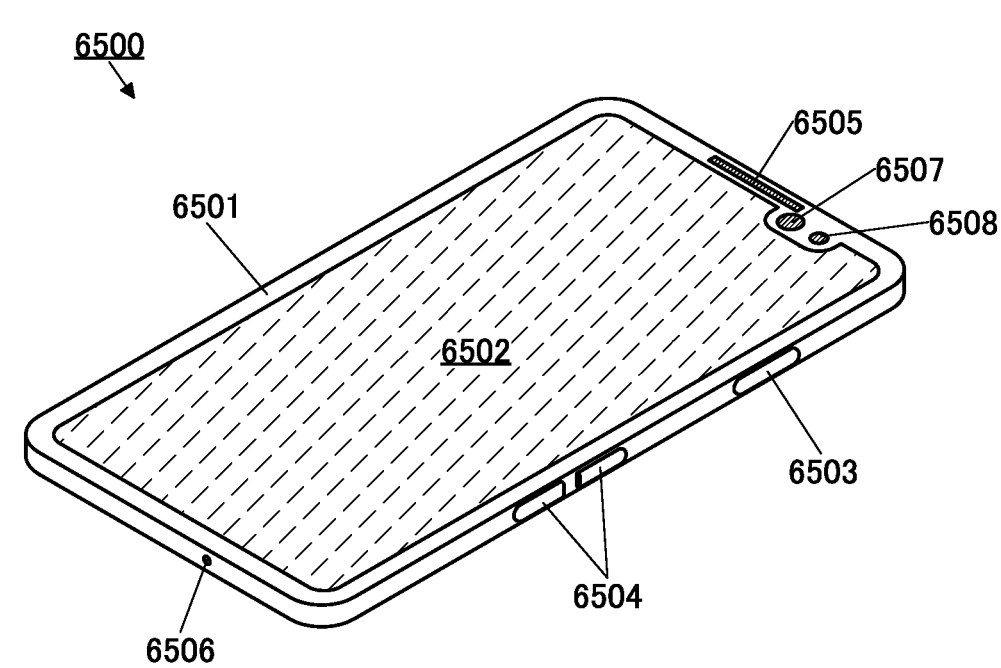
FIG. 36A and FIG. 36B are diagrams illustrating an electronic device.

An electronic device 6500 illustrated in FIG. 36A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device according to one embodiment of the present invention can be applied to the display portion 6502.

Figure 36B:
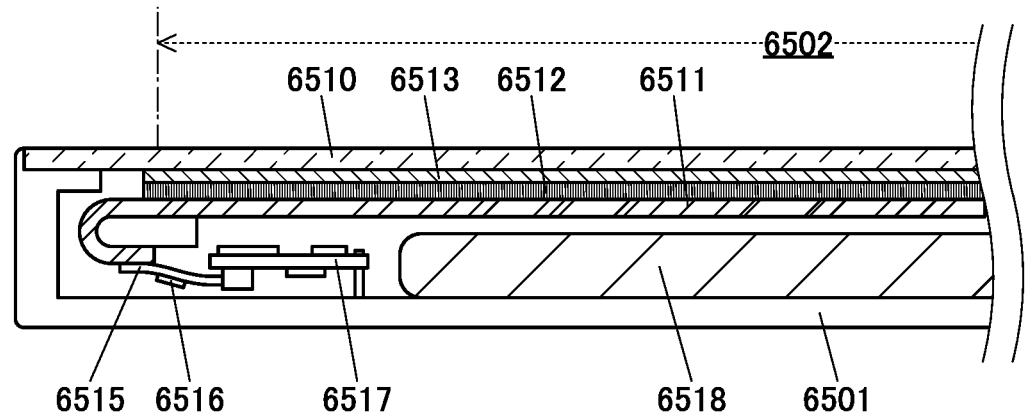

FIG. 36B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

In addition, part of the display panel 6511 is folded back in a region outside the display portion 6502. Furthermore, an FPC 6515 is connected to the part that is folded back. An IC 6516 is mounted on the FPC 6515. Moreover, the FPC 6515 is connected to a terminal provided for the printed circuit board 6517.

The display device according to one embodiment of the present invention can be applied to the display panel 6511. With the use of a display device with a narrow bezel that is one embodiment of the present invention, a small lightweight electronic device can be achieved.

At least part of this embodiment can be implemented in combination with the other embodiment described in this specification as appropriate.

Embodiment 5

In this embodiment, electronic devices each including a display device according to one embodiment of the present invention will be described.

Electronic devices illustrated below each include a display device according to one embodiment of the present invention in a display portion. Thus, the electronic devices achieve high resolution. In addition, the electronic devices can each achieve both high resolution and a large screen.

A display portion in an electronic device according to one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a laptop personal computer, a monitor device, digital signage, a pachinko machine, and a game machine.

An electronic device to which one embodiment of the present invention is applied can be incorporated along a flat surface or a curved surface of an inside wall or an outside wall of a house or a building, an interior or an exterior of a car, or the like.

Electronic devices illustrated in FIG. 37A to FIG. 37G include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in F FIG. 37A to FIG. 37G have a variety of functions. For example, the electronic devices can have a function of displaying a variety of data (a still image, a moving image, a text image, and the like) on the display portion, a touch panel function, a function of displaying a calendar, date, time, and the like, a function of controlling processing with a variety of software (programs), a wireless communication function, a function of reading and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 37A to FIG. 37G are described below.

Figures 37A, 37B, 37C, 37D, 37E, 37F, 37G:
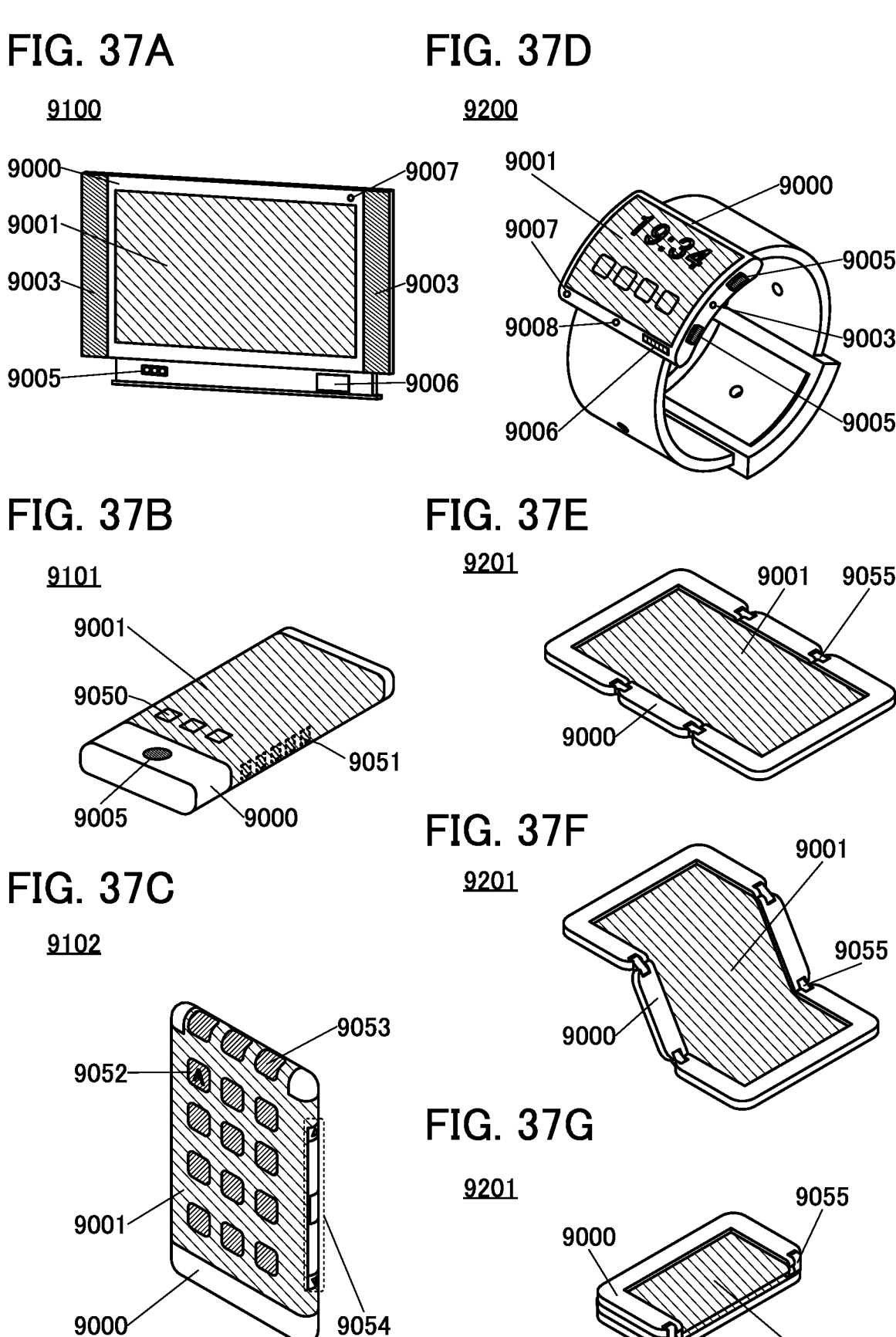
FIG. 37A to FIG. 37G are diagrams illustrating electronic devices.

FIG. 37A is a perspective view illustrating a television device 9100. In the television device 9100, the display portion 9001 having a large screen size of, for example, larger than or equal to 50 inches or larger than or equal to 100 inches can be incorporated.

FIG. 37B is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display characters and image information on its plurality of surfaces. FIG. 37B shows an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

FIG. 37C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can also check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 37D is a perspective view illustrating a watch-type portable information terminal 9200. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal and charging. Note that a charging operation may be performed by wireless power feeding.

FIG. 37E, FIG. 37F, and FIG. 37G are perspective views illustrating a foldable portable information terminal 9201. In addition, FIG. 37E is a perspective view of an unfolded state of the portable information terminal 9201, FIG. 37G is a perspective view of a folded state thereof, and FIG. 37F is a perspective view of a state in the middle of change from one of FIG. 37E and FIG. 37G to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature of greater than or equal to 1 mm and less than or equal to 150 mm.

FIG. 38A illustrates an example of a television device. In a television device 7100, a display portion 7500 is incorporated in a housing 7101. Here, a structure in which the housing 7101 is supported by a stand 7103 is illustrated.

The television device 7100 illustrated in FIG. 38A can be operated with an operation switch provided in the housing 7101 or a separate remote control 7111. Alternatively, a touch panel may be applied to the display portion 7500, and the television device 7100 may be operated by touch on the touch panel. The remote control 7111 may include a display portion in addition to operation buttons.

Note that the television device 7100 may include a television receiver or a communication device for network connection.

FIG. 38B illustrates a laptop personal computer 7200. The laptop personal computer 7200 includes a housing 7211, a keyboard 7212, a pointing device 7213, an external connection port 7214, and the like. The display portion 7500 is incorporated in the housing 7211.

FIG. 38C and FIG. 38D show examples of digital signage.

Digital signage 7300 illustrated in FIG. 38C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 38D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effect of advertising can be increased, for example.

A touch panel is preferably applied to the display portion 7500 so that the user can operate the digital signage. Thus, the digital signage can be used not only for advertising but also for providing information that the user needs, such as route information, traffic information, and guidance information on a commercial facility.

In addition, as illustrated in FIG. 38C and FIG. 38D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operating the information terminal 7311.

Furthermore, it is possible to make the digital signage 7300 or the digital signage 7400 execute a game with the use of the information terminal 7311 as an operation means (controller). Thus, an unspecified number of users can join in and enjoy the game concurrently.

The display device according to one embodiment of the present invention can be applied to each of the display portions 7500 in FIG. 38A to FIG. 38D.

At least part of this embodiment can be implemented in combination with the other embodiment described in this specification as appropriate.

REFERENCE NUMERALS

C1: capacitor, C2: capacitor, C3: capacitor, C4: capacitor, EL: light-emitting device, G1: wiring, G2: wiring, G4: wiring, G5: wiring, G6: wiring, M1: transistor, M2: transistor, M3: transistor, M4: transistor, M5: transistor, M6: transistor, M7: transistor, M9: transistor, M10: transistor, M11: transistor, M12: transistor, PD: light-receiving device, PIX1: pixel circuit, PIX2: pixel circuit, PIX3: pixel circuit, S1: wiring, V0: wiring, V1: wiring, V2: wiring, V3: wiring, V4: wiring, VRW: wiring, 10: flip-flop circuit, 11: output circuit, 12: switch circuit, 13: circuit, 14: circuit, 15: switch circuit, 16: switch circuit, 17: switch circuit, 18: switch circuit, 19: switch circuit, 20: semiconductor apparatus, 20a: semiconductor apparatus, 20b: semiconductor apparatus, 20c: semiconductor apparatus, 20d: semiconductor apparatus, 21: row driver, 22: row driver, 23: pixel array, 24: pixel, 25: circuit, 26: circuit, 31: block, 32: block, 33: block, 40: circuit, 41: circuit, 42: circuit, 50: selection circuit, 110: light-receiving device, 111: pixel electrode, 112: common layer, 113: photoelectric conversion layer, 114: common layer, 115: common electrode, 142: adhesive layer, 143: space, 148: light-blocking layer, 149: optical filter, 151: substrate, 152: substrate, 165: wiring, 166: conductive layer, 172a: FPC, 190: light-emitting device, 191: pixel electrode, 193: light-emitting layer, 201: transistor, 204: connection portion, 205: transistor, 206: transistor, 211: insulating layer, 213: insulating layer, 214: insulating layer, 215: insulating layer, 216: partition, 221: conductive layer, 222a: conductive layer, 222b: conductive layer, 223: conductive layer, 228: region, 231: semiconductor layer, 242: connection layer, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote control, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, and 9201: portable information terminal.

The invention claimed is:

1. A semiconductor apparatus comprising:
a first block;
a second block;
a third block; and
a first switch circuit,
wherein the first block, the second block, and the third block each include a plurality of flip-flop circuits and a plurality of output circuits,
wherein a first pair of output circuits of the plurality of output circuits is electrically connected to a first flip-flop circuit of the plurality of flip-flop circuits,
wherein a second pair of output circuits of the plurality of output circuits is electrically connected to a second flip-flop circuit of the plurality of flip-flop circuits,
wherein in each of the first block, the second block, and the third block, the plurality of flip-flop circuits are provided so as to form a cascade,
wherein a flip-flop circuit of the plurality of flip-flop circuits in the last stage of the first block, a flip-flop circuit of the plurality of flip-flop circuits in a first stage of the second block, a flip-flop circuit of the plurality of flip-flop circuits in the last stage of the second block, and a flip-flop circuit of the plurality of flip-flop circuits in a first stage of the third block are electrically connected to the first switch circuit,
wherein one output circuit of the first pair of output circuits includes a second switch circuit, a first circuit, and a second circuit, wherein the first flip-flop circuit is electrically connected to a first switch of the second switch circuit and a second switch of the second switch circuit, wherein the first switch is electrically connected to the first circuit and the second switch is electrically connected to the second circuit, wherein a pulse width control signal is input to a third switch of the second switch circuit and a fourth switch of the second switch circuit, and wherein the third switch is electrically connected to the first circuit and the fourth switch is electrically connected to the second circuit.

2. The semiconductor apparatus according to claim 1, wherein the first switch circuit is configured to select one of an operation of outputting a signal potential from the first block, the second block, and the third block and an operation of outputting a signal potential from the first block and the third block but not from the second block.

3. The semiconductor apparatus according to claim 1, wherein the second switch circuit is configured to select one of conduction between the first flip-flop circuit and the first circuit and conduction between the first flip-flop circuit and the second circuit.

4. The semiconductor apparatus according to claim 1, wherein the first flip-flop circuit outputs a first signal potential to the second switch circuit, wherein the second switch circuit outputs a second signal potential based on the first signal potential to the first circuit, wherein the second switch circuit outputs a third signal potential based on the first signal potential to the second circuit, wherein the first circuit outputs a fourth signal potential based on the second signal potential, and wherein the second circuit outputs a fifth signal potential based on the third signal potential.

5. The semiconductor apparatus according to claim 4, wherein a sixth signal potential or a seventh signal potential is input to the first switch circuit and the second switch circuit, wherein when the sixth signal potential is input to the first switch circuit and the second switch circuit, the first circuit outputs an eighth signal potential, and wherein when the seventh signal potential is input to the first switch circuit and the second switch circuit, the second circuit outputs a ninth signal potential.

6. The semiconductor apparatus according to claim 1, wherein when the last stage in the first block is a fourth stage, the last stage in the second block is a 4n-th stage (n is an integer greater than or equal to 2) and the last stage in the third block is a 4n+4-th stage.

7. The semiconductor apparatus according to claim 1, wherein the first flip-flop circuit is directly connected to the first switch of the second switch circuit and the second switch of the second switch circuit, wherein the first switch is directly connected to the first circuit and the second switch is directly connected to the second circuit, and wherein the third switch is directly connected to the first circuit and the fourth switch is directly connected to the second circuit.

8. A display device comprising:
a first block;
a second block;
a third block;
a first switch circuit; and
a pixel, wherein the first block, the second block, and the third block each include a plurality of flip-flop circuits and a plurality of output circuits, wherein a first pair of output circuits of the plurality of output circuits is electrically connected to a first flip-flop circuit of the plurality of flip-flop circuits, wherein a second pair of output circuits of the plurality of output circuits is electrically connected to a second flip-flop circuit of the plurality of flip-flop circuits, wherein in each of the first block, the second block, and the third block, the plurality of flip-flop circuits are provided so as to form a cascade, wherein a flip-flop circuit of the plurality of flip-flop circuits in the last stage of the first block, a flip-flop circuit of the plurality of flip-flop circuits in a first stage of the second block, a flip-flop circuit of the plurality of flip-flop circuits in the last stage of the second block, and a flip-flop circuit of the plurality of flip-flop circuits in a first stage of the third block are electrically connected to the first switch circuit, wherein one output circuit of the first pair of output circuits includes a second switch circuit, a first circuit, and a second circuit, wherein the first flip-flop circuit is electrically connected to a first switch of the second switch circuit and a second switch of the second switch circuit, wherein the first switch is electrically connected to the first circuit and the second switch is electrically connected to the second circuit, wherein a pulse width control signal is input to a third switch of the second switch circuit and a fourth switch of the second switch circuit, wherein the third switch is electrically connected to the first circuit and the fourth switch is electrically connected to the second circuit, wherein the pixel includes a third circuit including a display element and a fourth circuit including a light-receiving element, and wherein the first circuit is electrically connected to the third circuit and the second circuit is electrically connected to the fourth circuit.

9. The display device according to claim 8, wherein the display element is a light-emitting element, and wherein the light-receiving element shares an electrode with the light-emitting element.

10. The display device according to claim 8, wherein the third circuit and the fourth circuit each include a transistor containing a metal oxide in a channel formation region, wherein the metal oxide includes In, Zn, and M, and wherein M is Al, Ti, Ga, Sn, Y, Zr, La, Ce, Nd, or Hf.

11. An electronic device comprising the display device according to claim 8.

12. A semiconductor apparatus comprising:
a first block;
a second block;
a third block; and
a first switch circuit, wherein the first block, the second block, and the third block each include a plurality of flip-flop circuits and a plurality of output circuits, wherein a first pair of output circuits of the plurality of output circuits is electrically connected to a first flip-flop circuit of the plurality of flip-flop circuits, wherein a second pair of output circuits of the plurality of output circuits is electrically connected to a second flip-flop circuit of the plurality of flip-flop circuits, wherein in each of the first block, the second block, and the third block, the plurality of flip-flop circuits are provided so as to form a cascade, wherein a flip-flop circuit of the plurality of flip-flop circuits in the last stage of the first block, a flip-flop circuit of the plurality of flip-flop circuits in a first stage of the second block, a flip-flop circuit of the plurality of flip-flop circuits in the last stage of the second block, and a flip-flop circuit of the plurality of flip-flop circuits in a first stage of the third block are electrically connected to the first switch circuit, wherein one output circuit of the first pair of output circuits includes a second switch circuit, a first circuit, and a second circuit, wherein the first flip-flop circuit is electrically connected to a first switch of the second switch circuit and a second switch of the second switch circuit, wherein the first switch is electrically connected to the first circuit and the second switch is electrically connected to the second circuit, wherein a pulse width control signal is input to a third switch of the second switch circuit and a fourth switch of the second switch circuit, wherein the third switch is electrically connected to the first circuit and the fourth switch is electrically connected to the second circuit, wherein the third switch is a first transistor and the fourth switch is a second transistor, wherein a gate of the first transistor is electrically connected to a first electrode of a first capacitor, wherein one of a source and a drain of the first transistor is electrically connected to a second electrode of the first capacitor and one of a source and a drain of a third transistor of the first circuit, wherein a gate of the second transistor is electrically connected to a first electrode of a second capacitor, and wherein one of a source and a drain of the second transistor is electrically connected to a second electrode of the second capacitor and one of a source and a drain of a fourth transistor of the second circuit.

13. The semiconductor apparatus according to claim 12, wherein a gate of the third transistor is electrically connected to one of a source and a drain of a fifth transistor of the first circuit, wherein the other of the source and the drain of the fifth transistor is electrically connected to the first switch, wherein a gate of the fourth transistor is electrically connected to one of a source and a drain of a sixth transistor of the second circuit, and wherein the other of the source and the drain of the sixth transistor is electrically connected to the second switch.

* * * * *